(12) United States Patent
Kim

(10) Patent No.: US 12,641,978 B2
(45) Date of Patent: May 26, 2026

(54) DISPLAY PANEL AND METAL MASK FOR THE SAME

(71) Applicant: Samsung Display Co., Ltd., Yongin-si (KR)

(72) Inventor: Sanghoon Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 599 days.

(21) Appl. No.: 17/979,654

(22) Filed: Nov. 2, 2022

(65) Prior Publication Data

US 2023/0276673 A1 Aug. 31, 2023

(30) Foreign Application Priority Data

Feb. 28, 2022 (KR) ........................ 10-2022-0026397

(51) Int. Cl.
| | |
|---|---|
| *H01L 27/32* | (2006.01) |
| *C23C 14/04* | (2006.01) |
| *H01L 51/56* | (2006.01) |
| *H10K 59/121* | (2023.01) |
| *H10K 59/35* | (2023.01) |
(Continued)

(52) U.S. Cl.
CPC ......... *H10K 59/353* (2023.02); *C23C 14/042* (2013.01); *H10K 59/121* (2023.02); *H10K 71/00* (2023.02); *H10K 71/166* (2023.02)

(58) Field of Classification Search
CPC ............................................. H10K 59/35–353
See application file for complete search history.

(56) References Cited

U.S. PATENT DOCUMENTS

| | | | |
|---|---|---|---|
| 9,743,487 B2 | 8/2017 | Kato et al. | |
| 2004/0135498 A1* | 7/2004 | Takanosu | ............... H10K 59/35 |
| | | | 313/506 |

(Continued)

FOREIGN PATENT DOCUMENTS

| | | | | |
|---|---|---|---|---|
| CN | 110491927 A | * | 11/2019 | ........... H10K 59/353 |
| KR | 10-2018-0069367 A | | 6/2018 | |
(Continued)

OTHER PUBLICATIONS

Machine translation, Zhang, Chinese Pat. Pub. No. CN110491927A, translation date: Mar. 22, 2025, Espacenet, all pages. (Year: 2025).*

(Continued)

*Primary Examiner* — Victoria K. Hall
(74) *Attorney, Agent, or Firm* — Womble Bond Dickinson (US) LLP

(57) ABSTRACT

A display panel includes: a pixel circuit including at least one thin film transistor; and a unit pixel group connected to the pixel circuit, the unit pixel group including: four first color light emitting patterns; two second color light emitting patterns having different shapes from each other; and two third color light emitting patterns having different shapes from each other. The first, second, and third color light emitting patterns are to display different colors from one another, and the first color light emitting patterns include: two first color first light emitting patterns having the same shape as each other; and two first color second light emitting patterns having the same shape as each other, and different from the shape of the first color first light emitting patterns.

20 Claims, 26 Drawing Sheets

(51) Int. Cl.
    *H10K 71/00*       (2023.01)
    *H10K 71/16*       (2023.01)

(56)          References Cited

U.S. PATENT DOCUMENTS

| | | |
|---|---|---|
| 2021/0175295 A1 | 6/2021 | Lee et al. |
| 2021/0271010 A1* | 9/2021 | Ji ........................... G02F 1/1362 |
| 2021/0343801 A1* | 11/2021 | Wang .................... H10K 59/353 |
| 2022/0310706 A1* | 9/2022 | Yi ......................... H10K 59/352 |
| 2023/0101058 A1* | 3/2023 | Zhang .................... H10K 59/12 |
| | | 257/40 |
| 2024/0049548 A1* | 2/2024 | Zhang .................... H10K 59/88 |

FOREIGN PATENT DOCUMENTS

| | | |
|---|---|---|
| KR | 10-2006875 B1 | 8/2019 |
| KR | 10-2021-0074177 A | 6/2021 |

OTHER PUBLICATIONS

Korean Intellectual Property Office, Request for the Submission of an Opinion, Korean Application No. 10-2022-0026397, Jul. 25, 2025, all pages. (Year: 2025).*

\* cited by examiner

DISPLAY PANEL AND METAL MASK FOR THE SAME

CROSS-REFERENCE TO RELATED APPLICATION

This application claims priority to and the benefit of Korean Patent Application No. 10-2022-0026397, filed on Feb. 28, 2022, the entire content of which is incorporated by reference herein.

BACKGROUND

1. Field

Aspects of embodiments of the present disclosure relate to a display panel, and a metal mask for the same. More particularly, aspects of embodiments of the present disclosure relate to a display panel including an organic pattern, and a metal mask used to manufacture the same.

2. Description of the Related Art

In general, a light emitting display device includes pixels, and light emitting elements disposed in the pixels, respectively. Each light emitting element includes a light emitting layer disposed between two electrodes. The light emitting layers disposed in the pixels are classified into a plurality of groups.

A mask assembly is used to deposit the plurality of groups of light emitting layers on a work substrate. The mask assembly includes a frame, a support stick, and a mask. The light emitting layers are formed by depositing a light emitting material on the work substrate after the work substrate is disposed on the mask.

The above information disclosed in this Background section is for enhancement of understanding of the background of the present disclosure, and therefore, it may contain information that does not constitute prior art.

SUMMARY

One or more embodiments of the present disclosure are directed to a metal mask having reduced deformation that may be caused by stress.

One or more embodiments of present disclosure are directed to a display panel manufactured using the metal mask.

According to one or more embodiments of the present disclosure, a display panel includes: a pixel circuit including at least one thin film transistor; and a unit pixel group connected to the pixel circuit, the unit pixel group including: four first color light emitting patterns; two second color light emitting patterns having different shapes from each other; and two third color light emitting patterns having different shapes from each other. The first, second, and third color light emitting patterns are configured to display different colors from one another, and the first color light emitting patterns include: two first color first light emitting patterns having the same shape as each other; and two first color second light emitting patterns having the same shape as each other, and different from the shape of the first color first light emitting patterns.

In an embodiment, each of the first, second, and third color light emitting patterns may have a triangular shape.

In an embodiment, the first color second light emitting patterns may have the same shape as a shape obtained by rotating the first color first light emitting patterns by about 90 degrees, and shifting the rotated first color first light emitting patterns.

In an embodiment, the second color light emitting patterns may include: a second color first light emitting pattern located between the first color first light emitting patterns; and a second color second light emitting pattern located between the first color second light emitting patterns.

In an embodiment, directions in which sides of the second color first light emitting pattern facing the first color first light emitting patterns extend may form an acute angle, and directions in which sides of the second color second light emitting pattern facing the first color second light emitting patterns extend may form an acute angle.

In an embodiment, the second color second light emitting pattern may have the same shape as a shape obtained by rotating the second color first light emitting pattern by about 90 degrees, and shifting the rotated second color first light emitting pattern.

In an embodiment, the third color light emitting patterns may include: a third color first light emitting pattern including a side facing one of the first color first light emitting patterns, or one of the first color second light emitting patterns; and a third color second light emitting pattern located between another of the first color first light emitting patterns and another of the first color second light emitting patterns. Directions in which sides of the third color second light emitting pattern facing the first color first light emitting pattern and the first color second light emitting pattern extend may form an acute angle.

In an embodiment, the third color second light emitting pattern may have the same shape as a shape obtained by rotating the third color first light emitting pattern by about 90 degrees, and shifting the rotated third color first light emitting pattern.

In an embodiment, the first color light emitting patterns may be arranged along a first direction, and the first color first light emitting patterns and the first color second light emitting patterns may be spaced from each other in a second direction crossing the first direction.

In an embodiment, the second color first light emitting pattern and the third color first light emitting pattern may be arranged along the first direction, and may have the same shape as each other.

In an embodiment, the second color light emitting patterns and the third color light emitting patterns may be linearly symmetrical with the first color light emitting patterns with respect to a symmetrical axis parallel to a diagonal direction crossing the first and second directions.

In an embodiment, a minimum distance between the first color light emitting patterns may be greater than or equal to about 15 micrometers.

According to one or more embodiments of the present disclosure, a metal mask includes: a first opening: and a second opening spaced from the first opening in a first direction, and having a shape different from a shape of the first opening. Each of the first opening and the second opening has a left-right asymmetric shape, and the second opening has the same shape as a shape obtained by rotating the first opening by about 90 degrees, and shifting the rotated first opening.

In an embodiment, the first opening may include a plurality of first openings, the second opening may include a plurality of second openings, and the first openings and the second openings may be arranged along a first direction, and a second direction crossing the first direction. The first openings may be alternately arranged with the second openings along the second direction.

In an embodiment, the first direction and the second direction may form an acute angle.

In an embodiment, a distance in the second direction between the first openings may be greater than a distance between the first opening and the second opening adjacent to the first opening in the first direction.

In an embodiment, the rotation of the first opening may be in a clockwise direction or a counterclockwise direction.

In an embodiment, each of the first opening and the second opening may have a right triangular shape including vertices having a rounded shape.

In an embodiment, each of the vertices may have a radius of curvature greater than or equal to about 8 micrometers.

In an embodiment, a minimum distance between the first opening and the second opening may be greater than or equal to about 15 micrometers.

According to one or more embodiments of the present disclosure, reliability of the metal mask may be improved.

According to one or more embodiments of the present disclosure, process reliability of the display panel may be enhanced.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1A:
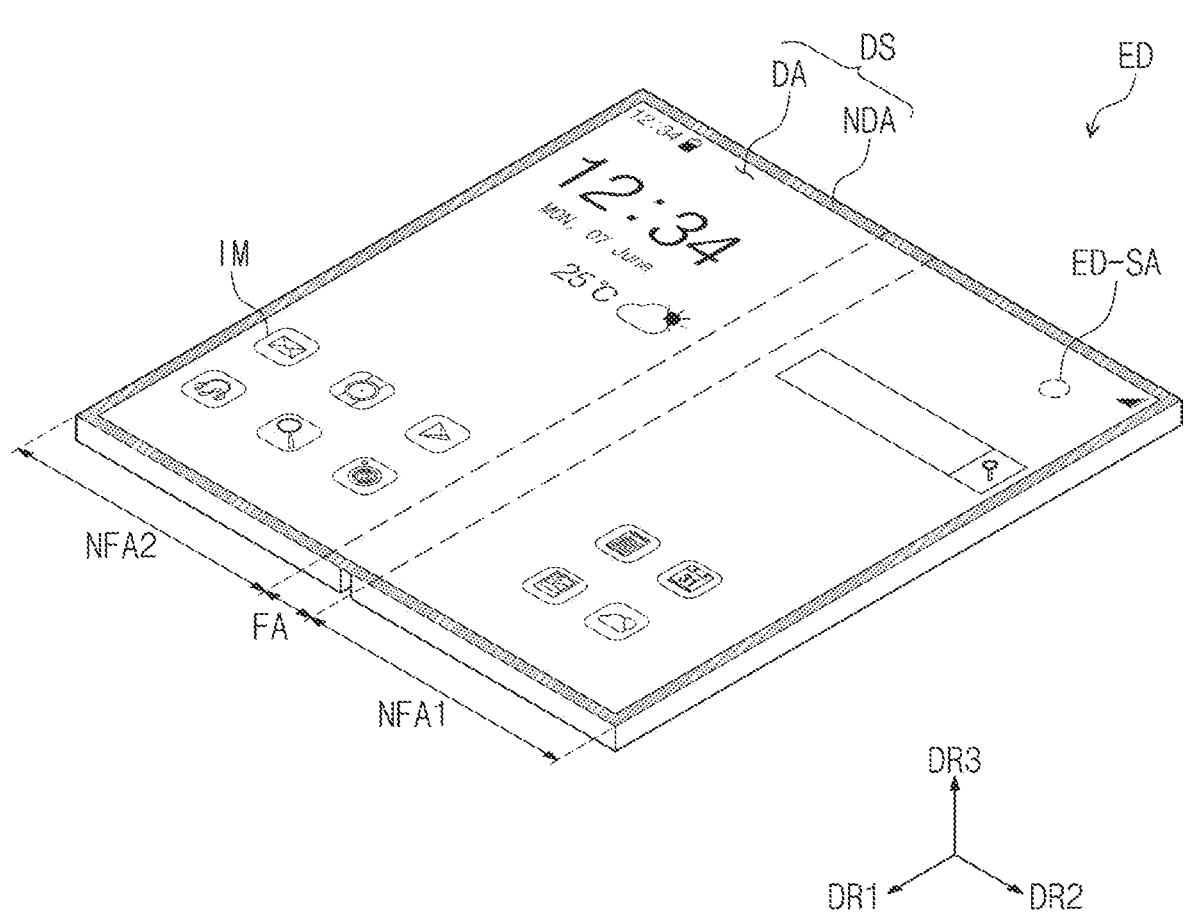
FIGS. 1A-1B are perspective views of an electronic device according to one or more embodiments of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, a first direction DR1, a second direction DR2, and a third direction DR3 indicated by the x-axis, the y-axis, and the z-axis are not limited to three axes of the rectangular coordinate system, and may be interpreted in a broader sense. For example, the first direction DR1, the second direction DR2, and the third direction DR3 may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
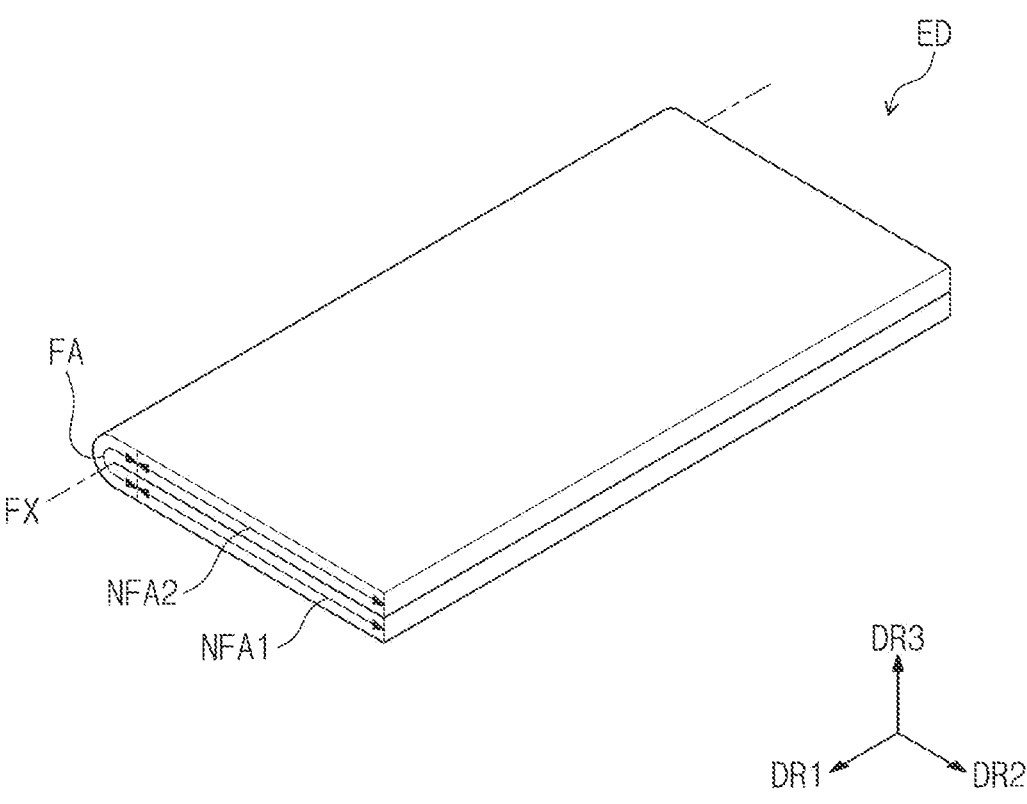

FIGS. 1A and 1B are perspective views of an electronic device ED according to one or more embodiments of the present disclosure. FIG. 1A shows the electronic device ED in an unfolded state, and FIG. 1B shows the electronic device ED in a folded state.

A display surface DS of the electronic device ED may include a display area DA, and a non-display area NDA around (e.g., adjacent to) the display area DA. An image IM may be displayed through the display area DA, and no images may be displayed through the non-display area NDA. The non-display area NDA may surround (e.g., around a periphery of) the display area DA, but the present disclosure is not limited thereto, and the shape of the display area DA and the shape of the non-display area NDA may be various modified as needed or desired.

Hereinafter, a direction that is perpendicular to or substantially perpendicular to a plane defined by a first directional axis DR1 and a second directional axis DR2 may be referred to as a third directional axis DR3. As used in the present disclosure, the expressions "viewed in a plane" and "in a plan view" may refer to a state of being viewed in (or from) the third directional axis DR3.

A sensing area ED-SA may be defined at (e.g., in or on) the display area DA of the electronic device ED. FIG. 1A shows one sensing area ED-SA as a representative example, but the number of the sensing areas ED-SA is not particularly limited thereto. The sensing area ED-SA may be a portion of the display area DA. Accordingly, the electronic device ED may display the image IM through the sensing area ED-SA.

The electronic device ED may include an electronic module (e.g., a camera or sensor) disposed in an area overlapping with the sensing area ED-SA. The electronic module may receive an external input provided from the outside through the sensing area ED-SA, and/or may provide an output through the sensing area ED-SA. As an example, the electronic module may include (e.g., may be) a camera module (e.g., a camera), a sensor that measures a distance, such as a proximity sensor, a sensor that recognizes a part of a user's body (e.g., a fingerprint, an iris, or a face), or a small lamp that outputs light. However, the electronic module is not particularly limited thereto. Hereinafter, for convenience, the camera module will be described as an example of the electronic module overlapping with the sensing area ED-SA.

The electronic device ED may include a folding area FA, and a plurality of non-folding areas NFA1 and NFA2. The non-folding areas NFA1 and NFA2 may include a first non-folding area NFA1 and a second non-folding area NFA2. In the second directional axis DR2, the folding area FA may be disposed between the first non-folding area NFA1 and the second non-folding area NFA2. The folding area FA may be referred to as a foldable area, and the first and second non-folding areas NFA1 and NFA2 may be referred to as first and second non-foldable areas, respectively.

As shown in FIG. 1B, the folding area FA may be folded with respect to a folding axis FX that is parallel or substantially parallel to the first directional axis DR1. When the electronic device ED is folded, the folding area FA may have a suitable curvature (e.g., a predetermined curvature) and a radius of curvature. The electronic device ED may be inwardly folded (e.g., inner-folding), such that the first non-folding area NFA1 and the second non-folding area NFA2 may face each other, and the display surface DS may not be exposed to the outside.

According to an embodiment, the electronic device ED may be outwardly folded (e.g., outer-folding), such that the display surface DS may be exposed to the outside. According to an embodiment, the electronic device ED may be configured to repeatedly perform the inner-folding operation and/or the outer-folding operation with an unfolding operation. According to an embodiment, the electronic device ED may be configured to selectively perform the unfolding operation, the inner-folding operation, and the outer-folding operation.

FIGS. 1A and 1B show a foldable electronic device ED, but the present disclosure is not limited to the foldable electronic device ED. As an example, one or more embodiments of the present disclosure described herein may be applied to a rigid electronic device, for example, such as an electronic device that does not include the folding area FA.

Figure 2A:
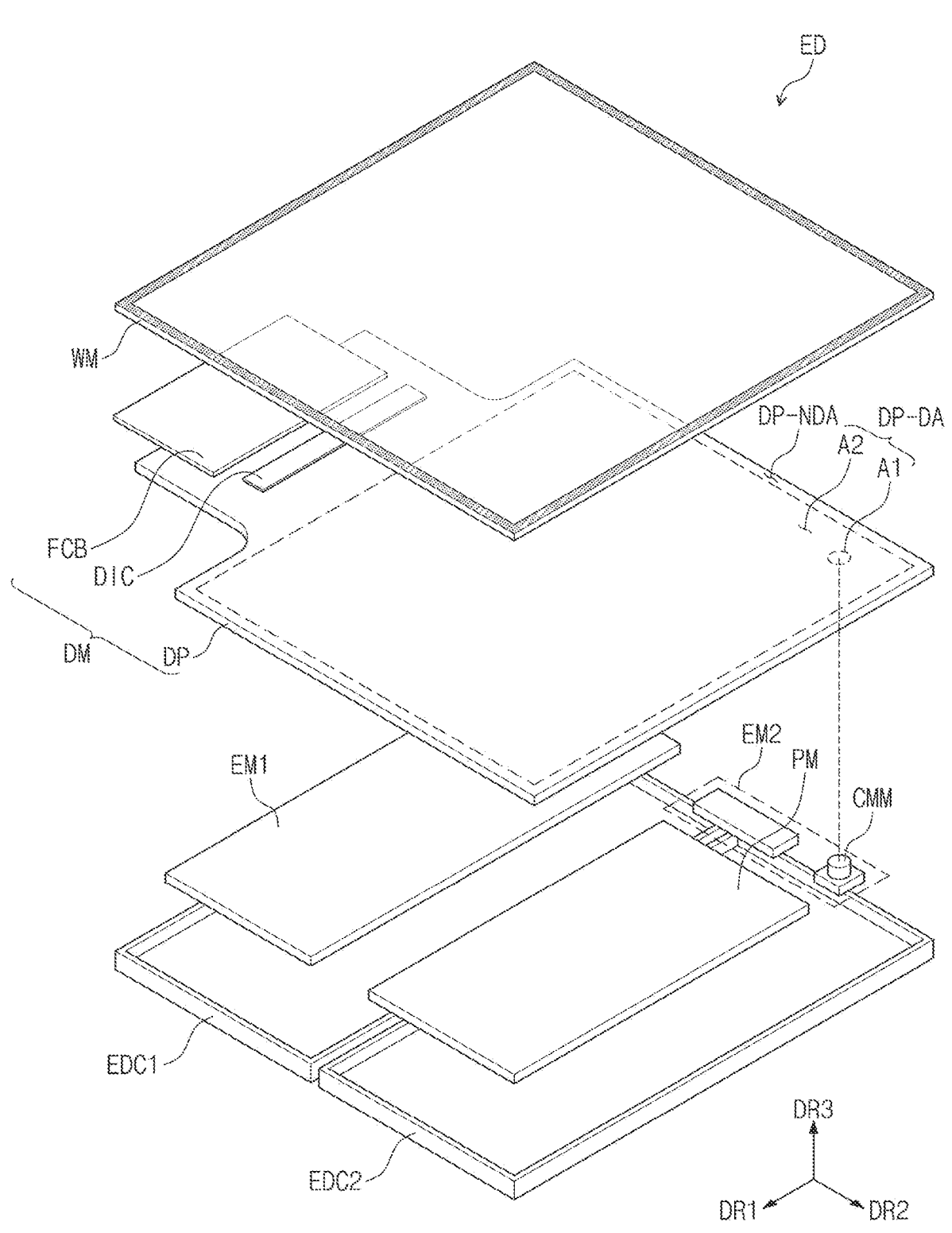
FIG. 2A is an exploded perspective view of an electronic device according to an embodiment of the present disclosure.
Figure 2B:
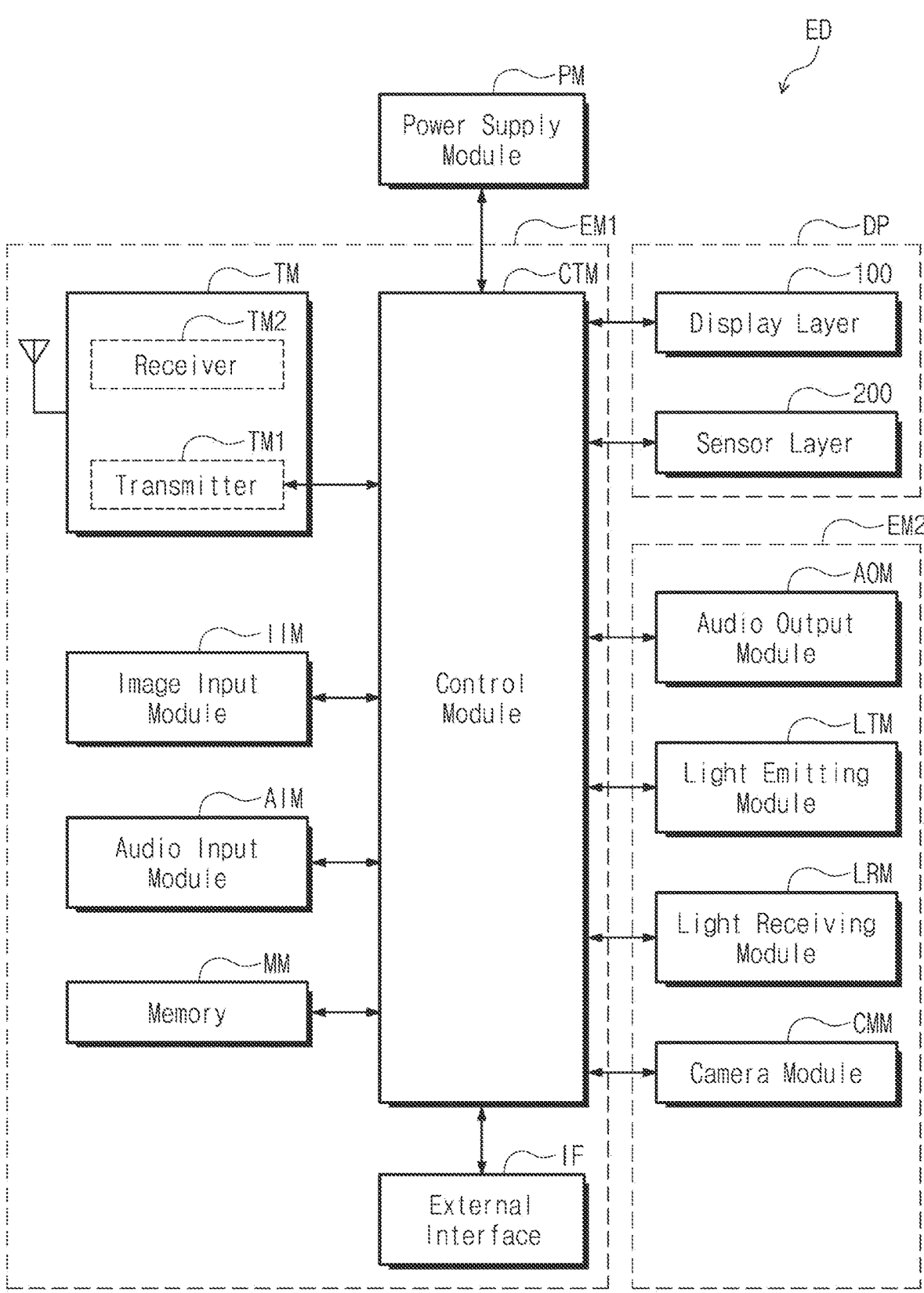
FIG. 2B is a block diagram of an electronic device according to an embodiment of the present disclosure.

FIG. 2A is an exploded perspective view of the electronic device ED according to an embodiment of the present disclosure. FIG. 2B is a block diagram of the electronic device ED according to an embodiment of the present disclosure.

Referring to FIGS. 2A and 2B, the electronic device ED may include a display module (e.g., a display or a touch-display) DM, a window WM, a first electronic module (e.g., an electronic circuit or board) EM1, a second electronic module (e.g., an electronic component or a sensor) EM2, a power supply module (e.g., a power supply) PM, and housings EDC1 and EDC2. Although not shown in figures, the electronic device ED may further include a structure (e.g., a hinge) to control a folding operation of the display module DM.

The display module DM may generate the image IM, and may sense an external input. The display module DM may include a display area DP-DA and a non-display area DP-NDA, which correspond to the display area DA and the non-display area NDA (e.g., refer to FIG. 1A), respectively. As used in the present disclosure, the expression "an area/portion corresponds to another area/portion" means that "an area/portion overlaps with another area/portion", but the "areas and portions" are not limited to having the same size as each other.

The display area DP-DA may include a first area A1 and a second area A2. The first area A1 may overlap with or correspond to the sensing area ED-SA (e.g., refer to FIG. 1A) of the electronic device ED. In the present embodiment, the first area A1 is shown as having a circular shape, but the shape of the first area A1 is not limited thereto or thereby. The first area A1 may have a variety of suitable shapes, such as a polygonal shape, an oval shape, a figure having at least one curved side, or an irregular shape. The first area A1 may be referred to as a component area, and the second area A2 may be referred to as a main display area or a normal display area.

The first area A1 may have a transmittance that is higher than that of the second area A2. In addition, the first area A1 may have a resolution that is lower than that of the second area A2. The first area A1 may overlap with a camera module (e.g., a camera) CMM.

The display module DM may include a display panel DP, a driving circuit DIC, and a circuit board FCB. The display panel DP, the driving circuit DIC, and the circuit board FCB may be electrically connected to each other. Referring to FIG. 2B, the display panel DP may include a display layer 100 and a sensor layer 200.

The display layer 100 may have a configuration that generates the image IM. The display layer 100 may be a light emitting type display layer. For example, the display layer 100 may be an organic light emitting display layer, an inorganic light emitting display layer, an organic-inorganic light emitting display layer, a quantum dot display layer, a micro-LED display layer, or a nano-LED display layer.

The sensor layer 200 may sense the external input applied thereto from the outside. The external input may be a user input. The user input may include a variety of suitable external inputs, such as a part of user's body, light, heat, pen, or pressure.

The driving circuit DIC may be mounted on the display panel DP in the form of a chip, but the present disclosure is not limited thereto. According to an embodiment, the driving circuit DIC may be formed through the same or substantially the same process as that of the pixels of the display area DP-DA, and may be provided as a component of the display panel DP.

In the present embodiment, the driving circuit DIC may be disposed at (e.g., in or on) the non-display area DP-NDA, but the present disclosure is not limited thereto. According to an embodiment, the driving circuit DIC may be disposed at (e.g., in or on) the display area DP-DA to overlap with the pixels, which will be described in more detail below, when viewed in a plane (e.g., in a plan view).

The driving circuit DIC may include various driving elements (e.g., a data driving circuit) to drive the pixels of the display panel DP. FIG. 2A shows a structure in which the driving circuit DIC is mounted on the display panel DP, but the present disclosure is not limited thereto or thereby. As an example, the driving circuit DIC may be mounted on the circuit board FCB.

The circuit board FCB may be connected to the display panel DP. The circuit board FCB may be attached to the display panel DP by a conductive adhesive film ACF, or may be electrically connected to the display panel DP by an ultrasonic connection. The circuit board FCB may be provided as a flexible type (FPCB) or a rigid type (PCB), but is not limited thereto or thereby.

The power supply module PM may supply power used for an overall operation of the electronic device ED. The power supply module PM may include a battery (e.g., a conventional battery module).

The first electronic module EM1 and the second electronic module EM2 may include various functional modules (e.g., functional devices or components) to operate the electronic device ED. Each of the first and second electronic modules EM1 and EM2 may be mounted directly on a mother board that is electrically connected to the display panel DP, or may be electrically connected to the mother board via a connector after being mounted on a separate substrate.

The first electronic module EM1 may include a control module (e.g., a controller) CTM, a wireless communication module (e.g., a wireless communication device) TM, an image input module (e.g., an image input device) IIM, an audio input module (e.g., a microphone or an audio input device) AIM, a memory MM, and an external interface IF.

The control module CTM may control the overall operation of the electronic device ED. The control module CTM may be, but is not limited to, a microprocessor. For example, the control module CTM may activate or deactivate the display panel DP. The control module CTM may control the other modules, such as the image input module IIM, the audio input module AIM, and/or the like, based on a touch signal provided from the display panel DP.

The wireless communication module TM may communicate with an external electronic device through a first network, for example, such as a short-range communication network (e.g., Bluetooth, WiFi direct, or infrared data association (IrDA)), and/or a second network, for example, such as a long-range communication network (e.g., a cellular network, the Internet, or a computer network (e.g., LAN or WAN)). Communication modules included in the wireless communication module TM may be integrated into one component, for example, such as a single chip, or may be implemented as a plurality of components that are separated from each other, for example, such as a plurality of chips. The wireless communication module TM may transmit/receive a voice signal using a general communication line. The wireless communication module TM may include a transmitter TM1 that modulates a signal to be transmitted and transmits the modulated signal, and a receiver TM2 that demodulates a signal applied thereto.

The image input module IIM may process an image signal, and may convert the image signal into image data that may be displayed through the display panel DP. The audio input module AIM may receive an external sound signal through a microphone in a record mode or a voice recognition mode, and may convert the external sound signal to electrical voice data.

The external interface IF may include a connector that physically connects the electrode device ED to an external electronic device. For example, the external interface IF may serve as an interface between the control module CM and various suitable external devices, such as an external charger, a wired/wireless data port, a card socket (e.g., a memory card and/or a SIM/UIM card), and/or the like.

The second electronic module EM2 may include an audio output module (e.g., a speaker or an audio output device) AOM, a light emitting module (e.g., a flash light or a light emitting device) LTM, a light receiving module (e.g., a light receiving device or sensor) LRM, and the camera module CMM. The audio output module AOM may convert audio data provided from the wireless communication module TM or audio data stored in the memory MM, and may output the converted audio data to the outside.

The light emitting module LTM may generate and emit light. The light emitting module LTM may emit an infrared light. The light emitting module LTM may include an LED element. The light receiving module LRM may sense the infrared light. The light receiving module LRM may be activated when the infrared light above a predetermined level is sensed. The light receiving module LRM may include a CMOS sensor. The infrared light generated and emitted from the light emitting module LTM may be reflected by an external object, for example, such as a user's finger or face, and the reflected infrared light may be incident into the light receiving module LRM.

The camera module CMM may take a photo or a video. The camera module CMM may be provided in a plurality. Some of the camera modules CMM may overlap with the first area A1. An external input, for example, such as light, may be provided to the camera module CMM through the first area A1. As an example, the camera module CMM may receive natural light through the first area A1 from the outside to take a picture of an external object.

The housings EDC1 and EDC2 may accommodate the display module DM, the first and second electronic modules EM1 and EM2, and the power supply module PM. The housings EDC1 and EDC2 may protect the components accommodated therein, such as the display module DM, the first and second electronic modules EM1 and EM2, and the power supply module PM. FIG. 2A shows two housings EDC1 and EDC2 that are separated (e.g., spaced apart) from each other, but the structure of the housings are not limited thereto or thereby. Although not shown in figures, the electronic device ED may further include a hinge structure to connect the two housings EDC1 and EDC2 to each other. The housings EDC1 and EDC2 may be coupled with (e.g., connected to or attached to) the window WM.

Figure 3A:
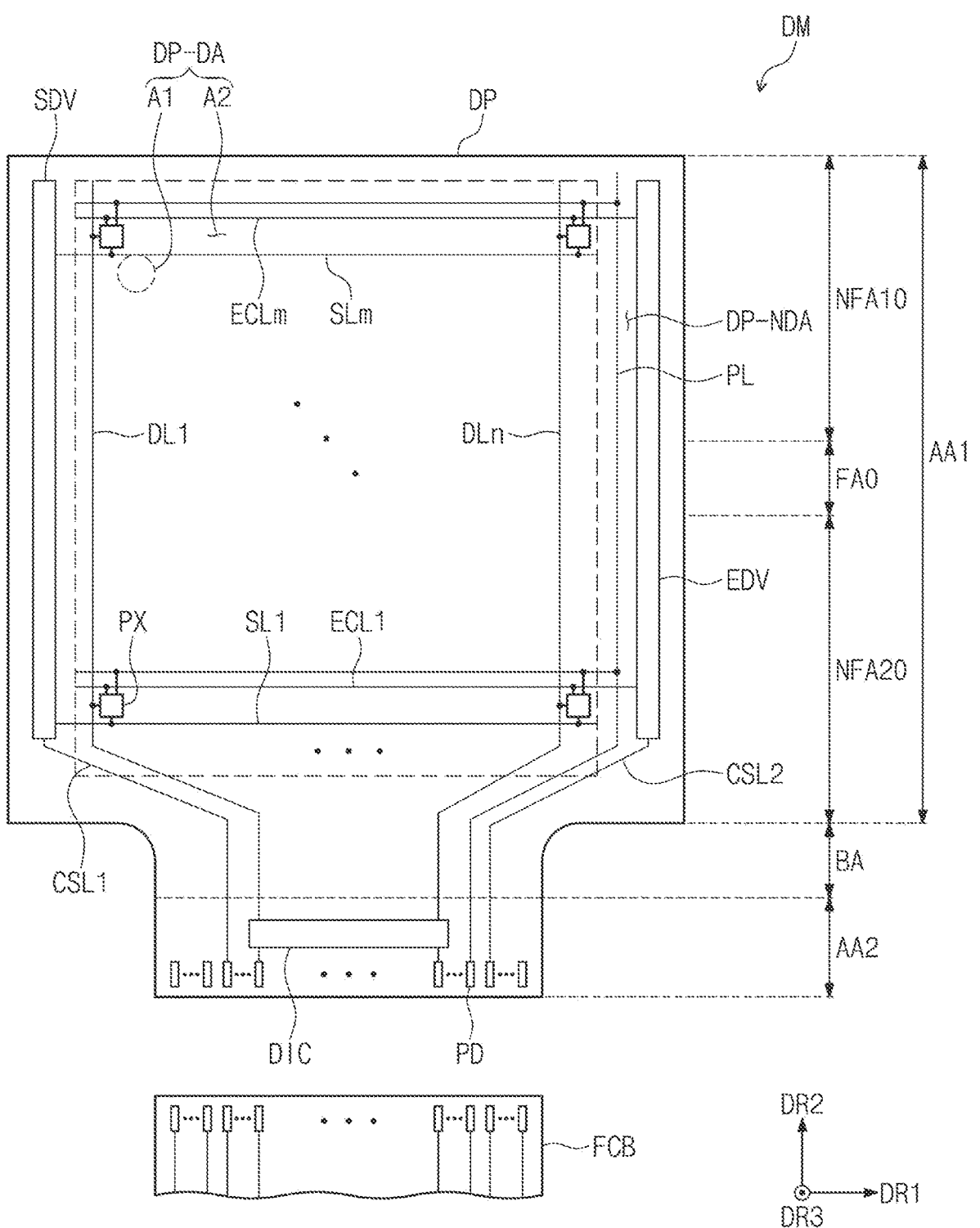
FIG. 3A is a plan view of a display module according to an embodiment of the present disclosure.
Figure 3B:
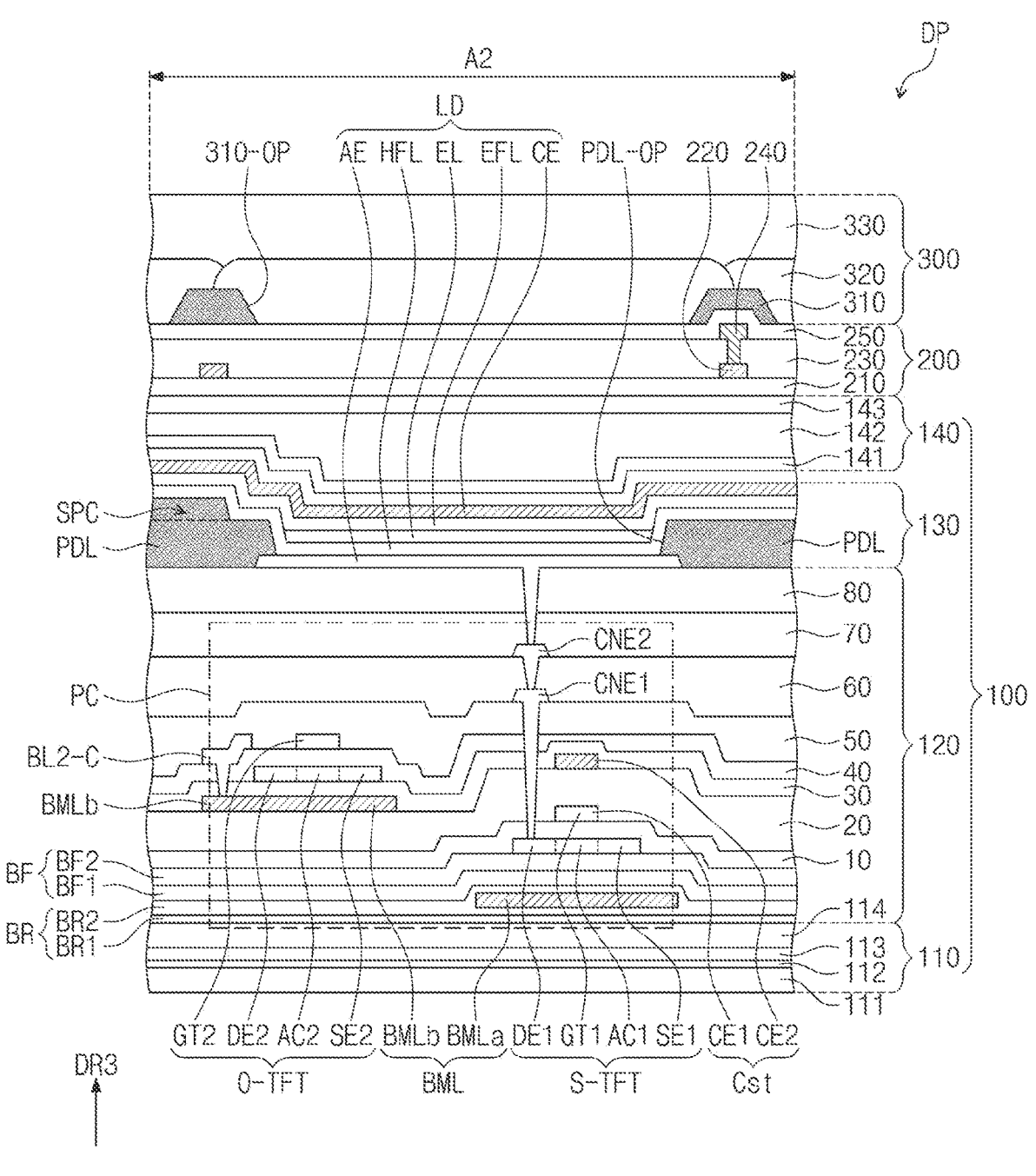
FIG. 3B is a cross-sectional view of a portion of a display panel shown in FIG. 3A.

FIG. 3A is a plan view of the display module DM according to an embodiment of the present disclosure. FIG. 3B is a cross-sectional view of a portion of the display panel DP shown in FIG. 3A. Hereinafter, one or more embodiments of the present disclosure will be described in more detail with reference to FIGS. 3A and 3B.

Referring to FIG. 3A, the display panel DP may include the pixels PX. The pixels PX may be disposed at (e.g., in or on) the display area DP-DA. A scan driver SDV, a data driver, and an emission driver EDV may be disposed at (e.g., in or on) the non-display area DP-NDA. The data driver may be a circuit provided in the driving circuit DIC.

The display area DP-DA may include the first area A1 and the second area A2. The first area A1 and the second area A2 may be distinguished from each other by an arrangement distance between the pixels PX, a size of the pixels PX, and/or a presence or absence of a transmission area. The first area A1 and the second area A2 will be described in more detail below.

The display panel DP may include a first panel area AA1, a bending area BA, and a second panel area AA2, which are defined along the second directional axis DR2. The second panel area AA2 and the bending area BA may be areas of the non-display area DP-NDA. The bending area BA may be defined between the first panel area AA1 and the second panel area AA2.

The first panel area AA1 may correspond to the display surface DS (e.g., see FIG. 1A). The first panel area AA1 may include a first non-folding area NFA10, a second non-folding area NFA20, and a folding area FAO. The first non-folding area NFA10, the second non-folding area NFA20, and the folding area FAO may correspond to the first non-folding area NFA1, the second non-folding area NFA2, and the folding area FA (e.g., see FIGS. 1A and 1B), respectively.

The bending area BA may correspond to an area that is bent when the electronic device ED is assembled. As the display panel DP includes the bending area BA, the electronic device ED with a narrow bezel may be implemented (e.g., may be easily implemented).

A width (e.g., a length) in the first directional axis DR1 of the bending area BA and a width (e.g., a length) in the first directional axis DR1 of the second panel area AA2 may be smaller than a width (e.g., a length) in the first directional axis DR1 of the first panel area AA1. An area having a relatively short length in a bending axis direction may be relatively easily bent.

The display panel DP may include the pixels PX, a plurality of scan lines SL1 to SLm, a plurality of data lines DL1 to DLn, a plurality of emission control lines ECL1 to ECLm, first and second control lines CSL1 and CSL2, a driving voltage line PL, and a plurality of pads PD. In the present embodiment, each of m and n is a natural number. The pixels PX may be connected to the scan lines SL1 to SLm, the data lines DL1 to DLn, and the emission control lines ECL1 to ECLm.

The scan lines SL1 to SLm may extend in the first directional axis DR1, and may be electrically connected to the scan driver SDV. The data lines DL1 to DLn may extend in the second directional axis DR2, and may be electrically connected to the driving circuit DIC via the bending area BA. The emission control lines ECL1 to ECLm may extend in the first directional axis DR1, and may be electrically connected to the emission driver EDV.

The driving voltage line PL may include a portion extending in the first directional axis DR1, and a portion extending in the second directional axis DR2. The portion extending in the first directional axis DR1 and the portion extending in the second directional axis DR2 may be disposed at (e.g., in or on) different layers from each other. The portion of the driving voltage line PL, which extends in the second directional axis DR2, may extend to the second panel area AA2 via the bending area BA. The driving voltage line PL may provide a first voltage to the pixels PX.

The first control line CSL1 may be connected to the scan driver SDV, and may extend to a lower end of the second panel area AA2 via the bending area BA. The second control line CSL2 may be connected to the emission driver EDV, and may extend to the lower end of the second panel area AA2 via the bending area BA.

When viewed in a plane (e.g., in a plan view), the pads PD may be disposed adjacent to the lower end of the second panel area AA2. The driving circuit DIC, the driving voltage line PL, the first control line CSL1, and the second control line CSL2 may be electrically connected to the pads PD. The circuit board FCB may be electrically connected to the pads PD. The circuit board FCB may be connected to the pads PD through an anisotropic conductive adhesive layer.

Referring to FIG. 3B, the display panel DP may include a display layer 100, a sensor layer 200, and an anti-reflective layer 300. The display layer 100 may include a substrate 110, a circuit layer 120, a light emitting element layer 130, and an encapsulation layer 140.

The substrate 110 may include a plurality of layers 111, 112, 113, and 114. As an example, the substrate 110 may include a first sub-base layer 111, a first intermediate barrier layer 112, a second intermediate barrier layer 113, and a second sub-base layer 114. The first sub-base layer 111, the first intermediate barrier layer 112, the second intermediate barrier layer 113, and the second sub-base layer 114 may be sequentially stacked in the third directional axis DR3.

Each of the first sub-base layer 111 and the second sub-base layer 114 may include at least one of a polyimide-based resin, an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. Meanwhile, as used in the present disclosure, the term "X-based resin" means that a functional group of "X" is included in the resin. A barrier layer BR may be disposed on the substrate 110.

Each of the first and second intermediate barrier layers 112 and 113 may include an inorganic material. Each of the first and second intermediate barrier layers 112 and 113 may include at least one of silicon oxide, silicon nitride, silicon oxynitride, or amorphous silicon. As an example, each of the first sub-base layer 111 and the second sub-base layer 114 may include polyimide, the first intermediate barrier layer 112 may include silicon oxynitride (SiON), and the second intermediate barrier layer 113 may include silicon oxide (SiOX).

In other words, the first intermediate barrier layer 112 may have a refractive index corresponding to a value between a refractive index of the first sub-base layer 111 and a refractive index of the second intermediate barrier layer 113. As a difference in the refractive index between layers that are in contact with each other decreases, a reflection of light at an interface between the layers that are in contact with each other may be reduced. However, the present disclosure is not limited thereto, and each of the layers may include various suitable materials, and are not particularly limited to the example materials described above.

The first sub-base layer 111 may have a thickness (e.g., in the third direction DR3) greater than a thickness (e.g., in the third direction DR3) of the second sub-base layer 114, but the present disclosure is not limited thereto or thereby. A thickness of the first intermediate barrier layer 112 may be smaller than a thickness of the second intermediate barrier layer 113. However, the thickness of each of the first and second intermediate barrier layers 112 and 113 is not limited thereto or thereby.

The circuit layer 120 may include a pixel circuit PC, and a plurality of insulating layers BR, BF, and 10 to 80. The insulating layers BR, BF, and 10 to 80 may include the barrier layer BR, a buffer layer BF, and first, second, third, fourth, fifth, sixth, seventh, and eighth insulating layers 10, 20, 30, 40, 50, 60, 70, and 80, which are arranged (e.g., stacked) along the third directional axis DR3.

The pixel circuit PC may include a light blocking layer BML, a plurality of thin film transistors S-TFT and O-TFT, and a storage capacitor Cst. The pixel circuit PC, along with a light emitting element LD connected thereto, may form the pixel PX. The pixel PX may include the thin film transistors S-TFT and O-TFT, and the light emitting element LD. For convenience of illustration, FIG. 3B shows two thin film transistors S-TFT and O-TFT (hereinafter, referred to as a first thin film transistor and a second thin film transistor, respectively) as a representative example. According to an embodiment, the number of the thin film transistors of the pixel PX may be variously modified as needed or desired, and thus, is not particularly limited.

The barrier layer BR may be disposed on the substrate 110. The barrier layer BR may include a first sub-barrier layer BR1 disposed on the substrate 110, and a second sub-barrier layer BR2 disposed on the first sub-barrier layer BR1.

Each of the first and second sub-barrier layers BR1 and BR2 may include an inorganic material. Each of the first and second sub-barrier layers BR1 and BR2 may include at least one of silicon oxide, silicon nitride, silicon oxynitride, or amorphous silicon. As an example, the first sub-barrier layer BR1 may include silicon oxynitride (SiON), and the second sub-barrier layer BR2 may include silicon oxide (SiOX).

The first sub-barrier layer BR1 may have a refractive index corresponding to a value between a refractive index of the second sub-base layer 114 and a refractive index of the second sub-barrier layer BR2. As a difference in the refractive index between layers that are in contact with each other decreases, a reflection of light at an interface between the layers that are in contact with each other may be reduced. As a result, the transmittance of light passing through a transmission area (e.g., at or overlapping with the first area A1) may be improved. However, the present disclosure is not limited thereto, and each of the first and second sub-barrier layers BR1 and BR2 may include various suitable materials.

The light blocking layer BML may be disposed on the barrier layer BR. The light blocking layer BML may include molybdenum (Mo), an alloy including molybdenum (Mo), silver (Ag), an alloy including silver (Ag), aluminum (Al), an alloy including aluminum (Al), aluminum nitride (AlN), tungsten (W), tungsten nitride (WN), copper (Cu), titanium Ti, p+ doped amorphous silicon, MoTaOx, and/or the like, but the present disclosure is not limited thereto or thereby. The light blocking layer BML may be referred to as a rear surface metal layer, or a rear surface layer.

The light blocking layer BML may include a first light blocking layer BMLa and a second light blocking layer BMLb, which are disposed at (e.g., in or on) different layers from each other. The first light blocking layer BMLa and the second light blocking layer BMLb may block light incident into the first and second thin film transistors S-TFT and O-TFT, respectively, from a rear surface of the substrate 110. Accordingly, defects, such as, changes in characteristics of the first and second thin film transistors S-TFT and O-TFT or generation of noise signals by the light, may be prevented or substantially prevented.

The first light blocking layer BMLa may be disposed on the first sub-barrier layer BR1, and may be disposed in the second sub-barrier layer BR2. In other words, the first light blocking layer BMLa may be formed after a portion of the second sub-barrier layer BR2 in a thickness direction (e.g., the third direction DR3) is formed, and then, another portion of the second sub-barrier layer BR2 in the thickness direction may be formed to cover the first light blocking layer BMLa. However, the present disclosure is not limited thereto, and the first light blocking layer BMLa may be disposed under or above the second sub-barrier layer BR2, as long as the first light blocking layer BMLa is disposed under the first thin film transistor S-TFT, but is not particularly limited thereto.

The buffer layer BF may be disposed on the barrier layer BR. The buffer layer BF may prevent or substantially prevent metal atoms or impurities from being diffused to a first semiconductor pattern of the first thin film transistor S-TFT from the substrate 110. In addition, the buffer layer BF may control a rate of heat supply during a crystallization process to form the first semiconductor pattern, so that the first semiconductor pattern of the first thin film transistor S-TFT may be uniformly or substantially uniformly formed.

The buffer layer BF may include a first sub-buffer layer BF1, and a second sub-buffer layer BF2 disposed on the first sub-buffer layer BF1. Each of the first sub-buffer layer BF1 and the second sub-buffer layer BF2 may include at least one of silicon oxide, silicon nitride, or silicon oxynitride. As an example, the first sub-buffer layer BF1 may include silicon nitride, and the second sub-buffer layer BF2 may include silicon oxide.

In some embodiments, a portion of the second sub-buffer layer BF2 may be removed at (e.g., in or on) the first area A1. Accordingly, a thickness of a portion of the second sub-buffer layer BF2 disposed at (e.g., in or on) second area A2 may be greater than a thickness of the portion of the second sub-buffer layer BF2 disposed at (e.g., in or on) the first area A1. However, the present disclosure is not limited thereto, and the second sub-buffer layer BF2 may have a uniform or substantially uniform thickness at (e.g., in or on) the first area A1 and the second area A2, but is not particularly limited thereto.

The first to eighth insulating layers 10 to 80 may include a plurality of inorganic insulating layers. According to an embodiment, at least some of the layers from among the first insulating layer 10 to the fifth insulating layer 50 that are sequentially disposed on the buffer layer BF may be the inorganic insulating layers. As an example, all of the first insulating layer 10 to the fifth insulating layer 50 may be the inorganic insulating layers.

The first thin film transistor S-TFT may be disposed on the buffer layer BF. The first thin film transistor S-TFT may include a first gate GT1, a first source SE1, a first drain DE1, and a first channel AC1. The first source SE1, the first drain DE1, and the first channel AC1 may form a single semiconductor pattern (hereinafter, referred to as the first semiconductor pattern).

The first semiconductor pattern may be disposed on the buffer layer BF. The first semiconductor pattern may include a silicon semiconductor. As an example, the silicon semiconductor may include amorphous silicon or polycrystalline silicon. For example, the first semiconductor pattern may include low temperature polycrystalline silicon.

For convenience of illustration, FIG. 3B shows a portion of the first semiconductor pattern disposed on the buffer layer BF, and the first semiconductor pattern may be further disposed at (e.g., in or on) other areas. The first semiconductor pattern may be arranged with a suitable rule (e.g., a predetermined or specific rule) over the pixels PX. The first semiconductor pattern may have different electrical properties depending on whether or not it is doped, or whether or not it is doped with an N-type dopant or a P-type dopant. The first semiconductor pattern may include a first region having a relatively high conductivity, and a second region having a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region, or a region doped at a concentration lower than that of the first region.

The first region may have a conductivity greater than that of the second region, and may be a source area or a drain area of the first thin film transistor S-TFT, or may serve as or substantially serve as an electrode or a signal line. The second region may correspond to or substantially correspond to an active area (e.g., a channel) of the first thin film transistor S-TFT.

In the present embodiment, each of the first source SE1 and the first drain DE1 may be a part of the first region, and the first channel AC1 may be the second region. However, the present disclosure is not limited thereto, and the first source SE1 and the first drain DE1 may be provided as electrodes spaced apart (e.g., separated) from the first channel AC1, and may be connected to the first semiconductor pattern, but are not limited thereto or thereby.

The first gate GT1 may be disposed on the first insulating layer 10. The first gate GT1 may be a portion of a metal pattern. The first gate GT1 may overlap with the first channel AC1. The first gate GT1 may be used as a mask in a process of doping the first semiconductor pattern. The first gate GT1 may include titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), or the like, but is not particularly limited thereto.

The second insulating layer 20 may be disposed on the first insulating layer 10, and may cover the first gate GT1. The second insulating layer 20 may be an inorganic layer, and may have a single-layer structure or a multi-layered structure. The second insulating layer 20 may include at least one of silicon oxide, silicon nitride, or silicon oxynitride. According to the present embodiment, the second insulating layer 20 may have the multi-layered structure of a silicon oxide layer and a silicon nitride layer.

The third insulating layer 30 may be disposed on the second insulating layer 20. The third insulating layer 30 may be an inorganic layer, and may have a single-layer structure or a multi-layered structure. As an example, the third insulating layer 30 may have the multi-layered structure of a silicon oxide layer and a silicon nitride layer. A second electrode CE2 of the storage capacitor Cst may be disposed between the second insulating layer 20 and the third insulating layer 30. In addition, a first electrode CE1 of the storage capacitor Cst may be disposed between the first insulating layer 10 and the second insulating layer 20.

The second light blocking layer BMLb may be disposed on the second insulating layer 20, and may be covered by the third insulating layer 30. The second light blocking layer BMLb may be disposed at (e.g., in or on) the same layer as that of the second electrode CE2, and may be concurrently (e.g., simultaneously or substantially simultaneously) formed with the second electrode CE2 through the same process. Accordingly, process costs may be reduced, and a manufacturing process may be simplified. However, the present disclosure is not limited thereto, and the second light blocking layer BMLb may be disposed at (e.g., in or on) a different layer from a layer at (e.g., in or on) which the second electrode CE2 is disposed, or may be formed of a different material from that of the second electrode CE2, but is not particularly limited thereto.

The second thin film transistor O-TFT may be disposed on the third insulating layer 30. The second thin film transistor O-TFT may include a second gate GT2, a second source SE2, a second drain DE2, and a second channel AC2. The second source SE2, the second drain DE2, and the second channel AC2 may form a single semiconductor pattern (hereinafter, referred to as a second semiconductor pattern).

The second semiconductor pattern may be disposed on the third insulating layer 30. The second semiconductor pattern may include an oxide semiconductor. The oxide semiconductor may include a plurality of areas that are distinguished from each other depending on whether or not a metal oxide is reduced. An area (hereinafter, referred to as a reduced area) in which the metal oxide is reduced has a conductivity greater than that of an area (hereinafter, referred to as a non-reduced area) in which the metal oxide is not reduced.

The reduced area may act as a source area or a drain area of the second thin film transistor O-TFT, or may serve as or substantially serve as an electrode or a signal line. The non-reduced area may correspond to the active area (e.g., a channel) of the second thin film transistor O-TFT.

In the present embodiment, each of the second source SE2 and the second drain DE2 may be parts of the reduced area, and the second channel AC2 may be the non-reduced area, but the present disclosure is not limited thereto. According to an embodiment, the second source SE2 and the second drain DE2 may be provided as electrodes that are spaced apart (e.g., separated) from the second channel AC2, and may be connected to the second semiconductor pattern, but are not particularly limited thereto.

The fourth insulating layer 40 may be disposed on the third insulating layer 30. The fourth insulating layer 40 may commonly overlap with the pixels, and may cover the second semiconductor pattern. The fourth insulating layer 40 may be an inorganic layer, and may have a single-layer structure or a multi-layered structure. The fourth insulating layer 40 may include at least one of aluminum oxide, titanium oxide, silicon oxide, silicon nitride, silicon oxynitride, zirconium oxide, or hafnium oxide.

The second gate GT2 may be disposed on the fourth insulating layer 40. The second gate GT2 may be a portion of a metal pattern. The second gate GT2 may overlap with the second channel AC2 when viewed in a plane (e.g., in a plan view). The second gate GT2 may be used as a mask in a process of doping the second semiconductor pattern.

The fifth insulating layer 50 may be disposed on the fourth insulating layer 40, and may cover the second gate GT2. The fifth insulating layer 50 may be an inorganic layer and/or an organic layer, and may have a single-layer structure or a multi-layered structure.

A first connection electrode CNE1 may be disposed on the fifth insulating layer 50. The first connection electrode CNE1 may be connected to the first drain DE1 via a contact hole defined through (e.g., penetrating) the first, second, third, fourth, and fifth insulating layers 10, 20, 30, 40, and 50. In some embodiments, the display panel DP may further include a connection electrode formed at a position corresponding to the first connection electrode CNE1 and connected to the second drain DE2 or the second source SE2, but the present disclosure is not particularly limited thereto.

In the present embodiment, the first thin film transistor S-TFT is described as the silicon thin film transistor, and the second thin film transistor O-TFT is described as the oxide thin film transistor. However, according to an embodiment, the first thin film transistor S-TFT may be the oxide thin film transistor, and the second thin film transistor O-TFT may be the silicon thin film transistor. According to an embodiment, the first and second thin film transistors S-TFT and O-TFT may be formed of the same or substantially the same semiconductor material. According to an embodiment, the pixel circuit PC may be designed with various suitable thin film transistors as needed or desired, and is not particularly limited to the examples described above.

The circuit layer 120 may include a plurality of organic insulating layers disposed on the inorganic insulating layers. As an example, at least one of the sixth, seventh, and eighth insulating layers 60, 70, and 80 may be an organic insulating layer.

The sixth insulating layer 60 may be disposed on the fifth insulating layer 50. The sixth insulating layer 60 may include an organic material. For example, the sixth insulating layer 60 may include a polyimide-based resin. A second connection electrode CNE2 may be disposed on the sixth insulating layer 60. The second connection electrode CNE2 may be connected to the first connection electrode CNE1 through a contact hole defined through (e.g., penetrating) the sixth insulating layer 60.

The seventh insulating layer 70 may be disposed on the sixth insulating layer 60, and may cover the second connection electrode CNE2. The eighth insulating layer 80 may be disposed on the seventh insulating layer 70.

Each of the sixth insulating layer 60, the seventh insulating layer 70, and the eighth insulating layer 80 may be an organic layer. The sixth insulating layer 60 may be referred to as a first organic insulating layer, the seventh insulating layer 70 may be referred to as a second organic insulating layer, and the eighth insulating layer 80 may be referred to as a third organic insulating layer. As an example, each of the sixth insulating layer 60, the seventh insulating layer 70, and the eighth insulating layer 80 may include a general-purpose polymer, such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or suitable blends thereof.

At least some insulating layers from among the buffer layer BF, the barrier layer BR, and the first to eighth insulating layers 10, 20, 30, 40, 50, 60, 70, and 80, which are included in the circuit layer 120, may be provided with an opening (e.g., a predetermined opening) defined (e.g., penetrating) therethrough to overlap with the first area A1. According to one or more embodiments of the present disclosure, portions of the insulating layers at (e.g., in or on) an area overlapping with the first area A1 may be removed, and thus, a transmittance of the first area A1 may be increased, but the present disclosure is not limited thereto. According to an embodiment, all of the buffer layer BF, the barrier layer BR, and the first to eighth insulating layers 10, 20, 30, 40, 50, 60, 70, and 80 may overlap with the first area A1, and the present disclosure is not particularly limited.

The light emitting element layer 130 including the light emitting element LD may be disposed on the circuit layer 120. The light emitting element LD may include a pixel electrode AE, a first functional layer HFL, a light emitting layer EL, a second functional layer EFL, and a common electrode CE. Each of the first functional layer HFL, the second functional layer EFL, and the common electrode CE may be provided in an integral shape over the display area DP-DA. However, the present disclosure is not limited thereto. The first functional layer HFL, the second functional layer EFL, and the common electrode CE may be patterned for every pixel PX, and are not particularly limited.

The pixel electrode AE may be disposed on the eighth insulating layer 80. The pixel electrode AE may be a semi-transmissive electrode, a transmissive electrode, or a reflective electrode. According to an embodiment, the pixel electrode AE may include a reflective layer formed of Ag, Mg, Al, Pt, Pd, Au, Ni, Nd, Ir, Cr, or suitable compounds thereof, and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide (In2O3), and aluminum-doped zinc oxide (AZO). For example, the pixel electrode AE may have a stacked structure of ITO/Ag/ITO.

As shown in FIG. 3B, in some embodiments, the pixel electrode AE may be connected to the first thin film transistor S-TFT via the first connection electrode CNE1 and the second connection electrode CNE2. However, the present disclosure is not limited thereto. According to an embodiment, the pixel electrode AE may be connected to the second thin film transistor O-TFT, and is not particularly limited.

A pixel definition layer PDL may be disposed on the eighth insulating layer 80. The pixel definition layer PDL may have a light absorbing property. For example, the pixel definition layer PDL may have a black color. The pixel definition layer PDL may include a black coloring agent. The black coloring agent may include a black dye or a black pigment. The black coloring agent may include a metal material, such as carbon black, chromium, or an oxide thereof.

The pixel definition layer PDL may be provided with an opening PDL-OP (hereinafter, referred to as a light emitting opening) defined (e.g., penetrating) therethrough to expose a portion of the pixel electrode AE. In other words, the pixel definition layer PDL may cover an edge of the pixel electrode AE. In addition, the pixel definition layer PDL may cover a side surface of the eighth insulating layer 80 adjacent to the transmission area.

The first functional layer HFL may be disposed on the pixel electrode AE and the pixel definition layer PDL. The first functional layer HFL may include a hole transport layer, a hole injection layer, or both the hole transport layer and the hole injection layer. The first functional layer HFL may be disposed over the first area A1 and the second area A2, and the first functional layer HFL may be disposed at (e.g., in or on) the transmission area.

The light emitting layer EL may be disposed on the first functional layer HFL, and may be disposed in an area corresponding to the light emitting opening PDL-OP of the pixel definition layer PDL. The light emitting layer EL may include an organic material, an inorganic material, or an organic-inorganic material, which emits light having a suitable color (e.g., a predetermined color). The light emitting layer EL may be disposed at (e.g., in or on) the first area A1 and the second area A2.

The second functional layer EFL may be disposed on the first functional layer HFL, and may cover the light emitting layer EL. The second functional layer EFL may include an electron transport layer, an electron injection layer, or both the electron transport layer and the electron injection layer. The second functional layer EFL may be disposed over the first area A1 and the second area A2, and the second functional layer EFL may also be disposed at (e.g., in or on) the transmission area.

The common electrode CE may be disposed on the second functional layer EFL. The common electrode CE may be formed of a transmissive electrode layer, or a semi-transmissive electrode layer. As an example, the common electrode CE may include a thin layer, for example, such as an Ag layer, with a suitable light transmittance.

In some embodiments, the light emitting element layer 130 may further include a capping layer disposed on the common electrode CE. The capping layer may include LiF, an inorganic material, and/or an organic material. The capping layer may protect the common electrode CE in a process of forming the encapsulation layer 140, and may improve a light extraction efficiency of the light emitting element LD through a refractive index matching with the common electrode CE.

The encapsulation layer 140 may be disposed on the light emitting element layer 130. The encapsulation layer 140 may include an inorganic layer 141, an organic layer 142, and an inorganic layer 143, which are sequentially stacked. However, the layers included in the encapsulation layer 140 are not limited thereto or thereby.

The inorganic layers 141 and 143 may protect the light emitting element layer 130 from moisture and/or oxygen, and the organic layer 142 may protect the light emitting element layer 130 from a foreign substance, such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based organic layer, but is not limited thereto or thereby.

The sensor layer 200 may be disposed on the display layer 100. The sensor layer 200 may be referred to as a sensor, an input sensing layer, or an input sensing panel. The sensor layer 200 may include a sensor base layer 210, a first sensor conductive layer 220, a sensor insulating layer 230, a second sensor conductive layer 240, and a sensor cover layer 250.

The sensor base layer 210 may be disposed directly on the display layer 100. The sensor base layer 210 may be an inorganic layer including at least one of silicon nitride, silicon oxynitride, or silicon oxide. According to an embodiment, the sensor base layer 210 may be an organic layer including an epoxy resin, an acrylic resin, or an imide-based resin. The sensor base layer 210 may have a single-layer structure or a multi-layered structure of a plurality of layers stacked in the third directional axis DR3.

Each of the first sensor conductive layer 220 and the second sensor conductive layer 240 may have a single-layer structure or a multi-layered structure of a plurality of layers stacked in the third directional axis DR3.

The conductive layer having the single-layer structure may include a metal layer or a transparent conductive layer. The metal layer may include molybdenum, silver, titanium, copper, aluminum, or suitable alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include a conductive polymer, such as PEDOT, a metal nanowire, graphene, or the like.

The conductive layer having the multi-layered structure may include a plurality of metal layers. The metal layers may have a three-layered structure of titanium/aluminum/titanium. The conductive layer having the multi-layered structure may include at least one metal layer, and at least one transparent conductive layer.

The sensor insulating layer 230 may be disposed between the first sensor conductive layer 220 and the second sensor conductive layer 240. The sensor insulating layer 230 may include an inorganic layer. The inorganic layer may include at least one of aluminum oxide, titanium oxide, silicon oxide, silicon nitride, silicon oxynitride, zirconium oxide, or hafnium oxide.

According to an embodiment, the sensor insulating layer 230 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

The sensor cover layer 250 may be disposed on the sensor insulating layer 230, and may cover the second sensor conductive layer 240. The second sensor conductive layer 240 may include a conductive pattern, such as a mesh pattern. The sensor cover layer 250 may cover the conductive layer 240, and may reduce a possibility of the occurrence of damage in the conductive layer 240 in a subsequent process.

The sensor cover layer 250 may include an inorganic material. As an example, the sensor cover layer 250 may include silicon nitride, but is not limited thereto or thereby.

The anti-reflective layer 300 may be disposed on the sensor layer 200. The anti-reflective layer 300 may include a division layer 310, a plurality of color filters 320, and a planarization layer 330.

The division layer 310 may be disposed to overlap with the second sensor conductive layer 240. In the present embodiment, the conductive layer 240 may correspond to the second sensor conductive layer 240. The sensor cover layer 250 may be disposed between the division layer 310 and the second sensor conductive layer 240. The division layer 310 may prevent or substantially prevent external light from being reflected by the second sensor conductive layer 240. Materials for the division layer 310 are not particularly limited, as long as the materials absorb light.

The division layer 310 may have a black color, and may have a black coloring agent. The black coloring agent may include a black dye or a black pigment. The black coloring agent may include a metal material, such as carbon black, chromium, or an oxide thereof.

The division layer 310 may be provided with a plurality of division openings 310-OP defined (e.g., penetrating) therethrough. The division openings 310-OP may overlap with the light emitting elements LD of the light emitting layer EL, respectively. The color filters 320 may be disposed to correspond to the division openings 310-OP, respectively.

The color filters 320 may transmit light provided from the light emitting layer EL overlapping with the color filters 320.

In the present embodiment, at least one of the division layer 310 or the color filters 320 may not be disposed at (e.g., in or on) the first area A1. Accordingly, the light transmittance of the first area A1 may be improved, but the present disclosure is not limited thereto. According to an embodiment, the division layer 310 and the color filters 320 may be partially disposed at (e.g., in or on) the first area A1, as long as the division layer 310 and the color filters 320 do not affect a function of the camera module CMM, but are not particularly limited.

The planarization layer 330 may cover the division layer 310 and the color filters 320. The planarization layer 330 may include an organic material, and may provide a flat or substantially flat surface at an upper surface thereof. According to an embodiment, the planarization layer 330 may be omitted as needed or desired.

According to an embodiment, at least one of the sensor layer 200 or the anti-reflective layer 300 may be omitted in the display panel DP as needed or desired, and the display panel DP is not particularly limited.

Figure 4:
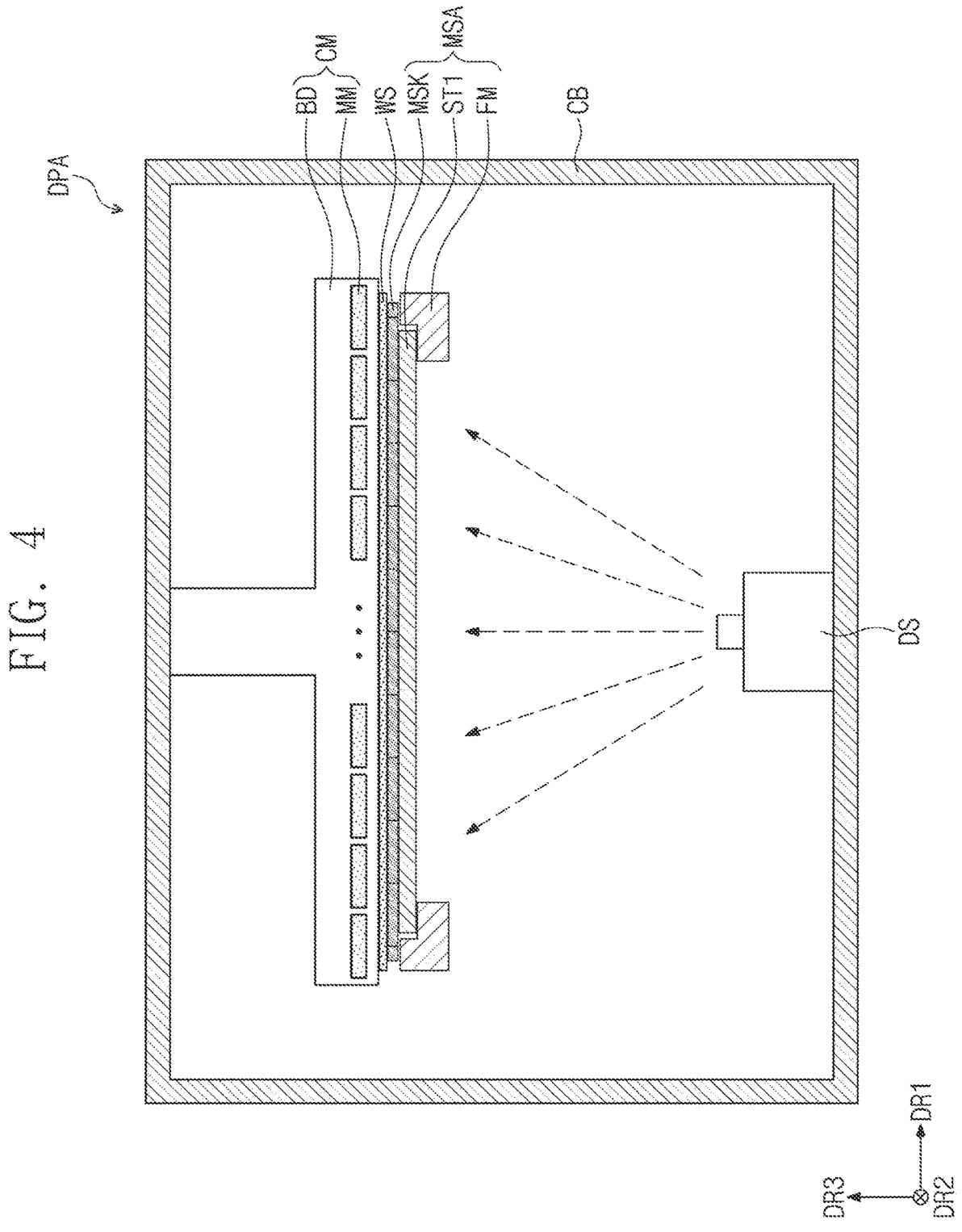
FIG. 4 is a cross-sectional view of a deposition apparatus.
Figure 5:
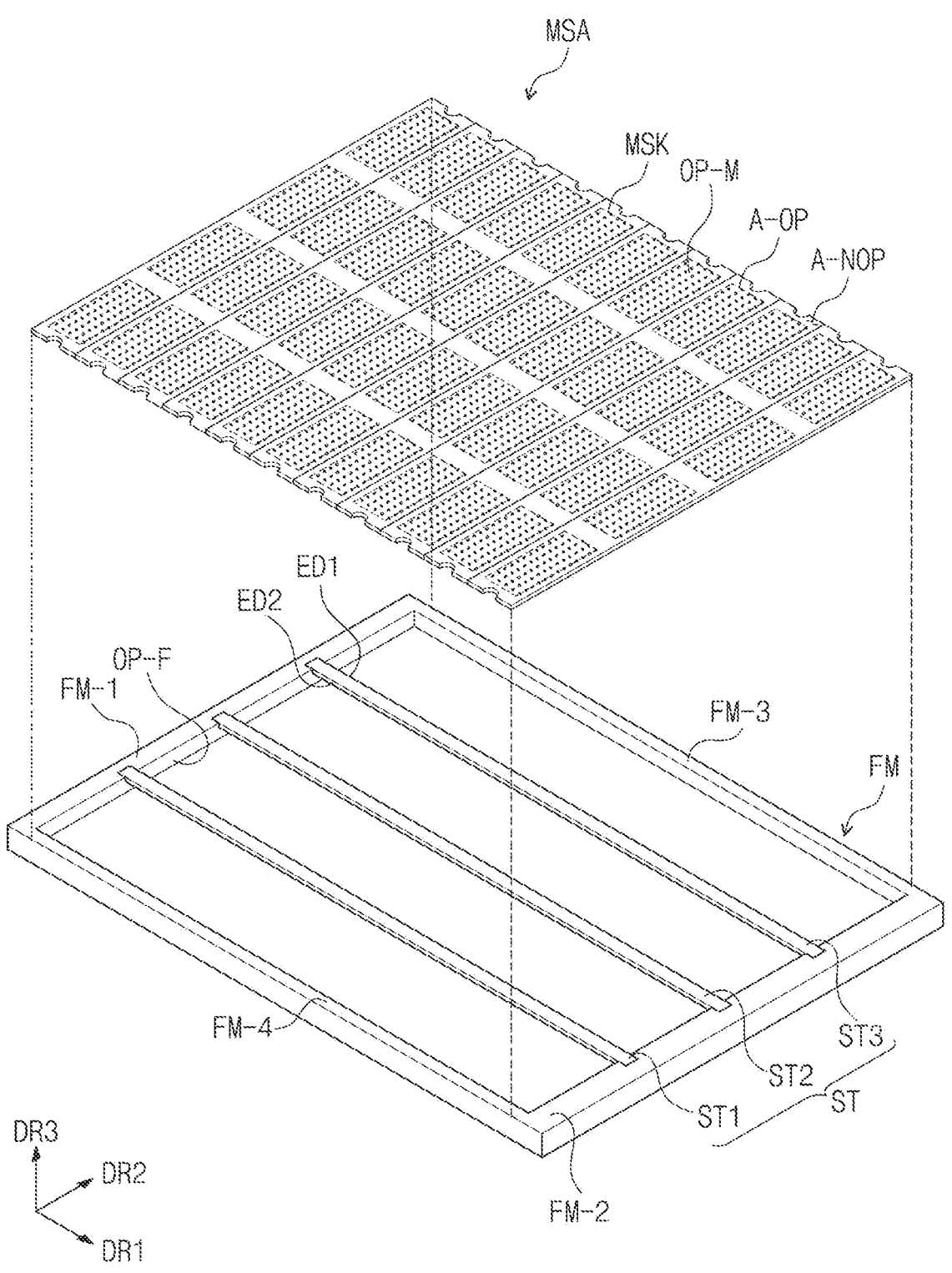
FIG. 5 is a perspective view of a mask assembly.

FIG. 4 is a cross-sectional view of a deposition apparatus DPA. FIG. 5 is a perspective view of a mask assembly MSA.

The deposition apparatus DPA may be used to perform a deposition process of the display panel DP, for example, such as the light emitting layer EL shown in FIG. 3B. The deposition apparatus DPA may include a deposition chamber CB, a fixing member CM, a deposition source DS, and a mask assembly MSA. In some embodiments, the deposition apparatus DPA may further include additional mechanisms to implement an inline system.

A deposition condition of the deposition chamber CB may be set to a vacuum state. The deposition chamber CB may include a bottom surface, a ceiling surface, and sidewalls. The bottom surface of the deposition chamber CB may be parallel to or substantially parallel to a plane defined by the first directional axis DR1 and the second directional axis DR2. The third directional axis DR3 may indicate a normal line direction of the bottom surface of the deposition chamber CB.

The fixing member CM may be disposed in the deposition chamber CB, above the deposition source DS, and may fix the mask assembly MSA. The fixing member CM may be installed at the ceiling surface of the deposition chamber CB. The fixing member CM may include a jig or a robot arm to hold the mask assembly MSA.

The fixing member CM may include a body portion BD, and magnetic substances MM coupled with (e.g., connected to or attached to) the body portion BD. The body portion BD may include a plate as a basic structure to fix the mask assembly MSA, but is not particularly limited thereto. The magnetic substances MM may be disposed inside or outside of the body portion BD. The magnetic substances MM may fix the mask assembly MSA using a magnetic force.

The deposition source DS may evaporate a deposition material (e.g., such as a light emitting material), and may spray the evaporated deposition material as a vapor. The sprayed deposition material may be deposited on a work substrate WS in a suitable pattern (e.g., a predetermined pattern) after passing through the mask assembly MSA.

The mask assembly MSA may be disposed inside the deposition chamber CB, above the deposition source DS, and may support the work substrate WS. The work substrate WS may include a glass substrate or a plastic substrate. The work substrate WS may include a polymer layer disposed on a base substrate.

The mask assembly MSA may include a frame FM, a plurality of sticks ST, and a plurality of masks MSK. In the present embodiment, the mask assembly MSA includes one type of sticks ST extending in the same direction as each other, but is not limited thereto. According to an embodiment, the mask assembly MSA may further include different kinds of sticks extending in different directions from one another.

The frame FM may be provided with a first opening OP_F defined therethrough. The frame FM may have a quadrangular shape in a plane (e.g., in a plan view). The frame FM may include a metal material. As an example, the frame FM may include nickel (Ni), nickel-cobalt alloy, or nickel-iron alloy. The frame FM may include four portions. The frame FM may include a first extension portion FM-1 and a second extension portion FM-2, which face each other in the first directional axis DR1. The frame FM may include a third extension portion FM-3 and a fourth extension portion FM-4, which face each other in the second directional axis DR2, and connect the first extension portion FM-1 and the second extension portion FM-2 to each other. From among the first to fourth extension portions FM-1 to FM-4, corresponding extension portions may be coupled with (e.g., connected to or attached to) each other by welding, or may be provided integrally with each other.

The sticks ST may include first, second, and third sticks ST1, ST2, and ST3. The first, second, and third sticks ST1, ST2, and ST3 may be coupled with (e.g., connected to or attached to) the frame FM, and may overlap with the first opening OP_F. The first, second, and third sticks ST1, ST2, and ST3 may be coupled with (e.g., connected to or attached to) coupling grooves defined in each of the first extension portion FM-1 and the second extension portion FM-2. While FIG. 5 shows three sticks ST1, ST2, and ST3 connected to the frame FM, the number of the sticks ST are not limited thereto or thereby, and the sticks ST may be provided integrally with the frame FM.

The masks MSK may be disposed on the frame FM and the sticks ST. The masks MSK may extend in the second directional axis DR2, and may be arranged along the first directional axis DR1. The masks MSK may include invar as their material having a thermal expansion coefficient smaller than that of the frame FM. The masks MSK may include, for example, nickel (Ni), nickel-cobalt alloy, or nickel-iron alloy.

Each of the masks MSK may be provided with a plurality of openings OP-M (hereinafter, referred to as mask openings) defined (e.g., penetrating) therethrough. Each of the masks MSK may include an opening area A-OP in which the mask openings OP-M are defined, and a non-opening area A-NOP defined adjacent to the opening area A-OP. In the present embodiment, the opening area A-OP may be provided in a plurality, and the opening areas A-OP may be defined along the second directional axis DR2. The mask openings OP-M may be arranged at a suitable rule (e.g., a predetermined rule), or may be arranged uniformly or substantially uniformly within the opening area A-OP. The light emitting layer EL may have a shape corresponding to a shape of the mask openings OP-M when viewed in a plane (e.g., in a plan view).

The masks MSK may be coupled with (e.g., connected to or attached to) the frame FM by a welding process. In the manufacturing process of the mask assembly MSA, the masks MSK may be welded to the frame FM, while each of the masks MSK is being tensioned in the second directional axis DR2. The mask assembly MSA may include a plurality of divided masks MSK. The sagging of the divided masks MSK may occur less compared to that of one large mask corresponding to frame FM.

In this case, a tensile force may be applied to each of the masks MSK in the second directional axis DR2. The masks MSK may be deformed due to stress caused by the tensile force. According to one or more embodiments of the present disclosure, as the shape and the arrangement of the mask openings OP-M defined in each of the masks MSK are designed in a balanced way, the tensile force may be prevented or substantially prevented from being generated locally or asymmetrically in a part of the masks MSK. Accordingly, the masks MSK may be prevented or substantially prevented from being deformed or damaged due to the stress, and the reliability of the mask assembly MSA may be improved. This will be described in more detail below.

Figure 6A:
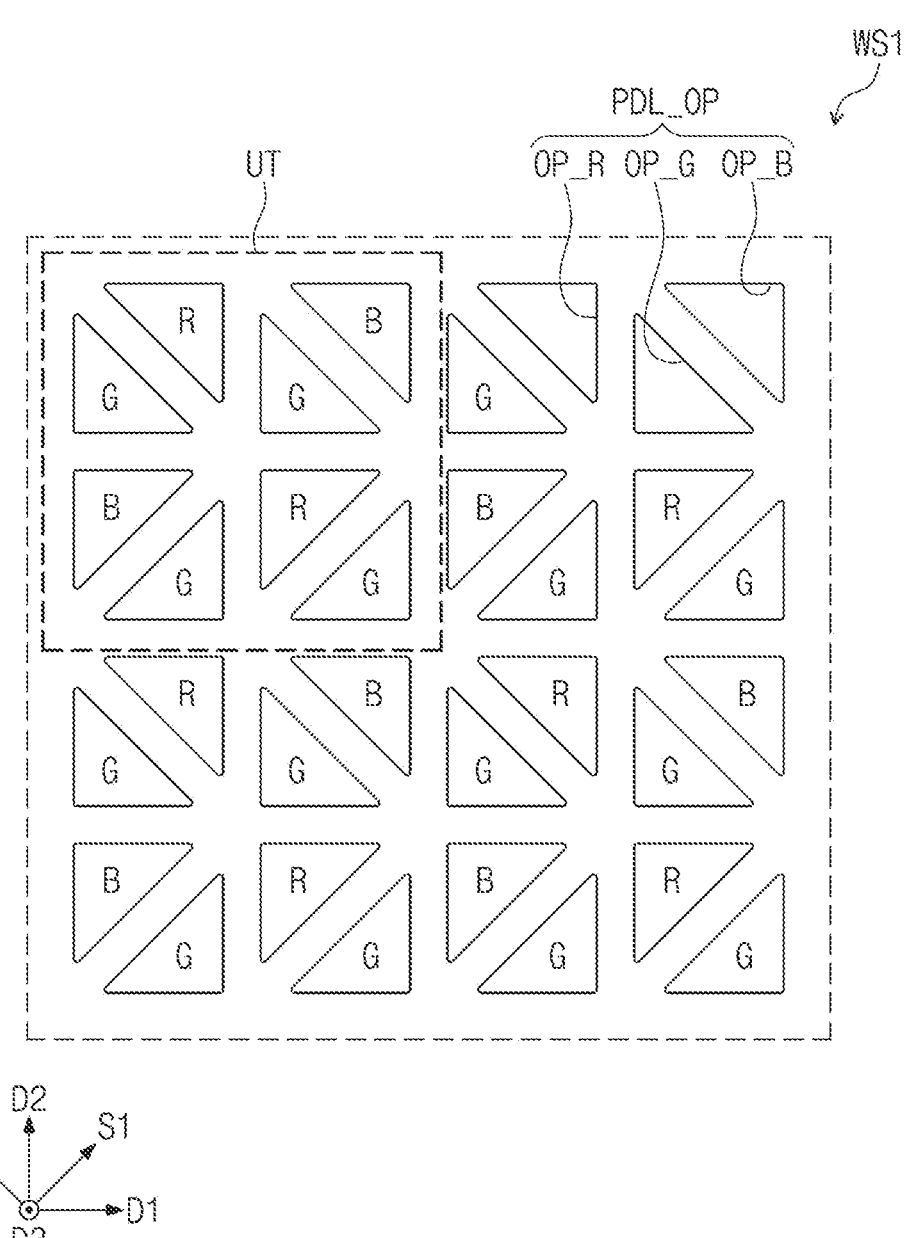
FIG. 6A is a plan view of an area of a first work substrate according to an embodiment of the present disclosure.
Figure 6B:
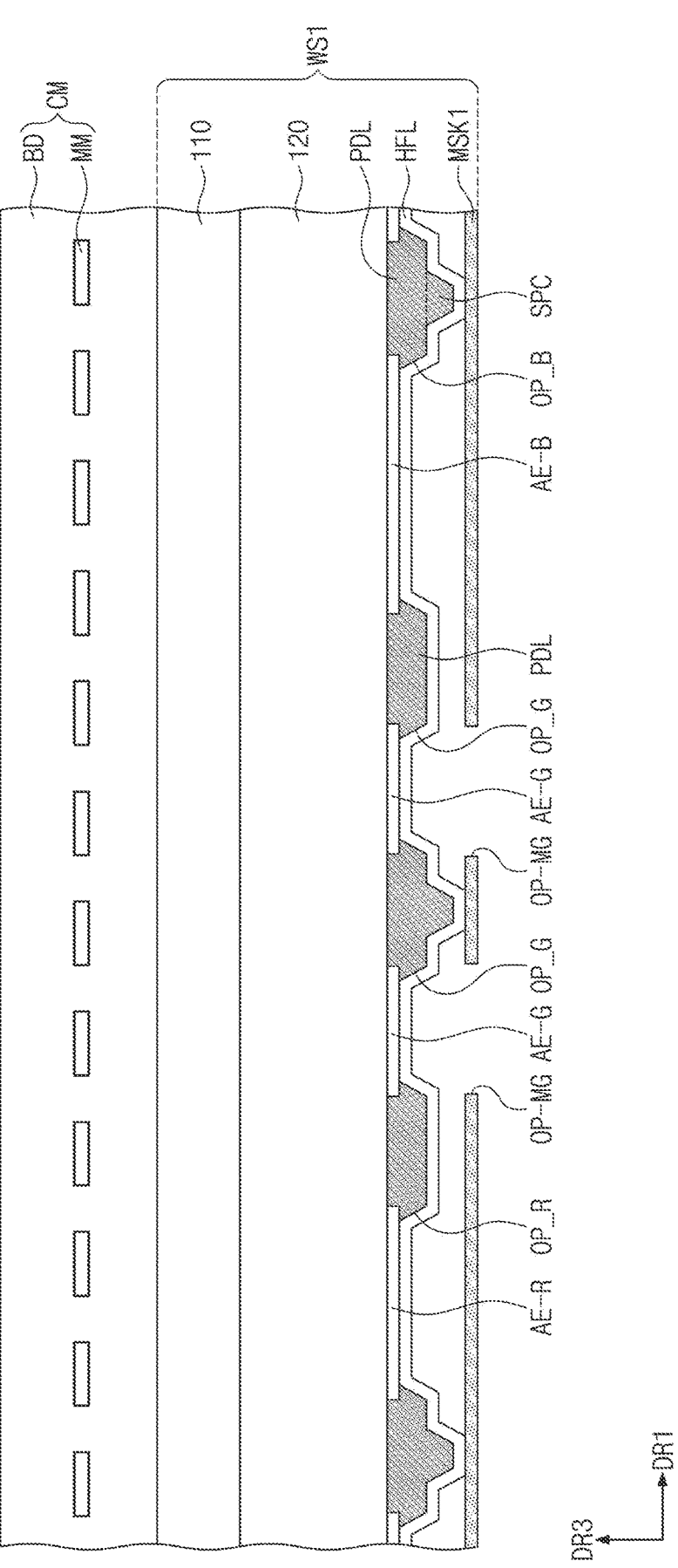
FIG. 6B is a cross-sectional view of an area in which a mask is coupled with a work substrate.
Figure 6C:
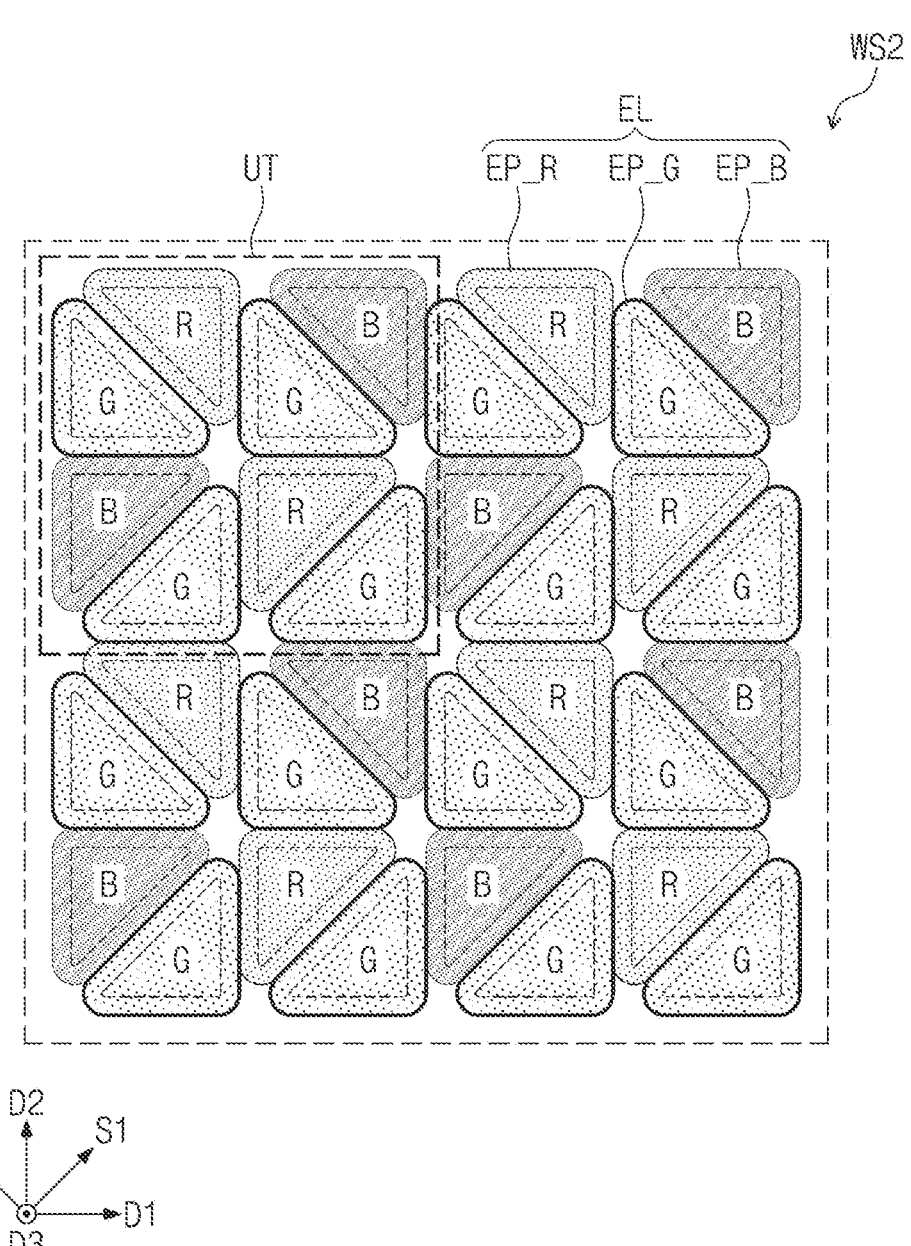
FIG. 6C is a plan view of an area of a second work substrate according to an embodiment of the present disclosure.
Figure 6D:
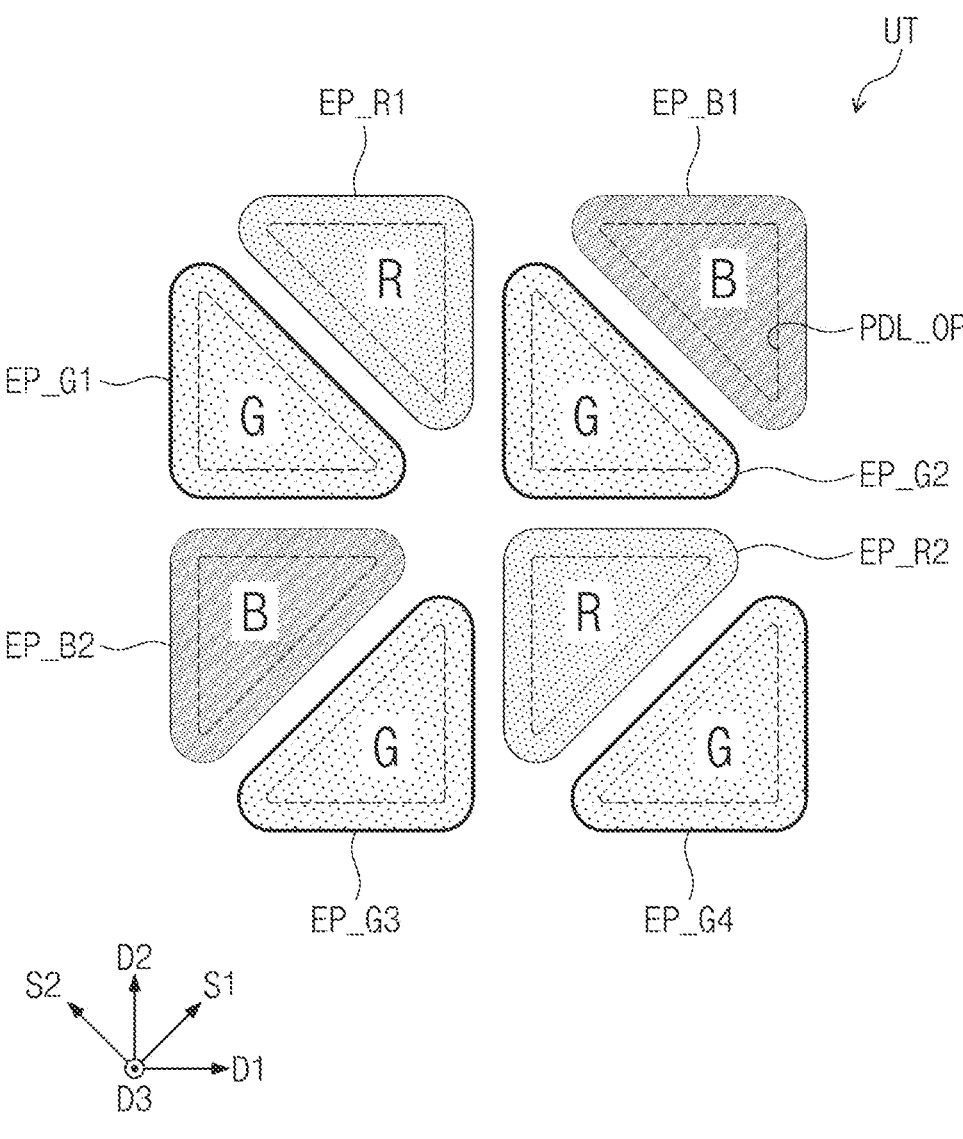
FIG. 6D is an enlarged plan view of a unit pixel group.

FIG. 6A is a plan view of an area of a first work substrate WS1 according to an embodiment of the present disclosure. FIG. 6B is a cross-sectional view of an area in which the mask is coupled with the first work substrate WS1. FIG. 6C is a plan view of an area of a second work substrate WS2 according to an embodiment of the present disclosure. FIG. 6D is an enlarged plan view of a unit pixel group UT.

The first work substrate WS1 may indicate a substrate at (e.g., in or on) which the pixel definition layer PDL and the first functional layer HFL of the display panel DP shown in FIG. 3B are formed, and for the convenience of illustration, the first functional layer HFL is not illustrated on the first work substrate WS1.

The second work substrate WS2 may indicate a substrate obtained by forming light emitting patterns EP_R, EP_G, and EP_B at (e.g., in or on) the first work substrate WS1. The second work substrate WS2 may correspond to a substrate that includes the components under (e.g., underneath) the light emitting layer EL and the light emitting layer EL of the display panel DP shown in FIG. 3B, and the light emitting patterns EP_R, EP_G, and EP_B may correspond to the light emitting layer EL.

Hereinafter, a first direction D1, a second direction D2, and a third direction D3 may be directions crossing each other. For example, the first to third directions D1, D2, and D3 are described as being perpendicular to or substantially perpendicular to each other. In the expressions "viewed in a plane" and "in a plane" as used hereinafter, the plane may be parallel to or substantially parallel to the first direction D1 and the second direction D2, and the expression "a thickness direction" as used hereinafter may correspond to the third direction D3. A first diagonal direction S1 may extend between the first direction D1 and the second direction D2. The first diagonal direction S1 may be inclined with respect to each of the first direction D1 and the second direction D2. A second diagonal direction S2 may extend between the second direction D2 and an opposing direction to the first direction D1. For example, the first direction D1, the first diagonal direction S1, the second direction D2, and the second diagonal direction S2 may be parallel to or substantially parallel to an upper surface of the work substrates WS1 and WS2 shown in FIGS. 6A to 6C, and a thickness of each of the work substrates WS1 and WS2 may be measured along the third direction D3. However, the first work substrate WS1 and the second work substrate WS2 shown in FIGS. 6A to 6C are merely illustrative of an example. Hereinafter, one or more embodiments of the present disclosure will be described in more detail with reference to FIGS. 6A to 6D.

FIG. 6A shows the light emitting openings PDL-OP, and FIG. 6C shows the light emitting layer EL formed in each of the light emitting openings PDL-OP. The light emitting openings PDL-OP may include a plurality of first openings OP_G, a plurality of second openings OP_R, and a plurality of third openings OP_B. Each of the first openings OP_G, the second openings OP_R, and the third openings OP_B may have a left-right asymmetric shape.

The light emitting layer EL may include a plurality of first color light emitting patterns EP_G, a plurality of second color light emitting patterns EP_R, and a plurality of third color light emitting patterns EP_B. The first color light emitting patterns EP_G may be disposed to correspond to the first openings OP_G, respectively, and may correspond to a light emitting portion for emitting a first color. The second color light emitting patterns EP_R may be disposed to correspond to the second openings OP_R, respectively, and may correspond to a light emitting portion for emitting a second color. The third color light emitting patterns EP_B may be disposed to correspond to the third openings OP_B, respectively, and may correspond to a light emitting portion for emitting a third color.

The first, second, and third colors may be different from each other. As an example, the first, second, and third colors may correspond to green, red, and blue colors, respectively, but the present disclosure is not limited thereto. According to an embodiment, the first, second, and third colors may be selected from a variety of suitable colors, as long as they are different from each other, and are not particularly limited.

For convenience of illustration, FIG. 6B further shows three first electrodes AE-G, AE-R, and AE-B corresponding to a first light emitting opening OP_G, a second light emitting opening OP_R, and a third light emitting opening OP_B. In addition, FIG. 6B further shows the fixing member CM described above, and a first mask MSK1. The first mask MSK1 may be a mask used to form the first color light emitting patterns EP_G. Accordingly, mask openings OP-MG defined through (e.g., penetrating) the first mask MSK1 may correspond to the first light emitting openings OP_G, respectively.

The first mask opening OP-MG of the first mask MSK1 may have a size greater than that of the first light emitting opening OP_G. In a state where the mask assembly MSA is disposed inside the deposition chamber CB, and the first mask MSK1 is aligned with the work substrate WS1, the first light emitting opening OP_G may be disposed inside (e.g., within) the first mask opening OP-MG of the first mask MSK1. Similarly, in a case where a second mask MSK2 (e.g., refer to FIG. 8A) described in more detail below is coupled with (e.g., connected to or attached to) the deposition chamber CB, the second light emitting opening OP_R may be disposed inside (e.g., within) a second mask opening OP-MR of the second mask MSK2. Similarly, in a case where a third mask MSK3 (e.g., refer to FIG. 9A) described in more detail below is coupled with (e.g., connected to or attached to) the deposition chamber CB, the third light emitting opening OP_B may be disposed inside (e.g., within) a third mask opening OP-MB of the third mask MSK3.

Referring to FIGS. 6A to 6C, the first color light emitting patterns EP_G may be formed in the first light emitting openings OP_G using the first mask MSK1. Then, the second color light emitting patterns EP_R and the third color light emitting patterns EP_B may be formed in the second light emitting openings OP_R and the third light emitting openings OP_B, respectively, using corresponding masks. This will be described in more detail below.

The mask MSK1 may be supported by a spacer SPC. Because the spacer SPC protrudes from an upper surface of the pixel definition layer PDL, the spacer SPC may prevent or substantially prevent the mask MSK1 from colliding with the work substrate WS1, and may prevent or substantially prevent the work substrate WS1 from being damaged due to the mask MSK1.

Referring to FIG. 6D, the unit pixel group UT may be defined to include eight color light emitting portions. The unit pixel group UT may be provided in a plurality, and the unit pixel groups UT may be regularly arranged in the display panel DP along the first direction D1 and the second direction D2. The unit pixel group UT according to one or more embodiments of the present disclosure may be arbitrarily illustrated (e.g., arbitrarily set), and the number of color light emitting portions constituting the unit pixel group UT may be variously modified as needed or desired.

The unit pixel group UT may include four first color light emitting patterns EP_G1, EP_G2, EP_G3, and EP_G4 (e.g., each having the first color), two second color light emitting patterns EP_R1 and EP_R2 (e.g., each having the second color), and two third color light emitting patterns EP_B1 and EP_B2 (e.g., each having the third color). The first, second, and third colors may be different from each other. In the present embodiment, two first color light emitting patterns EP_G1 and EP_G2, one second color light emitting pattern EP_R1, and one third color light emitting pattern EP_B1 may form a first row of the unit pixel group UT. Two first color light emitting patterns EP_G3 and EP_G4, one second color light emitting pattern EP_R2, and one third color light emitting pattern EP_B2 may form a second row of the unit pixel group UT.

The first color light emitting patterns EP_G1, EP_G2, EP_G3, and EP_G4 may include first color first light emitting patterns EP_G1 and EP_G2, and first color second light emitting patterns EP_G3 and EP_G4. The first color first light emitting patterns EP_G1 and EP_G2 may have the same or substantially the same shape as each other, and may be arranged along the first direction D1. As used in the present embodiment, the expression "a component has the same shape as another component" means that the components have the same or substantially the same shape as each other, but does not mean that the positions of the components are the same as each other. In other words, even though the components are disposed at different positions in the plane defined by the first direction D1 and the second direction D2, the components have the same or substantially the same shape as each other when the shape of the components are the same or substantially the same as each other after moving the components to overlap with each other.

Each of the first color first light emitting patterns EP_G1 and EP_G2 may have a triangular shape, with a base extending in the first direction D1, and a height extending in the second direction D2. Vertices of each of the first color first light emitting patterns EP_G1 and EP_G2 may have a rounded shape. In the present embodiment, each of the first color first light emitting patterns EP_G1 and EP_G2 may have a right or substantially a right triangular shape, and portions respectively corresponding to the vertices may have a suitable curvature (e.g., a predetermined curvature).

The first color second light emitting patterns EP_G3 and EP_G4 may be arranged in a row different from a row in which the first color first light emitting patterns EP_G1 and EP_G2 are arranged. The first color second light emitting patterns EP_G3 and EP_G4 may be disposed to be spaced apart from the first color first light emitting patterns EP_G1 and EP_G2, respectively, in the second direction D2. The first color second light emitting patterns EP_G3 and EP_G4 may have the same or substantially the same shape as each other, and may be disposed to be spaced apart from each other in the first direction D1.

Each of the first color second light emitting patterns EP_G3 and EP_G4 may have a triangular shape, with a base extending in the first direction D1, and a height extending in the second direction D2. Vertices of each of the first color second light emitting patterns EP_G3 and EP_G4 may have a rounded shape. In the present embodiment, each of the first color second light emitting patterns EP_G3 and EP_G4 may have a right or substantially a right triangular shape, and portions respectively corresponding to the vertices may have a suitable curvature (e.g., a predetermined curvature).

Each of the first color light emitting patterns EP_G1, EP_G2, EP_G3, and EP_G4 may have the triangular shape, with the base extending in the first direction D1, the height extending in the second direction D2, and a hypotenuse connecting the base and the height with each other. Vertices of each of the first color light emitting patterns EP_G1, EP_G2, EP_G3, and EP_G4 may have a rounded shape. In the present embodiment, the first color second light emitting patterns EP_G3 and EP_G4 may have a shape different from that of the first color first light emitting patterns EP_G1 and EP_G2. In the present embodiment, the expression "a component has a shape different from a shape of another component" means that the components have different shapes from each other, but does not mean that the components have the same shape while being disposed in different positions in the plane.

As an example, the first color first light emitting patterns EP_G1 and EP_G2 may have hypotenuses extending in a direction different from that of those of the first color second light emitting patterns EP_G3 and EP_G4. Each of the hypotenuses of the first color first light emitting patterns EP_G1 and EP_G2 may extend in the second diagonal direction S2, and each of the hypotenuses of the first color second light emitting patterns EP_G3 and EP_G4 may extend in the first diagonal direction S1.

In more detail, each of the first color second light emitting patterns EP_G3 and EP_G4 may have the same or substantially the same shape as the shape obtained when the shape of each of the first color first light emitting patterns EP_G1 and EP_G2 is flipped with respect to a symmetrical axis parallel to or substantially parallel to the second direction D2. In other words, the shapes obtained when the first color first light emitting patterns EP_G1 and EP_G2 are flipped with respect to the symmetrical axis parallel to or substantially parallel to the second direction D2 may be the same or substantially the same as the shapes of the first color second light emitting patterns EP_G3 and EP_G4, respectively. In more detail, the first color second light emitting patterns EP_G3 and EP_G4 may be the same or substantially the same as the first color first light emitting patterns EP_G1 and EP_G2 that are flipped with respect to the symmetrical axis crossing between the first color first light emitting patterns EP_G1 and EP_G2 and parallel to or substantially parallel to the second direction D2, and then moved to (e.g., shifted in) a direction opposite to the second direction D2.

In addition, because each of the first color light emitting patterns EP_G1, EP_G2, EP_G3, and EP_G4 has the right or substantially the right triangular shape, each of the first color second light emitting patterns EP_G3 and EP_G4 may have the same or substantially the same shape as the shape obtained by rotating each of the first color first light emitting patterns EP_G1 and EP_G2 by about 90 degrees in a counterclockwise direction. In more detail, the first color second light emitting patterns EP_G3 and EP_G4 may be the same or substantially the same as the first color first light emitting patterns EP_G1 and EP_G2 that are rotated by about 90 degrees in the counterclockwise direction, and then moved (e.g., shifted) on the plane defined by the first direction D1 and the second direction D2.

The second color light emitting patterns EP_R1 and EP_R2 may include a second color first light emitting pattern EP_R1 and a second color second light emitting pattern EP_R2, which are disposed in different rows from each other. The second color first light emitting pattern EP_R1 may be disposed in the first row, and may be disposed between the first color first light emitting patterns EP_G1 and EP_G2. The second color second light emitting pattern EP_R2 may be disposed in the second row, and may be disposed between the first color second light emitting patterns EP_G3 and EP_G4.

Each of the second color first light emitting pattern EP_R1 and the second color second light emitting pattern EP_R2 may have a triangular shape, and vertices of each of the second color first light emitting pattern EP_R1 and the second color second light emitting pattern EP_R2 may have a rounded shape. Each of the second color first light emitting pattern EP_R1 and the second color second light emitting pattern EP_R2 may have the right triangular shape, with a base extending in the first direction D1, a height extending in the second direction D2, and a hypotenuse connecting the base and the height to each other.

The second color first light emitting pattern EP_R1 and the second color second light emitting pattern EP_R2 may have different shapes from each other. As an example, the second color first light emitting pattern EP_R1 and the second color second light emitting pattern EP_R2 may include hypotenuses extending in different directions from each other. The hypotenuse of the second color first light emitting pattern EP_R1 may extend in the second diagonal direction S2, and the hypotenuse of the second color second light emitting pattern EP_R2 may extend in the first diagonal direction S1.

The second color first light emitting pattern EP_R1 may include sides facing the first color first light emitting patterns EP_G1 and EP_G2, respectively. The sides of the second color first light emitting pattern EP_R1, which face the first color first light emitting patterns EP_G1 and EP_G2, respectively, may form an acute angle. In the present embodiment, the hypotenuse of the second color first light emitting pattern EP_R1 may face the color light emitting pattern EP_G1 disposed at a left side of the first color first light emitting patterns EP_G1 and EP_G2, and another side of the sides of the second color first light emitting pattern EP_R1 may face the color light emitting pattern EP_G2 disposed at a right side of the first color first light emitting patterns EP_G1 and EP_G2.

The second color second light emitting pattern EP_R2 may include sides facing the first color second light emitting patterns EP_G3 and EP_G4, respectively. The sides of the second color second light emitting pattern EP_R2, which face the first color second light emitting patterns EP_G3 and EP_G4, respectively, may form an acute angle. In the present embodiment, the hypotenuse of the second color second light emitting pattern EP_R2 may face a right color light emitting pattern EP_G4 of the first color second light emitting patterns EP_G3 and EP_G4, and another side of the sides of the second color second light emitting pattern EP_R2 may face a left color light emitting pattern EP_G3 of the first color second light emitting patterns EP_G3 and EP_G4.

The second color first light emitting pattern EP_R1 may have the same or substantially the same shape as the shape obtained when the second color second light emitting pattern EP_R2 is flipped with respect to a symmetrical axis parallel to or substantially parallel to the second direction D2. In more detail, the second color second light emitting pattern EP_R2 may be the same or substantially the same as the second color first light emitting pattern EP_R1 flipped horizontally, and then moved (e.g., shifted) in the first direction D1. In addition, the second color first light emitting pattern EP_R1 may have the same or substantially the same shape as the shape obtained by rotating the second color second light emitting pattern EP_R2 in a clockwise direction by about 90 degrees. In more detail, the second color second light emitting pattern EP_R2 may have the same or substantially the same shape as the shape obtained by rotating the second color first light emitting pattern EP_R1 by about 90 degrees in a counterclockwise direction, and then moving (e.g., shifting) the second color first light emitting pattern EP_R1 on the plane defined by the first direction D1 and the second direction D2.

The third color light emitting patterns EP_B1 and EP_B2 may include a third color first light emitting pattern EP_B1 and a third color second light emitting pattern EP_B2, which are disposed in different rows from each other. The third color first light emitting pattern EP_B1 may be disposed in the first row, and may be disposed at a right side of the first color first light emitting patterns EP_G1 and EP_G2. The third color second light emitting pattern EP_B2 may be disposed in the second row, and may be disposed at a left side of the first color second light emitting patterns EP_G3 and EP_G4. The third color first light emitting pattern EP_B1 and the third color second light emitting pattern EP_B2 may be staggered in the second direction D2. Accordingly, the third color first light emitting pattern EP_B1 and the third color second light emitting pattern EP_B2 may not overlap with each other when viewed in the second direction D2.

Each of the third color first light emitting pattern EP_B1 and the third color second light emitting pattern EP_B2 may have a triangular shape, and vertices of each of the third color first light emitting pattern EP_B1 and the third color second light emitting pattern EP_B2 may have a rounded shape. Each of the third color first light emitting pattern EP_B1 and the third color second light emitting pattern EP_B2 may have a right or substantially a right triangular shape, with a base extending in the first direction D1, a height extending in the second direction D2, and a hypotenuse connecting the base and the height to each other.

The third color first light emitting pattern EP_B1 and the third color second light emitting pattern EP_B2 may have different shapes from each other. As an example, the third color first light emitting pattern EP_B1 and the third color second light emitting pattern EP_B2 may include hypotenuses extending in different directions from each other. The hypotenuse of the third color first light emitting pattern EP_B1 may extend in the second diagonal direction S2, and the hypotenuse of the third color second light emitting pattern EP_B2 may extend in the first diagonal direction S1.

The third color first light emitting pattern EP_B1 may have the same or substantially the same shape as the shape obtained when the third color second light emitting pattern EP_B2 is flipped with respect to the symmetrical axis parallel to or substantially parallel to the second direction D2. In more detail, the third color second light emitting pattern EP_B2 may be the same or substantially the same as the third color first light emitting pattern EP_B1 flipped horizontally, and then moved (e.g., shifted) on the plane defined by the first direction D1 and the second direction D2. In addition, the third color first light emitting pattern EP_B1 may have the same or substantially the same shape as the shape obtained by rotating the third color second light emitting pattern EP_B2 by about 90 degrees in a clockwise direction. In more detail, the third color second light emitting pattern EP_B2 may have the same or substantially the same shape as the shape obtained by rotating the third color first light emitting pattern EP_B1 by about 90 degrees in a counterclockwise direction, and then moving (e.g., shifting) the third color first light emitting pattern EP_B1 on the plane The second color light emitting patterns EP_R1 and EP_R2 may include hypotenuses facing the first color light emitting patterns EP_G1 and EP_G4, respectively, and may be linearly symmetrical with each other, and the third color light emitting patterns EP_B1 and EP_B2 may include hypotenuses facing the first color light emitting patterns EP_G2 and EP_G3, respectively, and may be linearly symmetrical with each other. In other words, the second color light emitting patterns EP_R1 and EP_R2 and the third color light emitting patterns EP_B1 and EP_B2 may include the hypotenuses facing the first color light emitting patterns EP_G1, EP_G2, EP_G3, and EP_G4.

As described above, when each of the color light emitting patterns has the right triangular shape, an interior angle of each of the color light emitting patterns, which is defined by the hypotenuses thereof, may be an acute angle. When assuming that two color light emitting patterns whose hypotenuses face each other are presented in one quadrangular area, the two color light emitting patterns may be presented in two triangular areas, respectively, divided by a diagonal line crossing the quadrangular area. The two color light emitting patterns facing each other in one quadrangular area may have a symmetric or substantially symmetric relationship with each other, and may have the same or substantially the same area (e.g., size) as each other.

As an example, the second color first light emitting pattern EP_R1 may include the hypotenuse facing one of the first color first light emitting pattern EP_G1 of the first color first light emitting patterns EP_G1 and EP_G2, and may be linearly symmetrical with the first color first light emitting pattern EP_G1 with respect to the direction in which the hypotenuse extends (e.g., with respect to the symmetrical axis parallel to or substantially parallel to the second diagonal direction S2). The second color second light emitting pattern EP_R2 may include the hypotenuse facing one of the first color second light emitting pattern EP_G4 of the first color second light emitting patterns EP_G3 and EP_G4, and may be linearly symmetrical with the first color second light emitting pattern EP_G4 with respect to the direction in which the hypotenuse extends (e.g., with respect to the symmetrical axis parallel to or substantially parallel to the first diagonal direction S1). The second color first light emitting pattern EP_R1 and the first color first light emitting pattern EP_G1 may be presented in two triangular areas, respectively, divided by the hypotenuse.

The third color first light emitting pattern EP_B1 may include the hypotenuse facing the other of the first color first light emitting pattern EP_G2 of the first color first light emitting patterns EP_G1 and EP_G2, and may be linearly symmetrical with the first color first light emitting pattern EP_G2 with respect to the direction in which the hypotenuse extends (e.g., with respect to the symmetrical axis parallel to or substantially parallel to) the second diagonal direction S2. The third color second light emitting pattern EP_B2 may include the hypotenuse facing the other of the first color second light emitting pattern EP_G3 of the first color second light emitting patterns EP_G3 and EP_G4, and may be linearly symmetrical with the first color second light emitting pattern EP_G3 with respect to the direction in which the hypotenuse extends (e.g., with respect to the symmetrical axis parallel to or substantially parallel to the first diagonal direction S1). The third color first light emitting pattern EP_B1 and the first color first light emitting pattern EP_G2 may be presented in two triangular areas, respectively, divided by the hypotenuse.

The work substrate WS1 may include the light emitting openings PDL-OP, each having the right triangular shape. In addition, the work substrate WS2 may include light emitting patterns EP having the triangular shape, and corresponding to the light emitting openings PDL-OP, respectively. The first color light emitting patterns EP_G1, EP_G2, EP_G3, and EP_G4 may be arranged in two rows, and the first color light emitting patterns EP_G1, EP_G2, EP_G3, and EP_G4 arranged in different rows from each other may have different shapes from each other, for example, such as the shapes obtained by rotating or the linearly symmetrical shapes. The second color light emitting patterns EP_R1 and EP_R2 may be arranged in two rows, and may have different shapes from each other, for example, such as the shapes obtained by rotating or the linearly symmetrical shapes. The third color light emitting patterns EP_B1 and EP_B2 may be arranged in two rows, and may have different shapes from each other, for example, such as the shapes obtained by rotating or the linearly symmetrical shapes.

According to one or more embodiments of the present disclosure, as the light emitting patterns forming one unit pixel group UT are provided in suitable shapes that are symmetrical or substantially symmetrical to each other, the openings of the mask MSK may be uniformly or substantially uniformly arranged over the mask MSK. Therefore, when the mask MSK is tensioned, the stress may be prevented or substantially prevented from being locally generated, and thus, the damage or the deformation of the mask MSK may be prevented or substantially prevented. This will be described in more detail below.

Figure 7A:
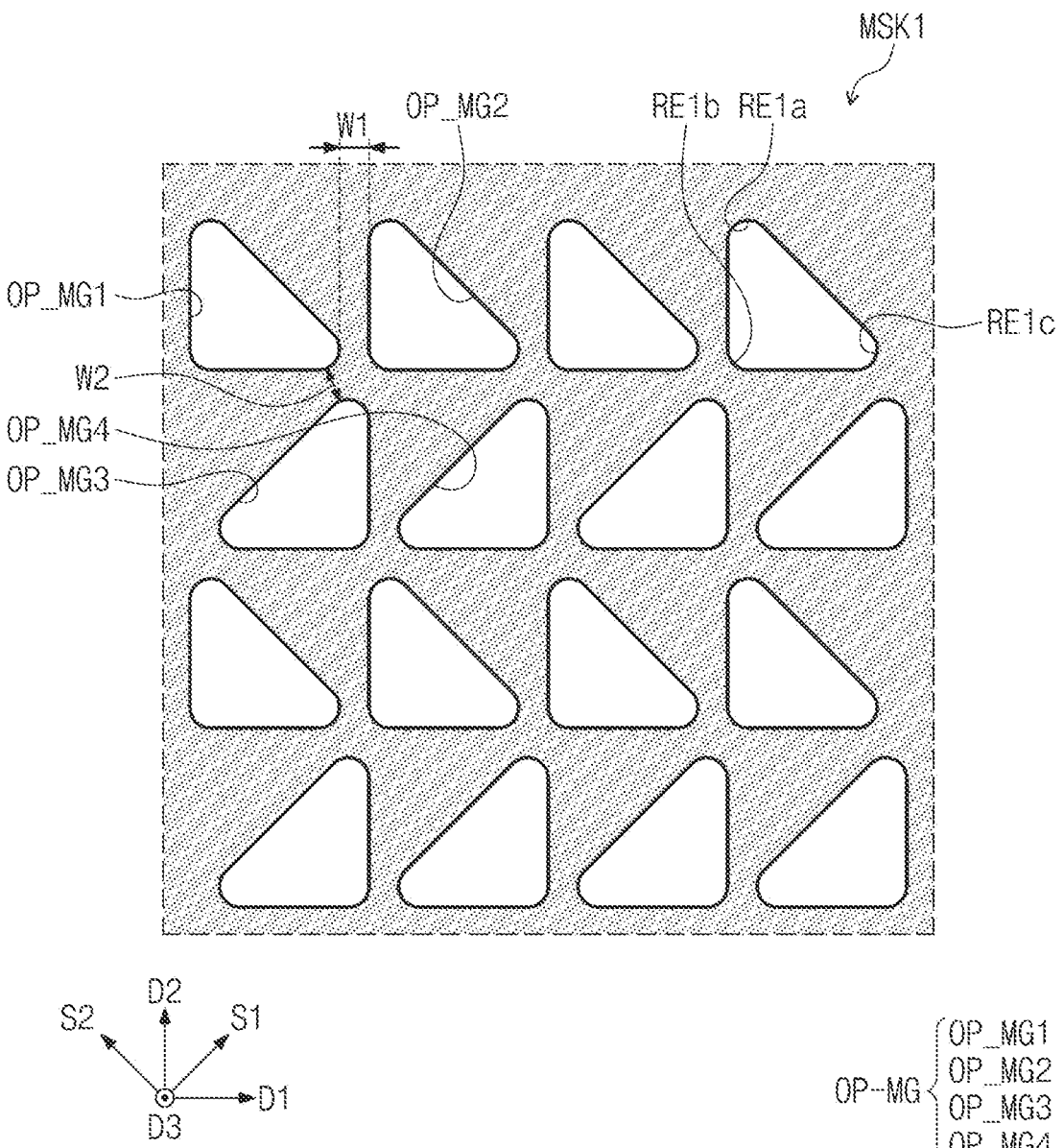
FIG. 7A is a plan view of a portion of a mask according to an embodiment of the present disclosure.
Figure 7B:
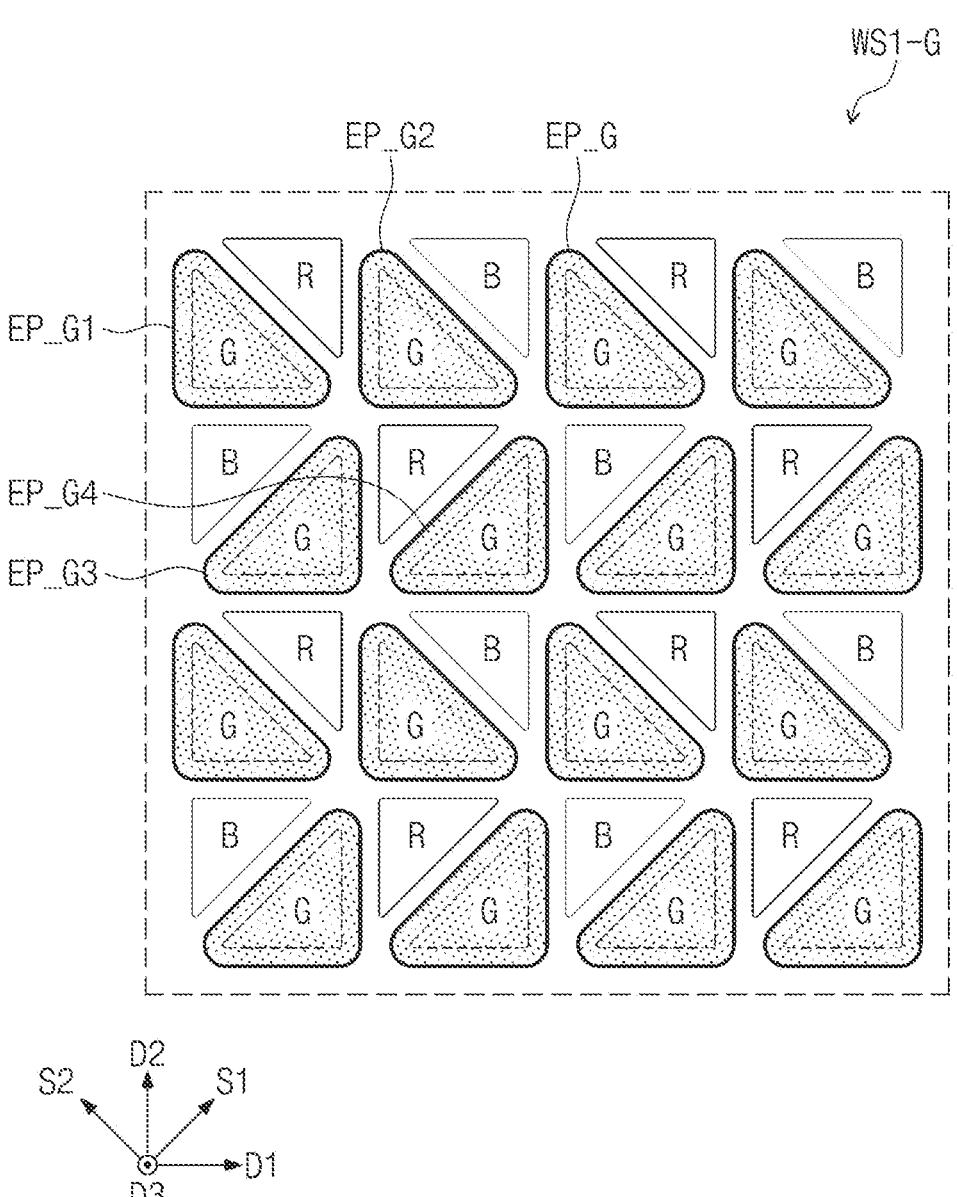
FIG. 7B is a plan view of an area of a work substrate.
Figure 8A:
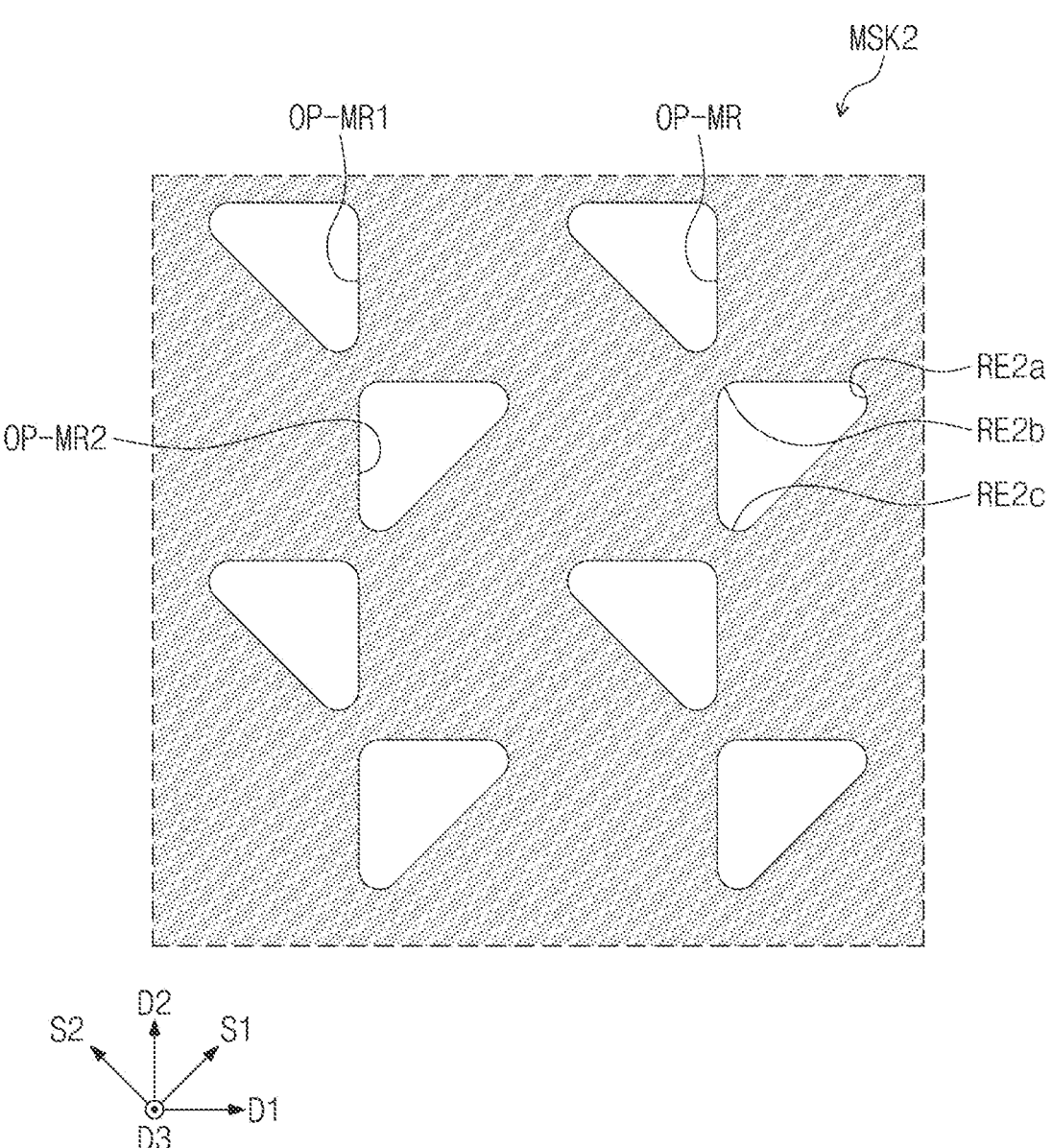
FIG. 8A is a plan view of a portion of a mask according to an embodiment of the present disclosure.
Figure 8B:
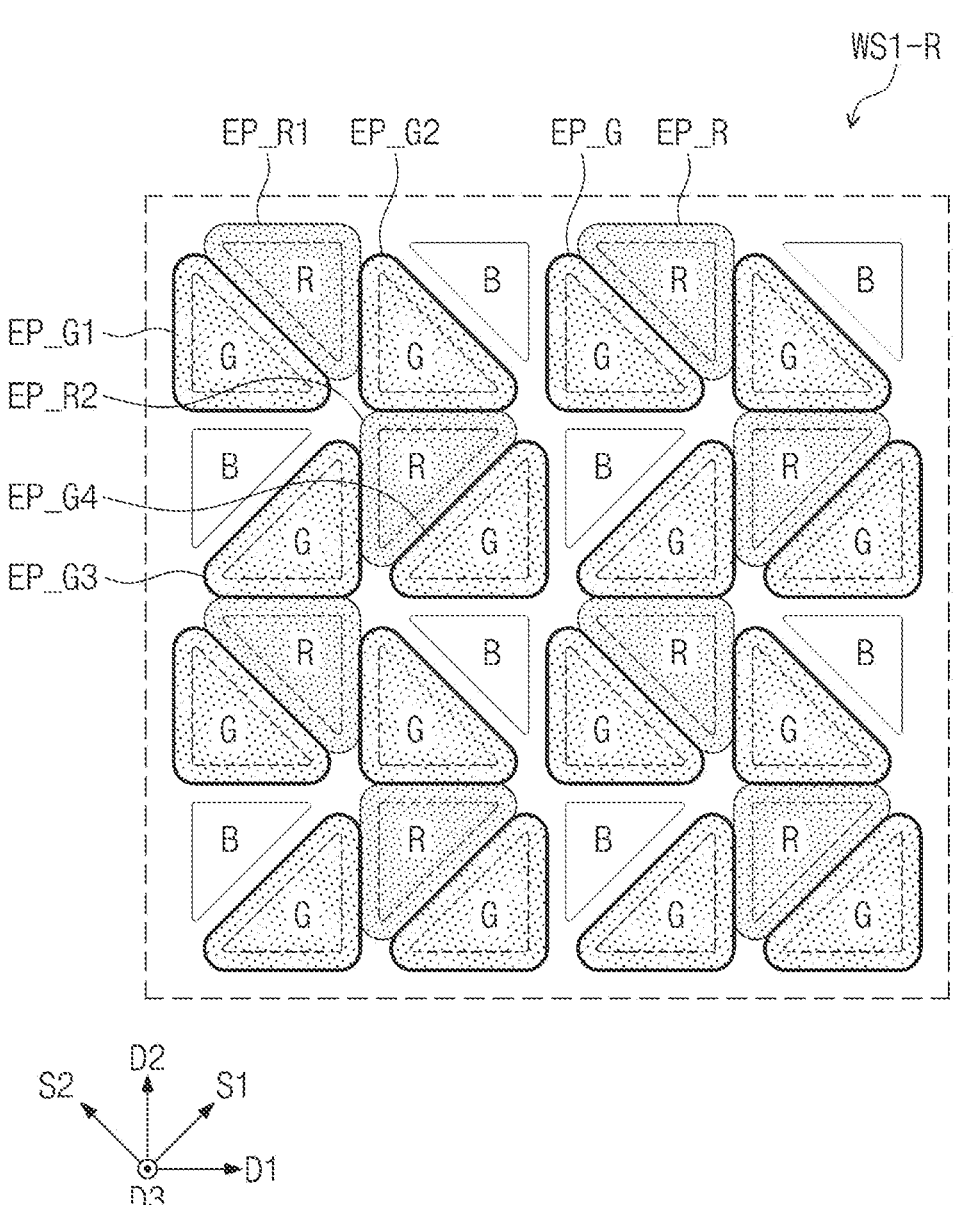
FIG. 8B is a plan view of an area of a work substrate.
Figure 9A:
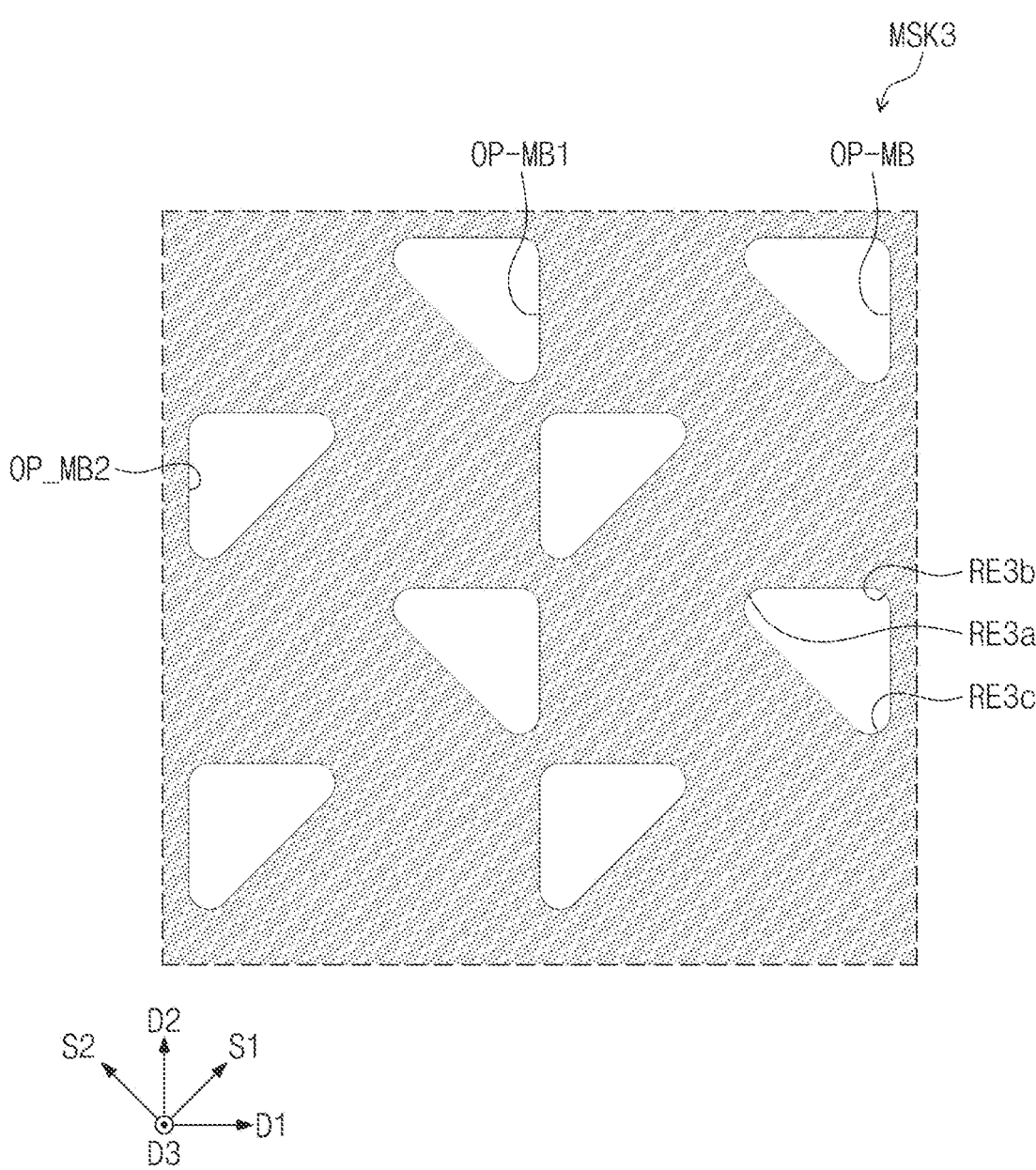
FIG. 9A is a plan view of a portion of a mask according to an embodiment of the present disclosure.
Figure 9B:
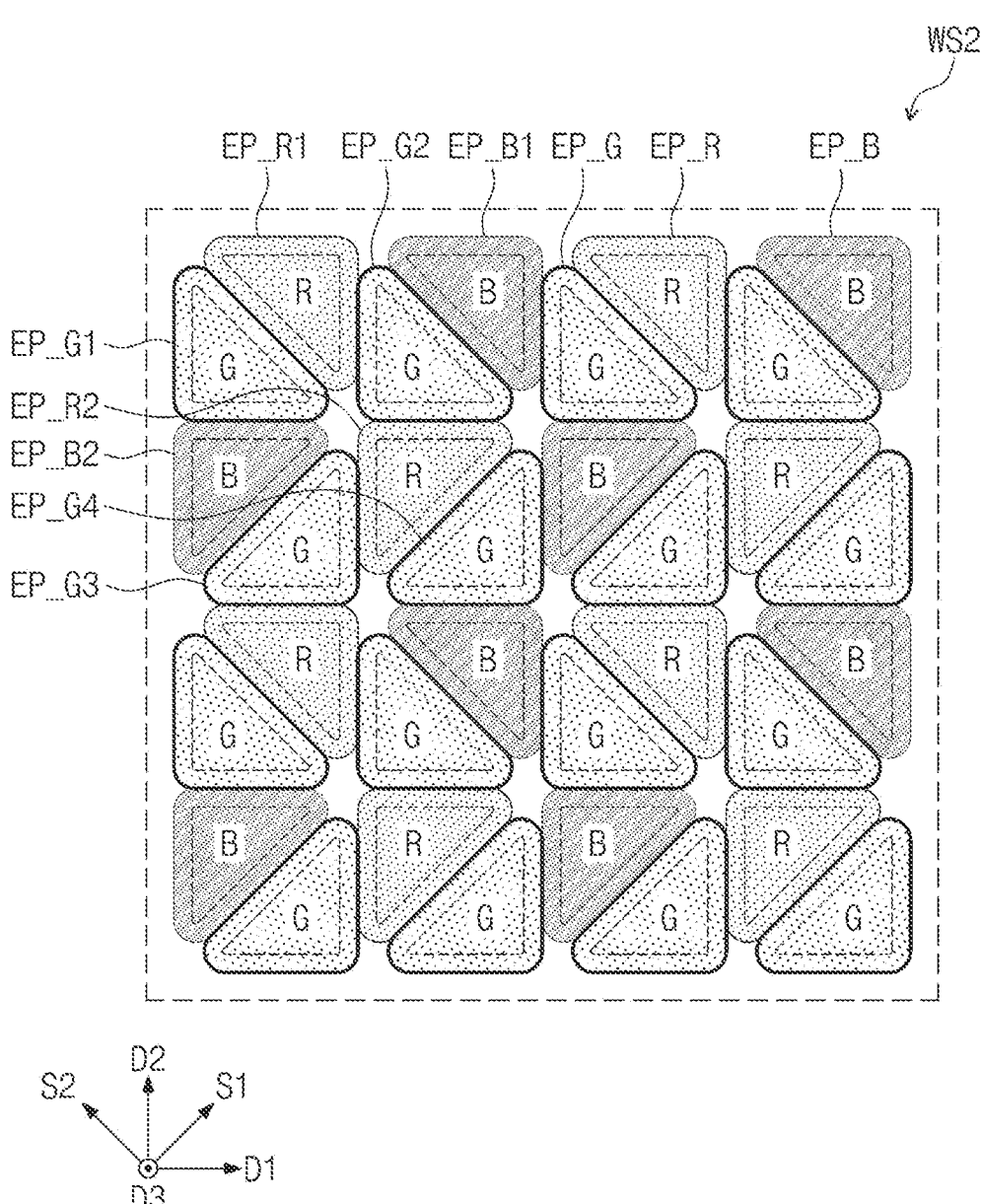
FIG. 9B is a plan view of an area of a work substrate.

FIG. 7A is a plan view of a portion of a mask MSK1 according to an embodiment of the present disclosure. FIG. 7B is a plan view of an area of a work substrate WS1-G. FIG. 8A is a plan view of a portion of a mask MSK2 according to an embodiment of the present disclosure. FIG. 8B is a plan view of an area of a work substrate WS1-R. FIG. 9A is a plan view of a portion of a mask MSK3 according to an embodiment of the present disclosure. FIG. 9B is a plan view of an area of a work substrate WS2.

FIGS. 7A, 8A, and 9A show the masks MSK1, MSK2, and MSK3, respectively, to form color light emitting patterns that are different from each other. FIGS. 7B, 8B, 9B show the substrates WS1-G, WS1-R, and WS2, respectively, including the light emitting patterns that are sequentially formed using the masks MSK1, MSK2, and MSK3. In addition, FIGS. 7A to 9B show an area corresponding to that of FIG. 6A. Hereinafter, one or more embodiments of the present disclosure will be described in more detail with reference to FIGS. 7A to 9B. In FIGS. 7A to 9B, the same reference numerals are used to denote the same or substantially the same elements as those described above with reference to FIGS. 1 to 6D, and thus, redundant description thereof may not be repeated.

Referring to FIGS. 7A and 7B, the first color light emitting patterns EP_G may be formed using the first mask MSK1. The first work substrate WS1 (e.g., refer to FIG. 6A) may be formed as a first display panel WS1-G using the first mask MSK1. The first display panel WS1-G may be obtained by forming the first color light emitting patterns EP_G at (e.g., in or on) the first work substrate WS1.

The first mask openings OP-MG may be defined through the first mask MSK1. The first color light emitting patterns EP_G may have a shape corresponding to the first mask openings OP-MG, and thus, the arrangement and the shape of the first mask openings OP-MG may correspond to the arrangement and the shape of the first color light emitting patterns EP_G.

In more detail, each of the first mask openings OP-MG may have a right triangular shape, with a base extending in the first direction D1, a height extending in the second direction D2, and a hypotenuse connecting the base and the height to each other. Vertices of each of the first mask openings OP-MG may have a rounded shape. Each of edges RE1$a$, RE1$b$, and RE1$c$ corresponding to the vertices of each of the first mask openings OP-MG may have a radius of curvature equal to or greater than about 8 μm. Accordingly, the light emitting pattern may be stably deposited in areas corresponding to the edges RE1$a$, RE1$b$, and RE1$c$.

In addition, a minimum width between the first mask openings OP-MG may be equal to or greater than about 15 μm. As an example, a minimum width W1 between one edge of the first mask opening OP-MG and another first mask opening OP-MG adjacent to the one edge in the first direction D1 may be equal to or greater than about 15 μm. In addition, a minimum width W2 between the one edge of the first mask opening OP-MG and another first mask opening OP-MG adjacent to the one edge in the second direction D2 may be equal to or greater than about 15 μm. The minimum width is not limited to a value measured in the first direction D1 or the second direction D2, as long as the minimum width indicates a minimum distance. According to one or more embodiments of the present disclosure, as the minimum width between the first mask openings OP-MG is secured, processability and reliability of the first mask MSK1 may be improved, and the first mask MSK1 may be stably manufactured.

Among the first mask openings OP-MG, four first mask openings OP_MG1, OP_MG2, OP_MG3, and OP_MG4 forming the unit pixel group UT may correspond to four first color light emitting patterns EP_G1, EP_G2, EP_G3, and EP_G4, respectively, to form a corresponding unit pixel group UT from among the first color light emitting patterns EP_G.

In more detail, the first mask openings OP_MG1, OP_MG2, OP_MG3, and OP_MG4 may include first-first mask openings OP_MG1 and OP_MG2 that are spaced apart from each other in the first direction D1, and having the same or substantially the same shape as each other, and first-second mask openings OP_MG3 and OP_MG4 that are spaced apart from each other in the first direction D1, and having the same or substantially the same shape as each other. The first-first mask openings OP_MG1 and OP_MG2 and the first-second mask openings OP_MG3 and OP_MG4 may be spaced apart from each other in the second direction D2, and may be arranged in different rows from one another.

The first-first mask openings OP_MG1 and OP_MG2 may have a shape different from that of the first-second mask openings OP_MG3 and OP_MG4. In more detail, each of the first-second mask openings OP_MG3 and OP_MG4 may have the same or substantially the same shape as a shape obtained when each of the first-first mask openings OP_MG1 and OP_MG2 is flipped with respect to a symmetrical axis parallel to or substantially parallel to the second direction D2. In other words, the shapes obtained when the first-first mask openings OP_MG1 and OP_MG2 are flipped with respect to the symmetrical axis parallel to or substantially parallel to the second direction D2 may be the same or substantially the same as the shapes of the first-second mask openings OP_MG3 and OP_MG4, respectively.

In addition, the shapes of the first-second mask openings OP_MG3 and OP_MG4 may correspond to the shapes obtained when the first-first mask openings OP_MG1 and OP_MG2 are rotated by about 90 degrees in a counterclockwise direction. In other words, the first-second mask openings OP_MG3 and OP_MG4 may have the same or substantially the same shapes as the shapes obtained when the first-first mask openings OP_MG1 and OP_MG2 are rotated by about 90 degrees in the counterclockwise direction, and then moved (e.g., shifted) on the plane.

Referring to FIGS. 8A and 8B, the second color light emitting patterns EP_R may be formed using the second mask MSK2. The first display panel WS1-G may be formed as a second display panel WS1-R using the second mask MSK2. The second display panel WS1-R may be obtained by forming the first color light emitting patterns EP_G and the second color light emitting patterns EP_R on the first work substrate WS1.

The second mask MSK2 may be provided with the second mask openings OP-MR defined (e.g., penetrating) therethrough. The second color light emitting patterns EP_R may have a shape corresponding to that of the second mask openings OP-MR, and thus, the arrangement and the shape of the second mask openings OP-MR may correspond to the arrangement and the shape of the second color light emitting patterns EP_R.

In more detail, each of the second mask openings OP-MR may have a right triangular shape, with a base extending in the first direction D1, a height extending in the second direction D2, and a hypotenuse connecting the base and the height to each other. Vertices of each of the second mask openings OP-MR may have a rounded shape. Each of edges RE2a, RE2b, and RE2c corresponding to the vertices of each of the second mask openings OP-MR may have a radius of curvature equal to or greater than about 8 μm. Accordingly, the light emitting pattern may be stably deposited in areas corresponding to the edges RE2a, RE2b, and RE2c.

A minimum width between the mask openings OP-MR may be equal to or greater than about 15 μm. In the present embodiment, as an example, a minimum width between two second mask openings OP-MR closest to each other may be equal to or greater than about 15 μm. The minimum width is not limited to a value measured in the first direction D1 or the second direction D2, as long as the minimum width indicates a minimum distance. According to an embodiment, as the minimum width between the second mask openings OP-MR is secured, processability and reliability of the second mask MSK2 may be improved, and the second mask MSK2 may be stably manufactured.

Among the second mask openings OP-MR, two second mask openings OP-MR1 and OP-MR2 forming the unit pixel group UT may correspond to two second color light emitting patterns EP_R1 and EP_R2, respectively, to form a corresponding unit pixel group UT from among the second color light emitting patterns EP_R.

In more detail, the second mask openings OP-MR1 and OP-MR2 may include a second-first mask opening OP-MR1 and a second-second mask opening OP-MR2, which are arranged in different rows from each other and have different shapes from each other. The second-first mask opening OP-MR1 and the second-second mask opening OP-MR2 may include hypotenuses extending in different directions from each other. The hypotenuse of the second-first mask opening OP-MR1 may extend in the second diagonal direction S2, and the hypotenuse of the second-second mask opening OP-MR2 may extend in the first diagonal direction S1.

The second-first mask opening OP-MR1 may have the same or substantially the same shape as a shape obtained when the second-second mask opening OP-MR2 is flipped with respect to a symmetrical axis parallel to or substantially parallel to the second direction D2. In addition, the second-second mask opening OP-MR2 may have the shape obtained when the second-first mask opening OP-MR1 is rotated by about 90 degrees in the counterclockwise direction.

Referring to FIGS. 9A and 9B, the third color light emitting patterns EP_B may be formed using the third mask MSK3. The second display panel WS1-R may be formed as the second work substrate WS2 using the third mask MSK3.

A plurality of third mask openings OP-MB may be defined (e.g., may penetrate) through the third mask MSK3. The third color light emitting patterns EP_B may have a shape corresponding to a shape of the third mask openings OP-MB, and thus, the arrangement and the shape of the third mask openings OP-MB may correspond to the arrangement and the shape of the third color light emitting patterns EP_B.

In more detail, each of the third mask openings OP-MB may have a right triangular shape, with a base extending in the first direction D1, a height extending in the second direction D2, and a hypotenuse connecting the base and the height to each other. Vertices of each of the third mask openings OP-MB may have a rounded shape. Each of edges RE3a, RE3b, and RE3c respectively corresponding to the vertices of each of the third mask openings OP-MB may have a radius of curvature equal to or greater than about 8 μm. Accordingly, the light emitting pattern may be stably deposited in areas corresponding to the edges RE3a, RE3b, and RE3c.

A minimum width between the third mask openings OP-MB may be equal to or greater than about 15 μm. As an example, the minimum width between two third mask openings OP-MB closest to each other may be equal to or greater than about 15 μm. The minimum width is not limited to a value measured in the first direction D1 or the second direction D2, as long as the minimum width indicates a minimum distance. According to the present embodiment, as the minimum width between the third mask openings OP-MB is secured, processability and reliability of the third mask MSK3 may be improved, and the third mask MSK3 may be stably manufactured.

Among the third mask openings OP-MB, two third mask openings OP-MB1 and OP-MB2 forming a unit pixel group UT may correspond to two third color light emitting patterns EP_B1 and EP_B2, respectively, to form a corresponding unit pixel group UT among the third color light emitting patterns EP_B.

In more detail, the third mask openings OP-MB1, OP-MB2 may include a third-first mask opening OP-MB1 and a third-second mask opening OP-MB2, which are disposed in different rows from each other and have different shapes from each other. The third-first mask opening OP-MB1 and the third-second mask opening OP-MB2 may include hypotenuses extending in different directions from each other. The hypotenuse of the third-first mask opening OP-MB1 may extend in the second diagonal direction S2, and the hypotenuse of the third-second mask opening OP-MB2 may extend in the first diagonal direction S1.

The third-first mask opening OP-MB1 may have the same or substantially the same shape as a shape obtained when the third-second mask opening OP-MB2 is flipped with respect to a symmetrical axis parallel to or substantially parallel to the second direction D2. In more detail, the third-second mask opening OP-MB2 may have the same or substantially the same shape as the shape obtained when the third-first mask opening OP-MB1 is flipped horizontally, and then moved (e.g., shifted) in a direction opposite to the second direction D2. In addition, the third-second mask opening OP-MB2 may have the same or substantially the same shape as the shape obtained when the third-first mask opening OP-MB1 is rotated by about 90 degrees in the counterclockwise direction.

While in the present embodiment, the second work substrate WS2 in which the color light emitting patterns are formed in the order of the first color light emitting pattern EP_G, the second color light emitting pattern EP_R, and the third color light emitting pattern EP_B is illustrated, the present disclosure is not limited thereto or thereby. According to an embodiment, the formation order of the first color light emitting pattern EP_G, the second color light emitting pattern EP_R, and the third color light emitting pattern EP_B may be variously modified, and is not particularly limited. In addition, according to the present embodiment, the first color light emitting pattern EP_G, the second color light emitting pattern EP_R, and the third color light emitting pattern EP_B are shown as not overlapping with each other, but the first, second, and third color light emitting patterns EP_G, EP_R, and EP_B may partially overlap with each other according to a margin of the mask openings OP-MG, OP-MR, and OP-MB. When the light emitting openings PDL-OP are designed to be spaced apart from each other, the first color light emitting pattern EP_G, the second color light emitting pattern EP_R, and the third color light emitting pattern EP_B may not overlap with each other, or may partially overlap with each other in areas between the light emitting openings PDL-OP.

According to one or more embodiments of the present disclosure, even though the mask openings have an asymmetric shape in the direction in which the tensile force is applied, the tensile force applied to the mask may be uniformly or substantially uniformly distributed over the entire mask by designing the arrangement of the mask openings to be symmetrical or substantially symmetrical with each other. Accordingly, as the tensile force generated in the mask is uniformly or substantially uniformly distributed over the entire mask, a local stress caused by the tensile force may be reduced, and deformation of and damage to the mask may be reduced. As a result, the reliability of the mask and the manufacturing process of the display panel using the mask may be improved.

Figure 10A:
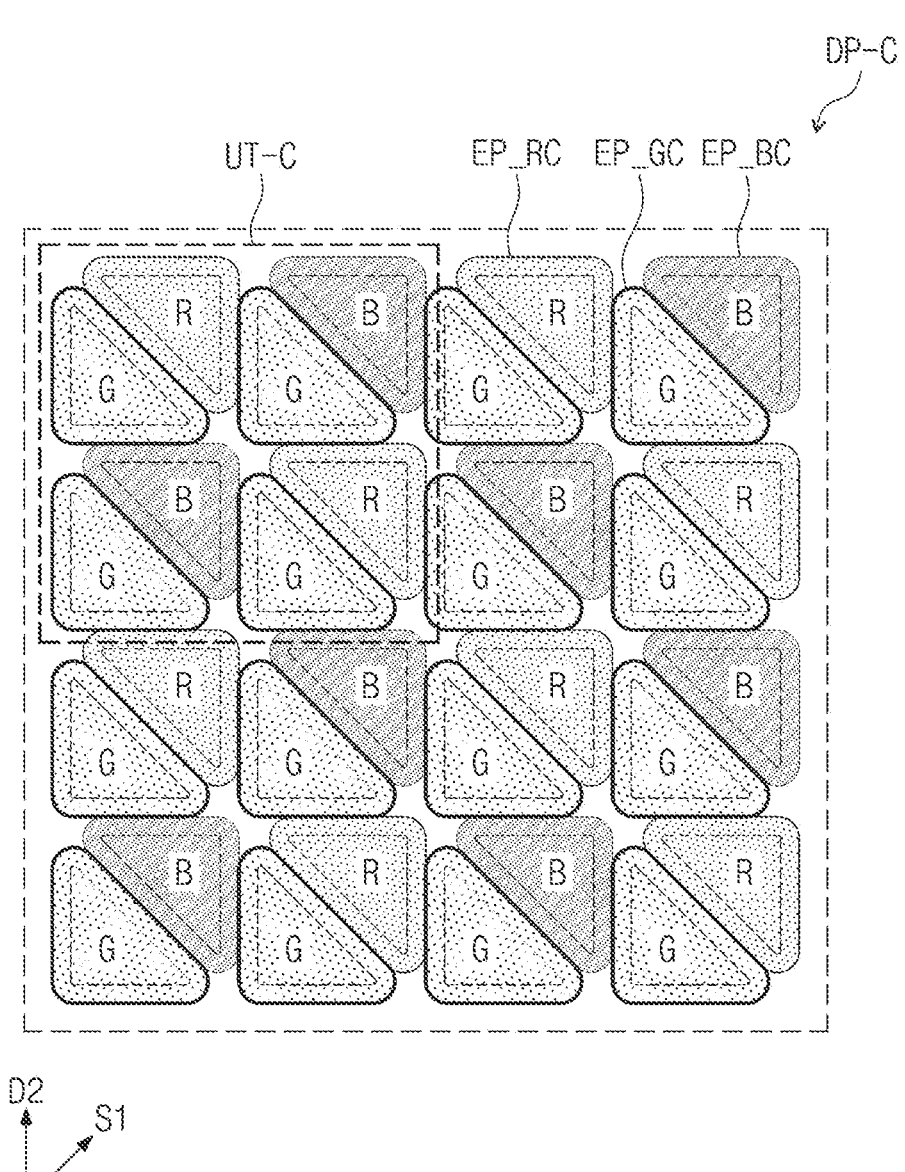
FIG. 10A is a plan view of an area of a display panel according to a comparative example.
Figure 10B:
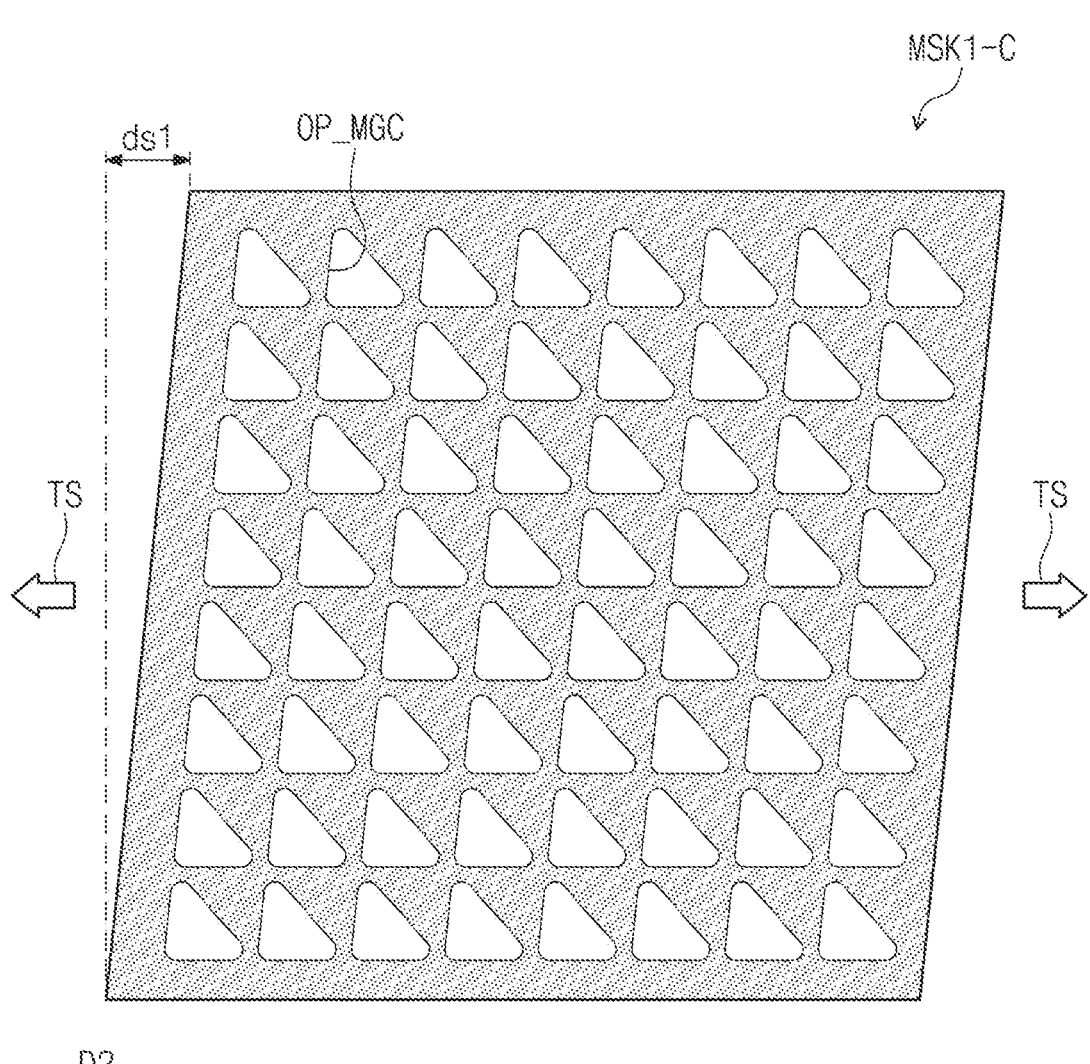
FIGS. 10B-10C are plan views of masks according to comparative examples.
Figure 10B:
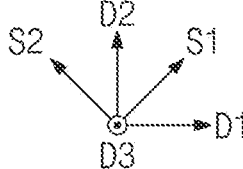
Figure 10C:
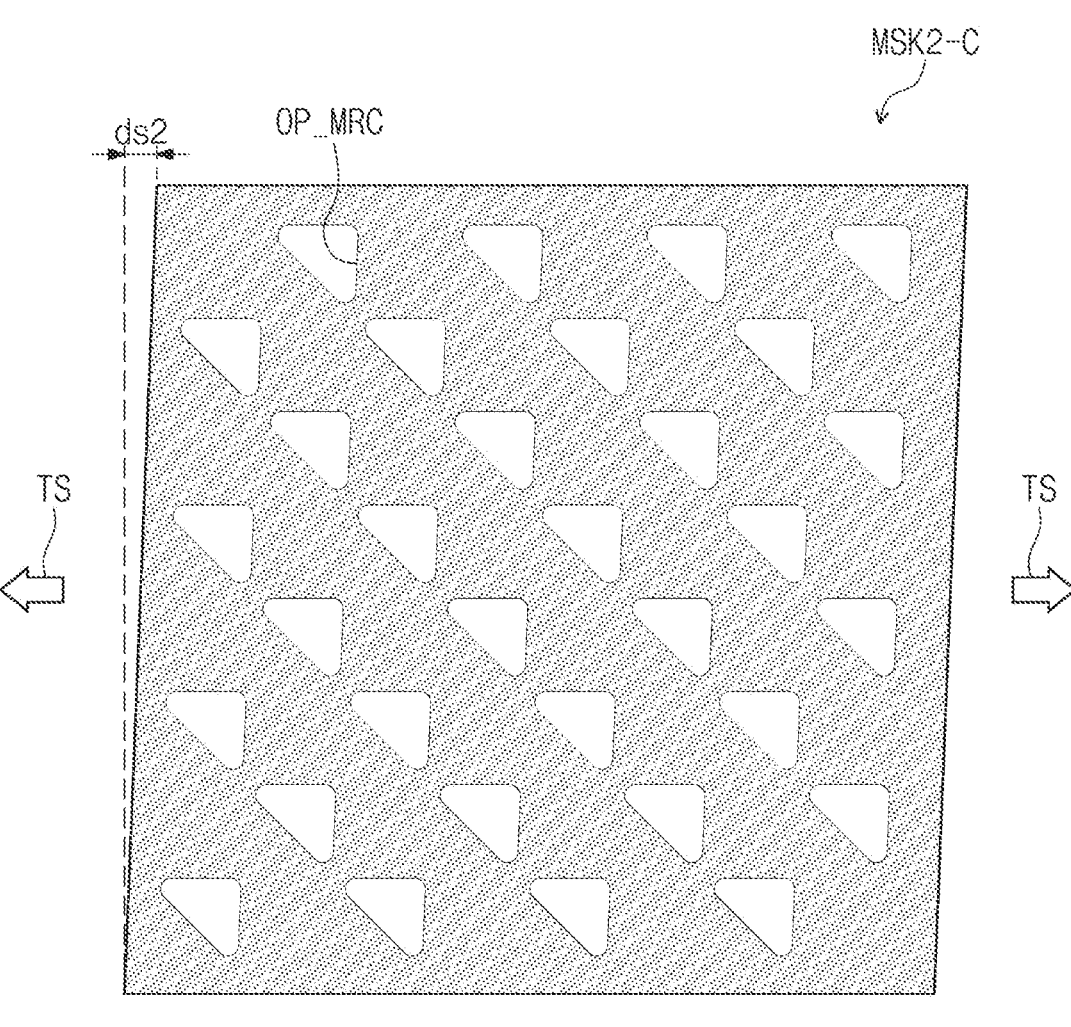
Figure 10C:
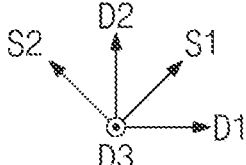
Figure 11A:
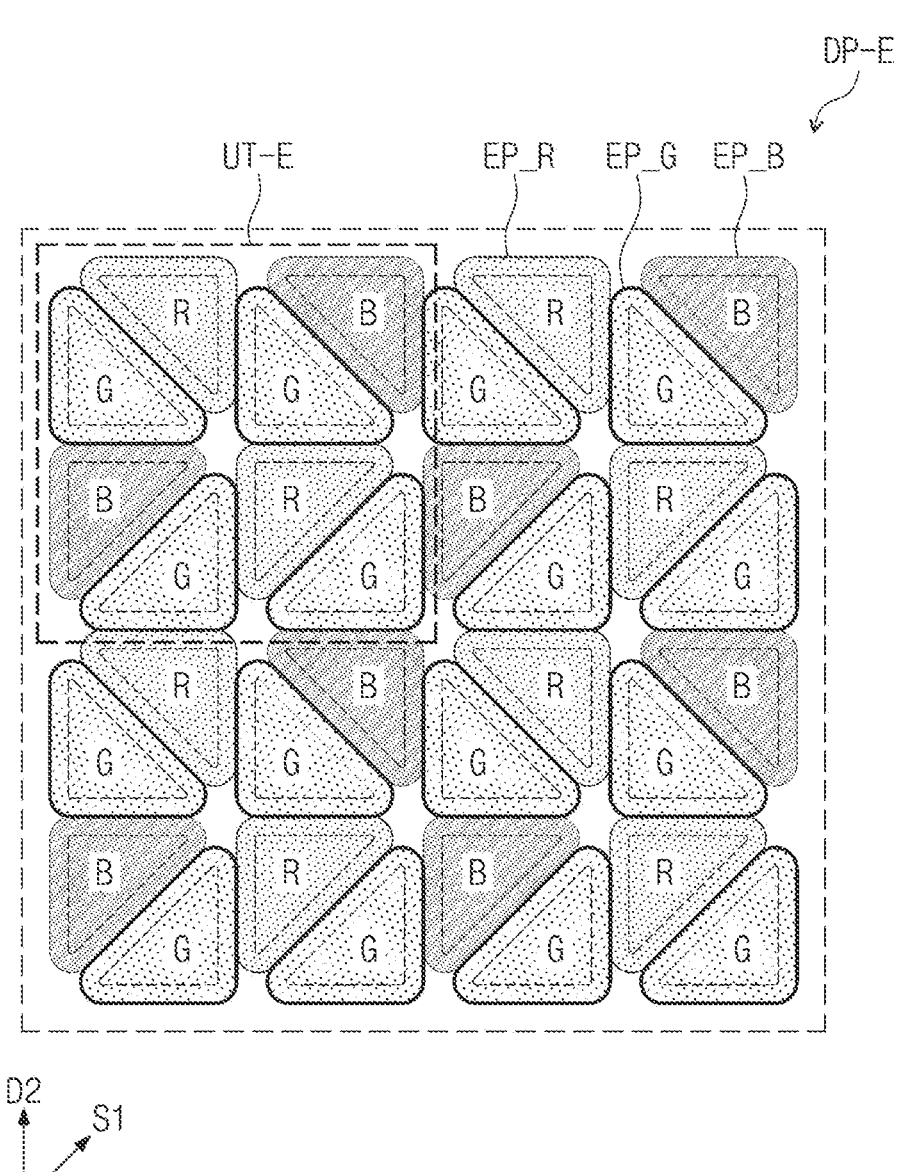
FIG. 11A is a plan view of an area of a display panel according to an embodiment of the present disclosure.
Figure 11B:
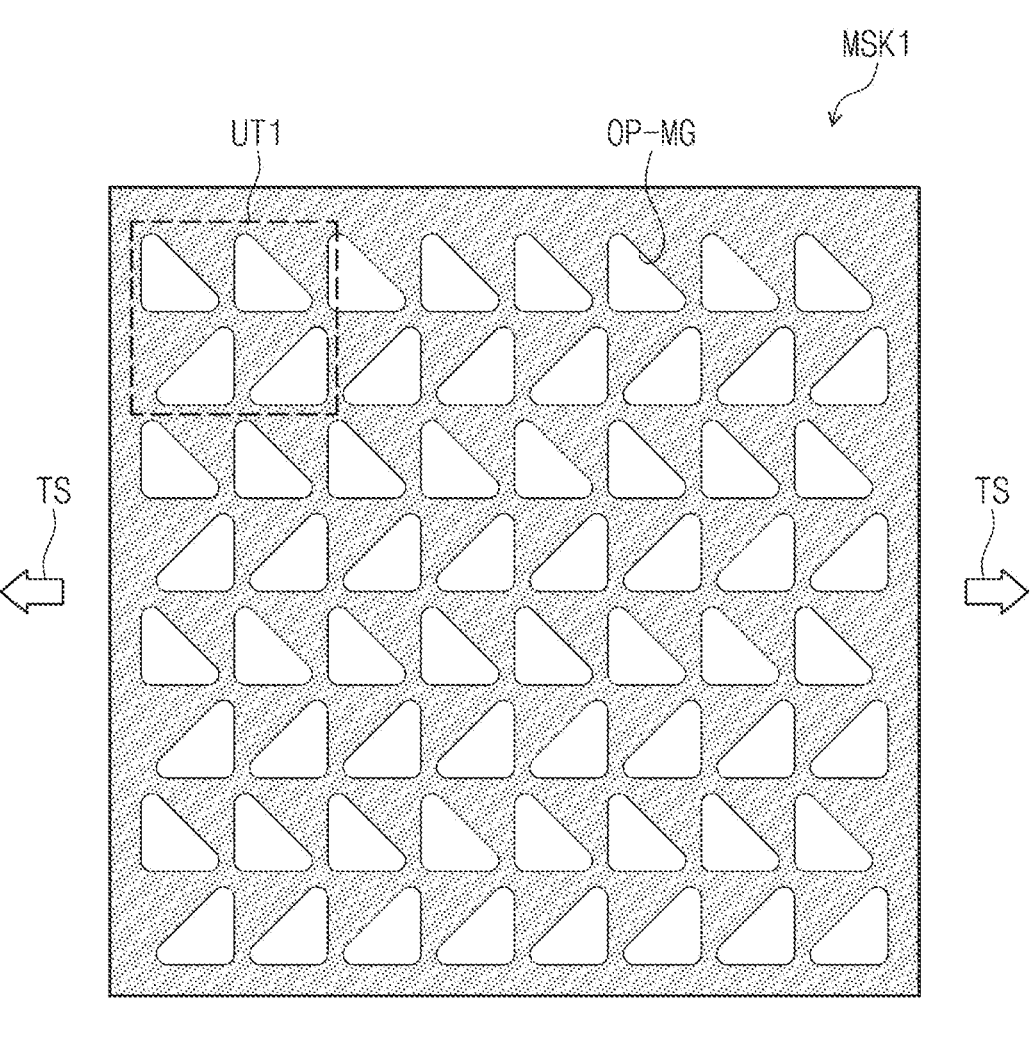
FIGS. 11B-11C are plan views of masks according to one or more embodiments of the present disclosure.
Figure 11B:
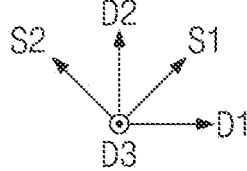
Figure 11C:
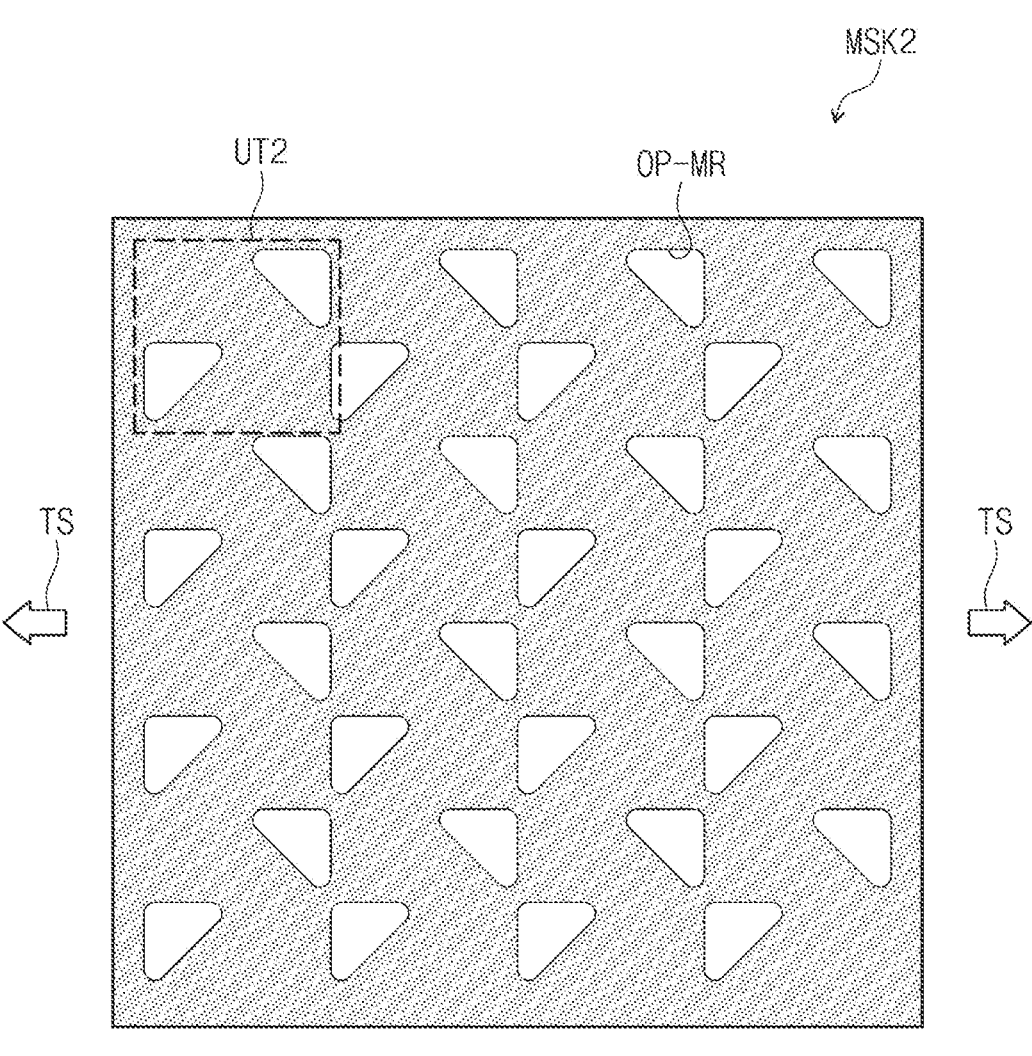
Figure 11C:
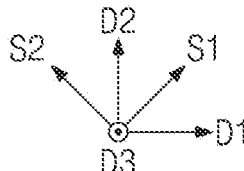

FIG. 10A is a plan view of an area of a display panel DP-C according to a comparative example. FIGS. 10B and 10C are plan views of masks MSK1-C and MSK2-C according to comparative examples. FIG. 11A is a plan view of an area of a display panel DP-E according to an embodiment of the present disclosure. FIGS. 11B and 11C are plan views of masks MSK1 and MSK2 according to one or more embodiments of the present disclosure.

FIGS. 10A and 11A show the display panel DP-C of the comparative example and the display panel DP-E according to an embodiment of the present disclosure, respectively, in an area corresponding to that of FIG. 6C. FIGS. 10B, 10C, 11B, and 11C show the masks MSK1-C, MSK2-C, MSK1, and MSK2, respectively, to which the tensile force is applied. Hereinafter, one or more embodiments of the present disclosure will be described in more detail with reference to FIGS. 10A to 11C. In FIGS. 10A to 11C, the same reference numerals are used to denote the same or substantially the same elements as those described above with reference to FIGS. 1A to 9B, and thus, redundant description thereof may not be repeated.

Referring to FIGS. 10A to 10C, among eight light emitting patterns forming a unit pixel group UT-C of the display panel DP-C of the comparative example, the light emitting patterns having the same color as each other may have the same shape as each other. Four first color light emitting patterns EP_GC may have the same shape as each other, and two second color light emitting patterns EP_RC may have the same shape as each other. Similarly, two third color light emitting patterns EP_BC may have the same shape as each other.

As shown in FIG. 10B, first mask openings OP_MGC defined through the first mask MSK1-C to form the first color light emitting patterns EP_GC may have the same shape as each other. Each of the first mask openings OP_MGC may have a triangular shape, with a base extending in the first direction D1, a height extending in the second direction D2, and a hypotenuse extending in the second diagonal direction S2. Vertices of each of the first mask openings OP_MGC may have a rounded shape.

Because the shape of the first mask openings OP_MGC is not linearly symmetrical with respect to a symmetrical axis substantially parallel to the second direction passing through a center of each of the first mask openings OP_MGC, when a tensile force is applied to the first mask MSK1-C in a direction parallel to the first direction D1, the stress applied to each of the first mask openings OP_MGC may not be uniform. Accordingly, the non-uniform stress may be locally generated in the first mask MSK1-C, and a deformation amount (e.g., a predetermined deformation amount) ds1 may be generated in the first mask MSK1-C. The deformation amount ds1 may correspond to a distortion degree of the first mask MSK1-C in the first direction D1.

Similarly, referring to FIG. 10C, second mask openings OP_MRC defined through the second mask MSK2-C to form the second color light emitting patterns EP_RC may have the same shape as each other. Each of the second mask openings OP_MRC may have a triangular shape, with a base extending in the first direction D1, a height extending in the second direction D2, and a hypotenuse extending in the second diagonal direction S2. Vertices of each of the second mask openings OP_MRC may have a rounded shape.

Because the shape of the second mask openings OP_MRC is not linearly symmetrical with respect to a symmetrical axis substantially parallel to the second direction passing through a center of each of the second mask openings OP_MRC, when a tensile force is applied to the second mask MSK2-C in a direction parallel to the first direction D1, the stress applied to each of the second mask openings OP_MRC may not be uniform. Accordingly, the non-uniform stress may be locally generated in the second mask MSK2-C, and a deformation amount (e.g., a predetermined deformation amount) ds2 may be generated in the second mask MSK2-C. The deformation amount ds2 may correspond to a distortion degree of the second mask MSK2-C in the first direction D1.

The deformation amount ds2 of the second mask MSK2-C may be relatively smaller than the deformation amount ds1 of the first mask MSK1-C. This is because the number of the second mask openings OP_MRC defined in the second mask MSK2-C is smaller than the number of the first mask openings OP_MGC defined in the first mask MSK1-C based on the same area (e.g., the same sized area). In other words, the tensile force may be non-uniformly applied to the first and second masks MSK1-C and MSK2-C due to the asymmetric shape and arrangement of the first and second mask openings OP_MGC and OP_MRC, and thus, the first and second masks MSK1-C and MSK2-C may be deformed.

Unlike in the comparative example, as shown in FIGS. 11A to 11C, each of light emitting patterns EP_R, EP_G, and EP_B forming a unit pixel group UT-E may be symmetrical or substantially symmetrical with one another in the display panel DP-E, and thus, the deformation caused by the tensile force applied to the masks MSK1 and MSK2 may be reduced. Referring to FIG. 11B, two first mask openings from among four first mask openings OP-MG forming a unit pixel group UT1 may have a shape different from a shape of the other two first mask openings from among the four first mask openings OP-MG.

In more detail, mask openings forming one row and mask openings forming another row may be symmetrical or substantially symmetrical with each other. Accordingly, even though the tensile force in one row is biased in one direction, the tensile force in a next row may be biased in a direction opposite to the one direction of the previous row, and thus, the tensile forces between the two rows may be offset. Accordingly, the tensile force applied to the entire first mask MSK1 may be evenly or substantially evenly distributed, so that the deformation of the first mask MSK1, which may be caused by stress, may be reduced.

Similarly, referring to FIG. 11C, two second mask openings OP-MR forming a unit pixel group UT2 may have different shapes from each other. The two mask openings OP-MR may form different rows from each other. Accordingly, even though the tensile force in one row is biased in one direction, the tensile force in a next row may be biased in a direction opposite to the one direction of the previous row, and thus, the tensile forces between the two rows may be offset. Therefore, the tensile force applied to the entire second mask MSK2 may be evenly or substantially evenly distributed, so that the deformation of the second mask MSK2, which may be caused by stress, may be reduced.

According to one or more embodiments of the present disclosure, even though the mask openings have a top/bottom or left/right asymmetric shape, the tensile force applied to the mask may be uniformly or substantially uniformly distributed over the entire surface of the mask by arranging the mask openings to be symmetrical. Accordingly, a local stress caused by the tensile force may be reduced, and the deformation of and damage to the mask may be reduced. As a result, the reliability of the mask and the display panel manufacturing process using the mask may be improved.

Figure 12A:
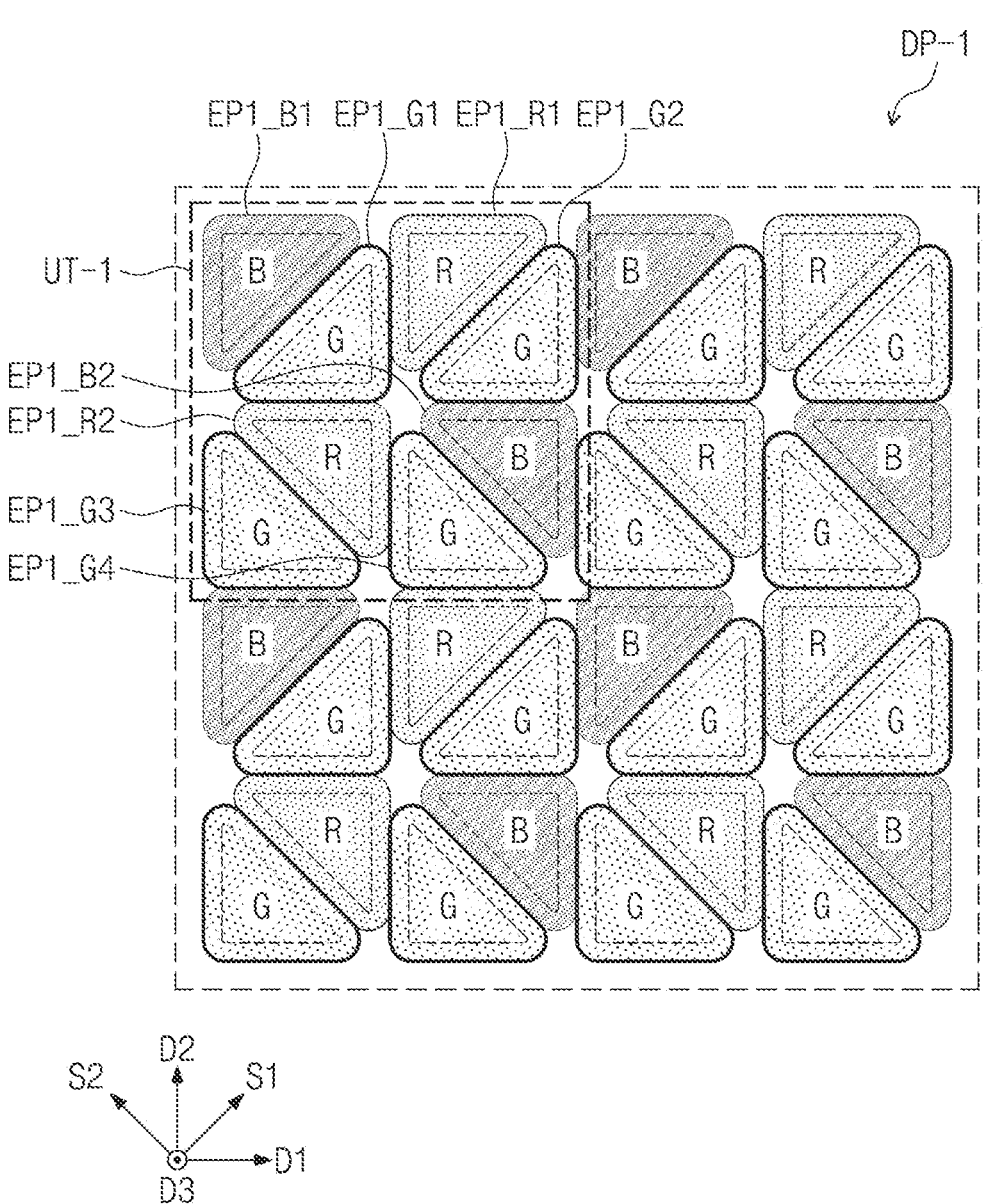
FIGS. 12A-12B are plan views of areas of display panels according to embodiments of the present disclosure.
Figure 12B:
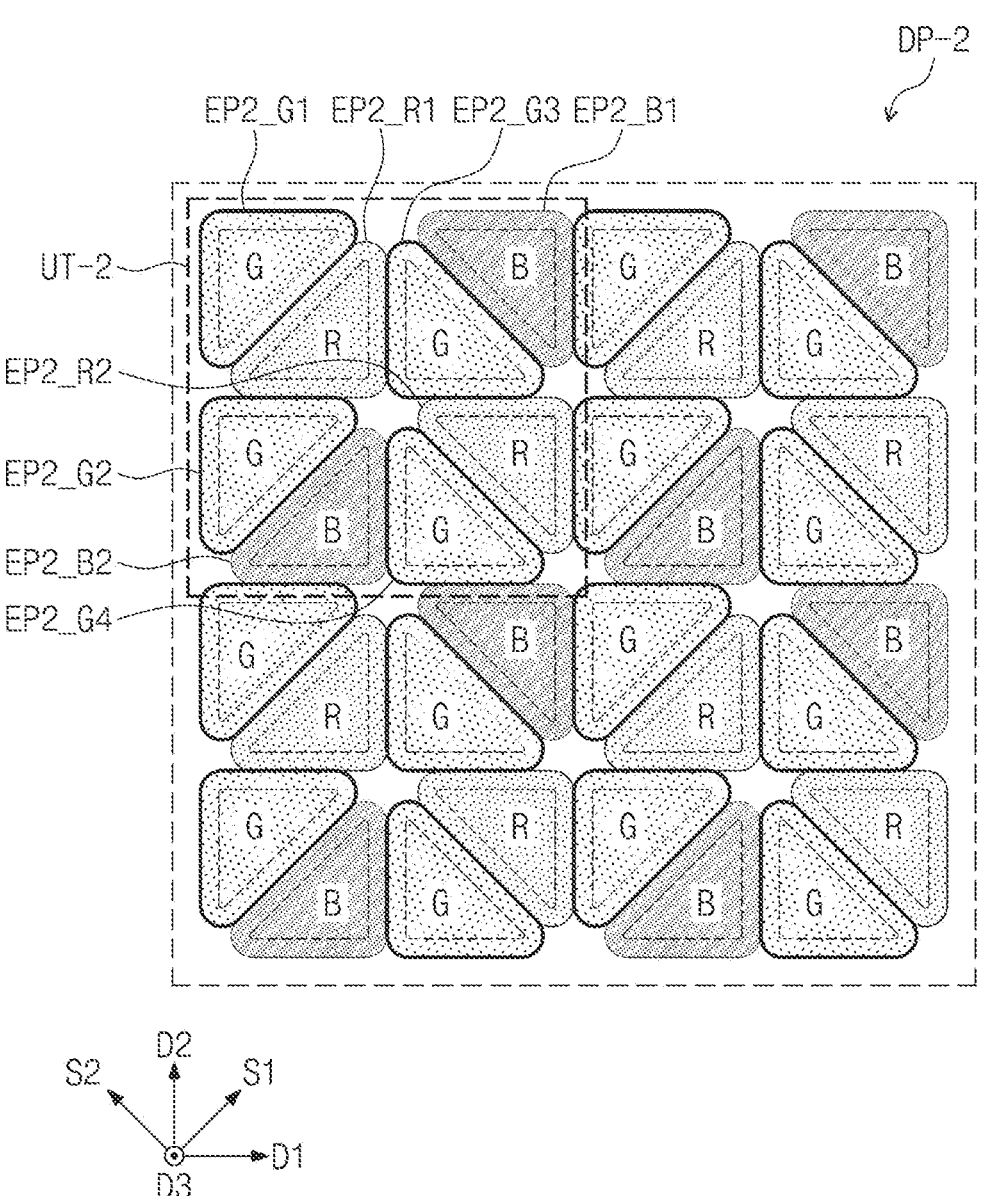

FIGS. 12A and 12B are plan views of areas of display panels DP-1 and DP-2 according to embodiments of the present disclosure. FIGS. 12A and 12B show areas according to embodiments corresponding to that of FIG. 6C. Hereinafter, one or more embodiments of the present disclosure will be described in more detail with reference to FIGS. 12A and 12B. In FIGS. 12A and 12B, the same reference numerals are used to denote the same or substantially the same elements as those described above with reference to FIGS. 1A to 11C, and thus, redundant description thereof may not be repeated.

Referring to FIG. 12A, the display panel DP-1 may include a plurality of unit pixel groups UT-1. One unit pixel group UT-1 may include four first color light emitting patterns EP1_G1, EP1_G2, EP1_G3, and EP1_G4, two second color light emitting patterns EP1_R1 and EP1_R2, and two third color light emitting patterns EP1_B1 and EP1_B2.

The unit pixel group UT-1 shown in FIG. 12A may be linearly symmetrical with the unit pixel group UT shown in FIG. 6C about a symmetrical axis that is parallel to or substantially parallel to the second direction D2. In more detail, the first color light emitting patterns EP1_G1, EP1_G2, EP1_G3, and EP1_G4 may include first color first light emitting patterns EP1_G1 and EP1_G2 and first color second light emitting patterns EP1_G3 and EP1_G4. The first color first light emitting patterns EP1_G1 and EP1_G2 and the first color second light emitting patterns EP1_G3 and EP1_G4 may include hypotenuses extending in different directions from each other. Each of the hypotenuses of the first color first light emitting patterns EP1_G1 and EP1_G2 may extend in the first diagonal direction S1, and each of the hypotenuses of the first color second light emitting patterns EP1_G3 and EP1_G4 may extend in the second diagonal direction S2.

Each of the first color second light emitting patterns EP1_G3 and EP1_G4 may have the same or substantially the same shape as a shape obtained when each of the first color first light emitting patterns EP1_G1 and EP1_G2 is flipped with respect to the symmetrical axis parallel to or substantially parallel to the second direction D2. In other words, the shapes obtained when the first color first light emitting patterns EP1_G1 and EP1_G2 are flipped with respect to the symmetrical axis parallel to or substantially parallel to the second direction D2 may be the same or substantially the same as those of the first color second light emitting patterns EP1_G3 and EP1_G4, respectively.

In addition, shapes of the first color second light emitting patterns EP1_G3 and EP1_G4 may correspond to shapes obtained when the first color first light emitting patterns EP1_G1 and EP1_G2 are rotated by about 90 degrees in the clockwise direction. In other words, the first color second light emitting patterns EP1_G3 and EP1_G4 may be the same or substantially the same as the first color first light emitting patterns EP1_G1 and EP1_G2 after the first color first light emitting patterns EP1_G1 and EP1_G2 are rotated by about 90 degrees in the clockwise direction, and then moved (e.g., shifted) in a direction opposite to the second direction D2.

The second color light emitting patterns EP1_R1 and EP1_R2 may include a second color first light emitting pattern EP1_R1 and a second color second light emitting pattern EP1_R2, which are disposed in different rows from each other. The second color first light emitting pattern EP1_R1 may be disposed in a first row between the first color first light emitting patterns EP1_G1 and EP1_G2, and the second color second light emitting pattern EP1_R2 may be disposed in a second row between the first color second light emitting patterns EP1_G3 and EP1_G4. The second color first light emitting pattern EP1_R1 and the second color second light emitting pattern EP1_R2 may be disposed to be staggered with each other in the second direction D2. Accordingly, the second color first light emitting pattern EP1_R1 and the second color second light emitting pattern EP1_R2 may not overlap with each other when viewed in the second direction D2.

The second color first light emitting pattern EP1_R1 and the second color second light emitting pattern EP1_R2 may have different shapes from each other. The second color first light emitting pattern EP1_R1 and the second color second light emitting pattern EP1_R2 may include hypotenuses extending in different directions from each other. The hypotenuse of the second color first light emitting pattern EP1_R1 may extend in the first diagonal direction S1, and the hypotenuse of the second color second light emitting pattern EP1_R2 may extend in the second diagonal direction S2.

The second color first light emitting pattern EP1_R1 and the second color second light emitting pattern EP1_R2 may have shapes that are symmetrical or substantially symmetrical to each other with respect to the symmetrical axis parallel to or substantially parallel to the second direction D2. The second color first light emitting pattern EP1_R1 may have the shape obtained when the second color second light emitting pattern EP1_R2 is flipped. As an example, the second color first light emitting pattern EP1_R1 may have the same or substantially the same shape as the shape obtained when the second color second light emitting pattern EP1_R2 is rotated by about 90 degrees in the counterclockwise direction, and then moved (e.g., shifted) on the plane.

The third color light emitting patterns EP1_B1 and EP1_B2 may include a third color first light emitting pattern EP1_B1 and a third color second light emitting pattern EP1_B2, which are disposed in different rows from each other. The third color first light emitting pattern EP1_B1 may be disposed in the first row at a left side of the first color first light emitting patterns EP1_G1 and EP1_G2, and the third color second light emitting pattern EP1_B2 may be disposed in the second row at a right side of the first color second light emitting patterns EP1_G3 and EP1_G4.

The third color first light emitting pattern EP1_B1 and the third color second light emitting pattern EP1_B2 may have different shapes from each other. A hypotenuse of the third color first light emitting pattern EP1_B1 may extend in the first diagonal direction S1, and a hypotenuse of the third color second light emitting pattern EP1_B2 may extend in the second diagonal direction S2.

The third color first light emitting pattern EP1_B1 and the third color second light emitting pattern EP1_B2 may have shapes that are symmetrical or substantially symmetrical to each other with respect to the symmetrical axis parallel to or substantially parallel to the second direction D2. In more detail, the third color second light emitting pattern EP1_B2 may be the same or substantially the same as the third color first light emitting pattern EP1_B1 after the third color first light emitting pattern EP1_B1 is flipped, and then moved (e.g., shifted) on the plane. In addition, the third color first light emitting pattern EP1_B1 may correspond to a shape obtained when the third color second light emitting pattern EP1_B2 is rotated by about 90 degrees in the clockwise direction. In more detail, the third color second light emitting pattern EP1_B2 may be the same or substantially the same as the third color first light emitting pattern EP1_B1 after the third color first light emitting pattern EP1_B1 is rotated by about 90 degrees in the clockwise direction, and then moved (e.g., shifted) on the plane.

The second color light emitting patterns EP1_R1 and EP_R2 may include hypotenuses facing the first color light emitting patterns EP1_G2 and EP1_G3, respectively, and may be linearly symmetrical with each other. The third color light emitting patterns EP1_B1 and EP1_B2 may include hypotenuses facing the first color light emitting patterns EP1_G1 and EP1_G4, respectively, and may be linearly symmetrical with each other. As an example, the second color first light emitting pattern EP1_R1 may include the hypotenuse facing one first color first light emitting pattern EP1_G2 from among the first color first light emitting patterns EP1_G1 and EP1_G2, and may be linearly symmetrical with the first color first light emitting pattern EP1_G2 with respect to the symmetrical axis parallel to or substantially parallel to a direction in which the hypotenuse extends (e.g., a symmetrical axis parallel to or substantially parallel to the first diagonal direction S1). The second color second light emitting pattern EP1_R2 may include the hypotenuse facing one first color second light emitting pattern EP1_G3 from among the first color second light emitting patterns EP1_G3 and EP1_G4, and may be linearly symmetrical with the first color second light emitting pattern EP1_G3 with respect to the symmetrical axis parallel to or substantially parallel to the direction in which the hypotenuse extends (e.g., a symmetrical axis parallel to or substantially parallel to the second diagonal direction S2).

The third color first light emitting pattern EP1_B1 may include the hypotenuse facing the other first color first light emitting pattern EP1_G1 from among the first color first light emitting patterns EP1_G1 and EP1_G2, and may be linearly symmetrical with the first color first light emitting pattern EP1_G1 with respect to the symmetrical axis parallel to or substantially parallel to the direction in which the hypotenuse extends (e.g., the symmetrical axis parallel to or substantially parallel to the first diagonal direction S1). The third color second light emitting pattern EP1_B2 may include the hypotenuse facing the other first color second light emitting pattern EP1_G4 from among the first color second light emitting patterns EP1_G3 and EP1_G4, and may be linearly symmetrical with the first color second light emitting pattern EP1_G4 with respect to the symmetrical axis parallel to or substantially parallel to the direction in which the hypotenuse extends (e.g., the symmetrical axis parallel to or substantially parallel to the second diagonal direction S2).

Referring to FIG. 12B, an arrangement of four first color light emitting patterns EP2_G1, EP2_G2, EP2_G3, and EP2_G4, two second color light emitting patterns EP2_R1 and EP2_R2, and two third color light emitting patterns EP2_B1 and EP2_B2, which form a unit pixel group UT-2 of the display panel DP-2, may be different from the arrangement of the light emitting patterns of the unit pixel groups UT and UT-1 described above. As an example, the unit pixel group UT-2 may include first color light emitting patterns EP2_G1, EP2_G2, EP2_G3, and EP2_G4, which are arranged in two rows, and the first color light emitting patterns arranged in the same row as each other may have different shapes from each other.

In more detail, the first color light emitting patterns EP2_G1, EP2_G2, EP2_G3, and EP2_G4 may include two first color first light emitting patterns EP2_G1 and EP2_G2 arranged in the same column as each other, and two first color second light emitting patterns EP2_G3 and EP2_G4 arranged in the same column as each other and different from the column in which the two first color first light emitting patterns EP2_G1 and EP2_G2 are arranged. In this case, the two first color first light emitting patterns EP2_G1 and EP2_G2 may have the same or substantially the same shape as each other, and the two first color second light emitting patterns EP2_G3 and EP2_G4 may have the same or substantially the same shape as each other. In other words, the first color first light emitting patterns EP2_G1 and EP2_G2 may be spaced apart from the first color second light emitting patterns EP2_G3 and EP2_G4 in the first direction D1, the two first color first light emitting patterns EP2_G1 and EP2_G2 may be arranged along the second direction D2, and the two first color second light emitting patterns EP2_G3 and EP2_G4 may be arranged along the second direction D2.

Each of the two first color first light emitting patterns EP2_G1 and EP2_G2 may have a right triangular shape, with a hypotenuse extending in the first diagonal direction S1, and vertices each having a rounded shape. Each of the two first color second light emitting patterns EP2_G3 and EP2_G4 may include a hypotenuse extending in the second diagonal direction S2.

When the first color first light emitting patterns EP2_G1 and EP2_G2 disposed at a left side is rotated by about 90 degrees in the counterclockwise direction, and moved (e.g., shifted) on the plane, the shape of the first color first light emitting patterns EP2_G1 and EP2_G2 may correspond to that of the first color second light emitting patterns EP2_G3 and EP2_G4 disposed at a relatively right side.

The second color light emitting patterns EP2_R1 and EP2_R2 may have different shapes from each other. In the second color light emitting patterns EP2_R1 and EP2_R2, a second color second light emitting pattern EP2_R2 may have the shape corresponding to the shape obtained when a second color first light emitting pattern EP2_R1 is rotated by about 90 degrees in the counterclockwise direction. In addition, the second color second light emitting pattern EP2_R2 may have the shape obtained when the second color first light emitting pattern EP2_R1 is flipped with respect to a symmetrical axis parallel to or substantially parallel to the first direction D1. In other words, the second color second light emitting pattern EP2_R2 may have the same or substantially the same shape as the shape obtained when the second color first light emitting pattern EP2_R1 is flipped vertically and moved (e.g., shifted).

The second color first light emitting pattern EP2_R1 may be disposed between the first color first light emitting pattern EP2_G1 and the first color second light emitting pattern EP2_G3 disposed at an upper side. The second color first light emitting pattern EP2_R1 may include a hypotenuse facing a hypotenuse of the first color first light emitting pattern EP2_G1 disposed at the upper side, a side facing the first color first light emitting pattern EP2_G2 disposed at a lower side, and a side facing the first color second light emitting pattern EP2_G3 disposed at the upper side. In other words, the second color first light emitting pattern EP2_R1 and the first color first light emitting pattern EP2_G1 disposed at the upper side may be symmetrical or substantially symmetrical to each other with respect to the symmetrical axis parallel to or substantially parallel to the first diagonal direction S1. In addition, the second color first light emitting pattern EP2_R1 and the first color second light emitting pattern EP2_G3 disposed at the upper side may be symmetrical or substantially symmetrical to each other with respect to the symmetrical axis parallel to or substantially parallel to the second direction D2.

In the second color light emitting patterns EP2_R1 and EP2_R2, the second color second light emitting pattern EP2_R2 may be disposed between the first color second light emitting patterns EP2_G3 and EP2_G4. The second color second light emitting pattern EP2_R2 may include a hypotenuse facing a hypotenuse of the first color second light emitting pattern EP2_G4 disposed at the lower side, and a side facing the first color second light emitting pattern EP2_G3 disposed at the upper side. In other words, the second color second light emitting pattern EP2_R2 and the first color second light emitting pattern EP_G4 may be linearly symmetrical with respect to the symmetrical axis parallel to or substantially parallel to the second diagonal direction S2.

The third color light emitting patterns EP2_B1 and EP2_B2 may have different shapes from each other. However, the shape of one of the third color light emitting patterns EP2_B1 and EP2_B2 may be the same or substantially the same as the shape obtained by rotating and then moving (e.g., shifting) the other of the third color light emitting patterns EP2_B1 and EP2_B2. In more detail, between the third color light emitting patterns EP2_B1 and EP2_B2, a third color second light emitting pattern EP2_B2 may have the same or substantially the same shape as the shape obtained when a third color first light emitting pattern EP2_B1 is rotated by about 90 degrees in the clockwise direction, and then moved (e.g., shifted) on the plane. In addition, the third color second light emitting pattern EP2_B2 may have the same or substantially the same shape as the shape obtained when the third color first light emitting pattern EP2_B1 is rotated by about 90 degrees in the clockwise direction and then moved (e.g., shifted).

The third color first light emitting pattern EP2_B1 may include a hypotenuse facing the first color second light emitting pattern EP2_G3 disposed at the upper side, and may be linearly symmetrical with the first color second light emitting pattern EP2_G3 with respect to the second diagonal direction S2.

The third color second light emitting pattern EP2_B2 may include a hypotenuse facing the first color first light emitting pattern EP2_G2 disposed at the lower side, and a side facing the first color second light emitting pattern EP2_G4 disposed at the lower side. The third color second light emitting pattern EP2_B2 may be linearly symmetrical with the first color second light emitting pattern EP2_G2 disposed at the lower side with respect to the symmetrical axis parallel to or substantially parallel to the first diagonal direction S1. In addition, the third color second light emitting pattern EP2_B2 may be linearly symmetrical with the first color second light emitting pattern EP_G4 disposed at the lower side with respect to the symmetrical axis parallel to or substantially parallel to the second direction D2.

According to one or more embodiments of the present disclosure, the light emitting patterns forming one unit pixel group UT-1 or UT-2 may have the shapes that are symmetrical or substantially symmetrical with one another, and thus, the openings of the mask, which correspond to the light emitting patterns, may be arranged in the entire mask to be symmetrical or substantially symmetrical with one another. Accordingly, a local stress may be prevented or substantially prevented from being generated when the mask is tensioned, and thus, damage to or deformation of the mask may be prevented or substantially prevented. Accordingly, the process reliability of the display panels DP-1 and DP-2 may be improved.

According to one or more embodiments of the present disclosure, a display panel includes a pixel circuit including at least one thin film transistor, and a unit pixel group connected to the pixel circuit. The unit pixel group includes four first color light emitting patterns, two second color light emitting patterns having different shapes from each other, and two third color light emitting patterns having different shapes from each other. The first, second, and third color light emitting patterns are configured to display different colors, respectively. The first color light emitting patterns include two first color first light emitting patterns having the same shape as each other, and two first color second light emitting patterns having the same shape as each other that is different from the shape of the first color first light emitting patterns.

In an embodiment, each of the first, second, and third color light emitting patterns has a triangular shape.

In an embodiment, the first color first light emitting patterns are arranged in a first direction, the first color first light emitting patterns are spaced apart from the first color second light emitting patterns in a second direction crossing the first direction, and the first color first light emitting patterns are linearly symmetrical with the first color second light emitting patterns with respect to a symmetrical axis parallel to or substantially parallel to the second direction.

In an embodiment, the second color light emitting patterns are linearly symmetrical with each other with respect to the symmetrical axis parallel to or substantially parallel to the second direction.

In an embodiment, the third color light emitting patterns are linearly symmetrical with each other with respect to the symmetrical axis parallel to or substantially parallel to the second direction.

In an embodiment, the triangular shape is a right triangular shape, with a base extending in the first direction, and a height extending in a second direction crossing the first direction.

In an embodiment, the second color light emitting patterns include a second color first light emitting pattern disposed between the first color first light emitting patterns, and a second color second light emitting pattern disposed between the first color second light emitting patterns.

In an embodiment, the second color first light emitting pattern are linearly symmetrical with the second color second light emitting pattern with respect to the symmetrical axis extending in a direction parallel to or substantially parallel to the second direction.

In an embodiment, the third color light emitting patterns include a third color first light emitting pattern spaced apart from the second color first light emitting pattern in the first direction, and a third color second light emitting pattern spaced apart from the second color first light emitting pattern in the second direction. The second color first light emitting pattern has the same shape as that of the third color first light emitting pattern, and has the shape different from that of the third color second light emitting pattern.

In an embodiment, the second color first light emitting pattern has a shape corresponding to a shape obtained by rotating the third color second light emitting pattern by about 90 degrees in a counterclockwise direction.

In an embodiment, the second color first light emitting pattern has a shape corresponding to a shape obtained by rotating the third color second light emitting pattern by about 90 degrees in a clockwise direction.

In an embodiment, the first color first light emitting pattern is linearly symmetrical with the second color first light emitting pattern with respect to a symmetrical axis extending in a direction parallel to or substantially parallel to a hypotenuse.

In an embodiment, the first color first light emitting pattern is linearly symmetrical with the first color second light emitting pattern with respect to a symmetrical axis extending in a direction parallel to or substantially parallel to the first direction.

In an embodiment, a minimum distance between the first color light emitting patterns is equal to or greater than about 15 micrometers.

According to or more embodiments of the present disclosure, a metal mask includes a first opening, and a second opening spaced apart from the first opening in a first direction, and having a shape different from a shape of the first opening. Each of the first opening and the second opening has a left-right asymmetric shape, and the second opening has the same shape as the shape obtained when the first opening is rotated by about 90 degrees and shifted.

In an embodiment, the first opening is provided in a plurality, and the first openings are arranged along a second direction crossing the first direction. The second opening is provided in a plurality, and the second openings are arranged along the second direction, and are spaced apart from the first openings in the first direction.

In an embodiment, the first opening is provided in a plurality, and the first openings are arranged along a second direction crossing the first direction. The second opening is provided in a plurality, are arranged along the second direction, and are spaced apart from the first openings in the first direction. An angle between the first direction and the second direction is an acute angle.

In an embodiment, a distance in the second direction between the first openings is greater than a distance between the first opening and the second opening adjacent to the first opening in the first direction.

In an embodiment, each of the second openings has a shape corresponding to a shape obtained by rotating each of the first openings by about 90 degrees in a counterclockwise direction.

In an embodiment, each of the second openings has a shape corresponding to a shape obtained by rotating each of the first openings by about 90 degrees in a clockwise direction.

In an embodiment, each of the first opening and the second opening has a right triangular shape including vertices having a rounded shape.

In an embodiment, each of the vertices has a radius of curvature equal to or greater than about 8 micrometers.

In an embodiment, a minimum distance between the first opening and the second opening is equal to or greater than about 15 micrometers.

In an embodiment, each of the first opening and the second opening includes a hypotenuse, and the hypotenuse of the first opening and the hypotenuse of the second opening extend in different directions from each other.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display panel comprising:
a plurality of pixel circuits, each of the plurality of pixel circuits comprising at least one thin film transistor; and
a unit pixel group connected to at least one of the plurality of pixel circuits, the unit pixel group comprising:
four first color light emitting patterns;
two second color light emitting patterns oriented differently from each other; and
two third color light emitting patterns oriented differently from each other, wherein the first, second, and third color light emitting patterns are configured to display different colors from one another, wherein each of the first color light emitting patterns, the second color light emitting patterns, and the third color light emitting patterns has a left-right asymmetric shape, and wherein the first color light emitting patterns comprise:

two first color first light emitting patterns oriented the same as each other, the first color first light emitting patterns arranged in a first row; and two first color second light emitting patterns oriented the same as each other, and different from the orientation of the first color first light emitting patterns, the first color second light emitting patterns arranged in a second row, wherein each of the first color first light emitting patterns and each of the first color second light emitting patterns has a pair of sides that are perpendicular to each other.

2. The display panel of claim 1, wherein each of the first, second, and third color light emitting patterns is a triangular shape.

3. The display panel of claim 2, wherein the first color second light emitting patterns have the same orientation as an orientation obtained by rotating the first color first light emitting patterns by about 90 degrees, and a position obtained by shifting the rotated first color first light emitting patterns by one row away from the first color first light emitting patterns.

4. The display panel of claim 2, wherein the second color light emitting patterns comprise:

a second color first light emitting pattern located between the first color first light emitting patterns; and a second color second light emitting pattern located between the first color second light emitting patterns.

5. The display panel of claim 4, wherein directions in which sides of the second color first light emitting pattern facing the first color first light emitting patterns extend form an acute angle, and directions in which sides of the second color second light emitting pattern facing the first color second light emitting patterns extend form an acute angle.

6. The display panel of claim 4, wherein the second color second light emitting pattern has the same orientation as an orientation obtained by rotating the second color first light emitting pattern by about 90 degrees, and a position obtained by shifting the rotated second color first light emitting pattern by one row and one column away from the second color first light emitting pattern.

7. The display panel of claim 4, wherein the third color light emitting patterns comprise:

a third color first light emitting pattern comprising a side facing one of the first color first light emitting patterns; and a third color second light emitting pattern located between another of the first color first light emitting patterns and one of the first color second light emitting patterns, and wherein directions in which sides of the third color second light emitting pattern facing the first color first light emitting pattern and the first color second light emitting pattern extend form an acute angle.

8. The display panel of claim 7, wherein the third color second light emitting pattern has the same orientation as an orientation obtained by rotating the third color first light emitting pattern by about 90 degrees, and a position obtained by shifting the rotated third color first light emitting pattern by one row and one column away from the third color first light emitting pattern.

9. The display panel of claim 7, wherein the first color light emitting patterns are arranged along a first direction, and the first color first light emitting patterns and the first color second light emitting patterns are spaced from each other in a second direction crossing the first direction.

10. The display panel of claim 9, wherein the second color first light emitting pattern and the third color first light emitting pattern are arranged along the first direction, and have the same orientation as each other.

11. The display panel of claim 9, wherein the second color light emitting patterns and the third color light emitting patterns are linearly symmetrical with the first color light emitting patterns with respect to a symmetrical axis parallel to a diagonal direction crossing the first and second directions.

12. The display panel of claim 1, wherein a minimum distance between the first color light emitting patterns is equal to or greater than about 15 micrometers and smaller than a side of each of the first color light emitting patterns.

13. A metal mask comprising:

a first opening; and a second opening spaced from the first opening in a first direction, and having an orientation different from an orientation of the first opening, wherein each of the first opening and the second opening has a left-right asymmetric shape, and the second opening has the same orientation as an orientation obtained by rotating the first opening by about 90 degrees, and a position obtained by shifting the rotated first opening by one or more rows or one or more columns away from the first opening, and wherein a side of the first opening extends in a same direction as that of the second opening.

14. The metal mask of claim 13, wherein the first opening comprises a plurality of first openings arranged in the first direction and a second direction crossing the first direction, the second opening comprises a plurality of second openings arranged in the first and second directions, and wherein at least some of the first openings are alternately arranged with the second openings along the second direction.

15. The metal mask of claim 14, wherein the first direction and the second direction form an acute angle.

16. The metal mask of claim 14, wherein a distance in the second direction between the first openings is greater than a distance between the first opening and the second opening adjacent to the first opening in the first direction.

17. The metal mask of claim 13, wherein the rotation of the first opening is in a clockwise direction or a counterclockwise direction.

18. The metal mask of claim 13, wherein each of the first opening and the second opening has a right triangular shape including vertices having a rounded shape.

19. The metal mask of claim 18, wherein each of the vertices has a radius of curvature equal to or greater than about 8 micrometers.

20. The metal mask of claim 18, wherein a minimum distance between the first opening and the second opening is equal to or greater than about 15 micrometers and smaller than a side of each of the first opening and the second opening.

* * * * *